(12) United States Patent
Kitano et al.

(10) Patent No.: US 12,272,711 B2
(45) Date of Patent: Apr. 8, 2025

(54) SOLID-STATE IMAGING DEVICE AND IMAGING DEVICE

(71) Applicants: SONY GROUP CORPORATION, Tokyo (JP); SONY SEMICONDUCTOR SOLUTIONS CORPORATION, Kanagawa (JP)

(72) Inventors: Shin Kitano, Kanagawa (JP); Koya Tsuchimoto, Kanagawa (JP); Kei Nakagawa, Tokyo (JP)

(73) Assignees: Sony Group Corporation, Tokyo (JP); Sony Semiconductor Solutions Corporation, Kanagawa (JP)

(*) Notice: Subject to any disclaimer, the term of this patent is extended or adjusted under 35 U.S.C. 154(b) by 644 days.

(21) Appl. No.: 17/285,008

(22) PCT Filed: Oct. 18, 2019

(86) PCT No.: PCT/JP2019/041224
§ 371 (c)(1),
(2) Date: Apr. 13, 2021

(87) PCT Pub. No.: WO2020/085265
PCT Pub. Date: Apr. 30, 2020

(65) Prior Publication Data
US 2021/0320140 A1    Oct. 14, 2021

(30) Foreign Application Priority Data
Oct. 25, 2018  (JP) .................................. 2018-201132

(51) Int. Cl.
*H01L 27/146*      (2006.01)

(52) U.S. Cl.
CPC .. *H01L 27/14634* (2013.01); *H01L 27/14605* (2013.01); *H01L 27/14612* (2013.01)

(58) Field of Classification Search
CPC ......... H01L 27/14634; H01L 27/14605; H01L 27/14612; H01L 27/1464; H01L 27/14645
See application file for complete search history.

(56) References Cited

U.S. PATENT DOCUMENTS

2006/0097296 A1    5/2006  Nam
2007/0215970 A1    9/2007  Lee
(Continued)

FOREIGN PATENT DOCUMENTS

CN    101251783 A    8/2008
CN    101998070 A    3/2011
(Continued)

OTHER PUBLICATIONS

International Search Report and Written Opinion prepared by the European Patent Office on Jan. 16, 2020, for International Application No. PCT/JP2019/041224.

*Primary Examiner* — Jay C Kim
*Assistant Examiner* — Woo K Lee
(74) *Attorney, Agent, or Firm* — Sheridan Ross PC

(57) ABSTRACT

An imaging device includes a photoelectric conversion region that converts incident light into electric charge. The imaging device includes a first readout circuit coupled to the photoelectric conversion region at a first location, and a second readout circuit including a portion coupled to the photoelectric conversion region at a second location. The second readout circuit is configured to control the first readout circuit. The first location and the second location are on a same side of the photoelectric conversion region.

20 Claims, 42 Drawing Sheets

(56) References Cited

U.S. PATENT DOCUMENTS

| | | |
|---|---|---|
| 2010/0123771 A1 | 5/2010 | Moon et al. |
| 2014/0160332 A1 | 6/2014 | Sumi |
| 2014/0217474 A1* | 8/2014 | Lee .................. H01L 27/14609 |
| | | 257/225 |
| 2016/0013240 A1 | 1/2016 | Jung |
| 2018/0054579 A1 | 2/2018 | Kumagai |
| 2018/0152644 A1 | 5/2018 | Kondo |
| 2019/0289234 A1 | 9/2019 | Kumagai |

FOREIGN PATENT DOCUMENTS

| | | |
|---|---|---|
| EP | 2698988 | 2/2014 |
| JP | 2005005573 A | 1/2005 |
| JP | 2007325139 A | 12/2007 |
| JP | 2015501936 A | 1/2015 |
| JP | 2015046477 A | 3/2015 |
| JP | 2015135938 A | 7/2015 |
| JP | 2016066766 A | 4/2016 |
| JP | 2016-533140 | 10/2016 |
| JP | 2017059834 A | 3/2017 |
| JP | 2018160558 A | 10/2018 |
| KR | 20140103116 A | 8/2014 |
| WO | WO 2016/158483 | 10/2016 |
| WO | WO-2017169885 A1 | 10/2017 |

* cited by examiner

SOLID-STATE IMAGING DEVICE AND IMAGING DEVICE

CROSS REFERENCE TO RELATED APPLICATIONS

This application is a national stage application under 35 U.S.C. 371 and claims the benefit of PCT Application No. PCT/JP2019/041224, having an international filing date of 18 Oct. 2019, which designated the United States, which PCT application claimed the benefit of Japanese Patent Application No. 2018-201132, filed 25-10-2018, the entire disclosures of each of which are incorporated herein by reference.

TECHNICAL FIELD

The present disclosure relates to a solid-state imaging device, and an imaging device.

BACKGROUND ART

In the related art, a synchronization-type solid-state imaging device that captures image data in synchronization with a synchronization signal such as a vertical synchronization signal has been used in an imaging device and the like. In the typical synchronization-type solid-state imaging device, it is difficult to acquire image data for every period of the synchronization signal (for example, for every 1/60 seconds), and thus it is difficult to cope with a case where relatively high-speed processing is demanded in fields related to traffic, a robot, and the like. In this regard, there is suggested a non-synchronization-type solid-state imaging device in which a detection circuit is provided for every pixel to detect a situation in which a light-reception amount exceeds a threshold value as an address event in real time. The non-synchronization-type solid-state imaging device that detects the address event for every pixel is also referred to as a dynamic vision sensor (DVS).

CITATION LIST

Patent Literature

PTL 1: JP 2016-533140A

SUMMARY

Technical Problem

However, in the DVS, it is necessary to provide a circuit configuration for detecting the address event in addition to a circuit configuration for reading out a pixel signal of a voltage value corresponding to a light-reception amount, and thus an occupation ratio of a light-receiving element on a light-receiving surface decreases. As a result, there is a problem that quantum efficiency with respect to incident light (hereinafter, referred to as "light-reception efficiency") deteriorates.

Therefore, the present disclosure provides a solid-state imaging device and an imaging device which are capable of improving the light-reception efficiency.

Solution to Problem

According to an aspect of the present disclosure, there is provided an imaging device including a photoelectric conversion region that converts incident light into electric charges, a first readout circuit coupled to the photoelectric conversion region at a first location, and a second readout circuit including a portion coupled to the photoelectric conversion region at a second location. The second readout circuit is configured to control the first readout circuit, and the first location and the second location are on a same side of the photoelectric conversion region. The first location and the second location are a same distance from a center of an edge of the photoelectric conversion region that defines the side. The first location is at a first corner of the photoelectric conversion region, and the second location is at a second corner of the photoelectric conversion region. The first readout circuit includes a first transistor having a first gate at the first location, and the second readout circuit includes a second transistor having a second gate at the second location. The first readout circuit includes a plurality of third transistors coupled to the first transistor. The second readout circuit includes a plurality of fourth transistors coupled to the second transistor. A number of the plurality of fourth transistors is more than a number of the plurality of third transistors. The plurality of fourth transistors includes first and second sets of transistors arranged in a first direction, and the first set of transistors is arranged adjacent to the second set of transistors in a second direction that is perpendicular to the first direction. The second set of transistors are further away from the side of the photoelectric conversion region than the first set of transistors. The plurality of third transistors are arranged in the first direction. According to an aspect of the present disclosure, there is provided an imaging device, comprising a first pixel that includes a first photoelectric conversion region that converts first incident light into first electric charges, a first readout circuit coupled to the first photoelectric conversion region at a first location, and a second readout circuit including a portion coupled to the first photoelectric conversion region at a second location. The second readout circuit is configured to control the first readout circuit. The first location and the second location are on a same first side of the first photoelectric conversion region. The imaging device includes a second pixel adjacent to the first pixel in a first direction. The second pixel includes a second photoelectric conversion region that converts second incident light into second electric charges. The second pixel includes a third readout circuit coupled to the second photoelectric conversion region at a third location. The second pixel includes a fourth readout circuit including a portion coupled to the second photoelectric conversion region at a fourth location. The fourth readout circuit is configured to control the third readout circuit. The third location and the fourth location are on a same second side of the second photoelectric conversion region. The first readout circuit and the third readout circuit are located at opposite sides of the second photoelectric conversion region. The first pixel and the second pixel are arranged such that the second photoelectric conversion region is between the first readout circuit and the second readout circuit. The imaging device includes a third pixel adjacent to the first pixel in a second direction that is perpendicular to the first direction, and the third pixel includes a third photoelectric conversion region that converts third incident light into third electric charges. The third pixel includes a fifth readout circuit coupled to the third photoelectric conversion region at a fifth location. The third pixel includes a sixth readout circuit including a portion coupled to the third photoelectric conversion region at a sixth location. The sixth readout circuit is configured to control the fifth readout circuit. The fifth location and the sixth location are on a same third side of the third photoelectric conversion region. The imaging device includes a fourth pixel adjacent to the second pixel in the second direction. The fourth pixel includes a fourth photoelectric conversion region that converts fourth incident light into fourth electric charges. The fourth pixel includes a seventh readout circuit coupled to the fourth photoelectric conversion region at a seventh location. The fourth pixel includes an eighth readout circuit including a portion coupled to the fourth photoelectric conversion region at an eighth location. The eight readout circuit controls the seventh readout circuit. The seventh location and the eighth location are on a same fourth side of the fourth photoelectric conversion region. The third pixel and the fourth pixel are arranged such that the third photoelectric conversion region is between the seventh readout circuit and the eighth readout circuit. The first, second, third, and fourth pixels are arranged such that the second readout circuit and the fifth readout circuit are between the second photoelectric conversion region and the fourth photoelectric conversion region. At least one of the first photoelectric conversion region, the second photoelectric conversion region, the third photoelectric conversion region, and the fourth photoelectric conversion region includes a photogate that divides a respective photoelectric conversion region into a first portion and a second portion. The photogate is located in a central region of the photoelectric conversion region. According to an aspect of the present disclosure, there is provided an imaging device, comprising a photoelectric conversion region that converts incident light into electric charges. The imaging device includes a first readout circuit including a first gate of a first transistor coupled to the photoelectric conversion region at a first location. The imaging device includes a second readout circuit including a second gate of a second transistor coupled to the photoelectric conversion region at a second location. The second readout circuit is configured to control the first readout circuit. The first location and the second location are located at a same half of the photoelectric conversion region. According to an aspect of the present disclosure, a solid-state imaging device includes: a photoelectric conversion element that generates a charge corresponding to a light-reception amount; a first transistor that is connected to the photoelectric conversion element; second to fourth transistors which are connected to the first transistor and are arranged in a line; a fifth transistor that is connected to the photoelectric conversion element at a position different from a position of the first transistor; sixth and seventh transistors which are connected to the fifth transistor and are arranged in a line; and eighth and ninth transistors which are arranged in parallel to an array of the sixth and seventh transistors.

DESCRIPTION OF EMBODIMENTS

Figure 1:
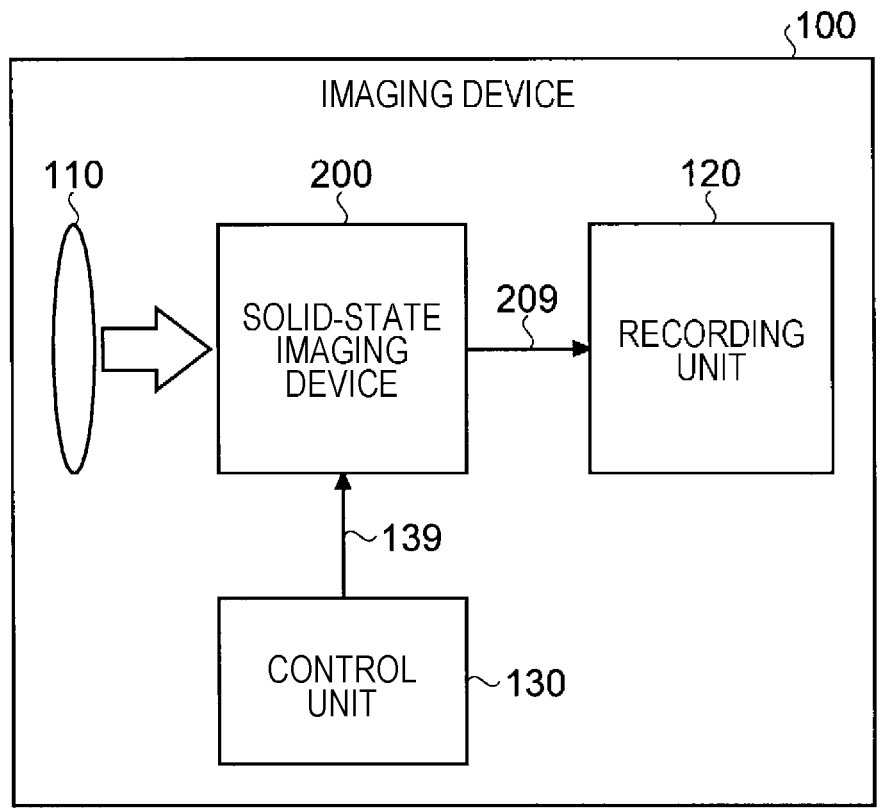
FIG. 1 is a block diagram illustrating a schematic configuration example of a solid-state imaging device and an imaging device according to a first embodiment.

Hereinafter, an embodiment of the present disclosure will be described in detail on the basis of the accompanying drawings. Furthermore, in the following embodiments, the same reference numeral will be given to the same portion, and redundant description thereof will be omitted.

In addition, the present disclosure will be described according to the following item sequence.

1. Introduction
2. First Embodiment
2.1 Configuration Example of Imaging Device
2.2 Configuration Example of Solid-State Imaging Device
2.2.1 Lamination Configuration Example of Solid-State Imaging Device
2.2.2 Functional Configuration Example of Solid-State Imaging Device
2.3 Example of Pixel Array Unit
2.4 Configuration Example of Unit Pixel
2.5 Configuration Example of Address Event Detection Unit
2.5.1 Configuration Example of Current-Voltage Conversion Unit
2.5.2 Configuration Example of Subtractor and Quantizer
2.5.3 Configuration Example of Column ADC
2.6 Operation Example of Solid-State Imaging Device
2.6.1 Timing Chart
2.6.2 Flowchart
2.7 Layout Example of Unit Pixel
2.7.1 First Layout Example
2.7.1.1 Array Example
2.7.1.2 Modification Example of First Layout Example
2.7.2 Second Layout Example
2.7.2.1 Array Example
2.7.3 Third Layout Example
2.7.3.1 Array Example
2.7.4 Fourth Layout Example
2.7.4.1 First Array Example
2.7.4.2 Second Array Example
2.7.5 Fifth Layout Example
2.7.5.1 Array Example
2.7.6 Sixth Layout Example
2.7.6.1 Array Example
2.8 Operation and Effect
3. Second Embodiment
3.1 Configuration Example of Unit Pixel
3.2 Operation Example of Solid-State Imaging Device
3.3 Layout Example of Unit Pixel
3.3.1 First Layout Example
3.3.1.1 With Regard to Potential of Photoelectric Conversion Element
3.3.2 Second Layout Example
3.3.3 Third Layout Example
3.3.3.1 Modification Example
3.3.4 Fourth Layout Example
3.3.5 Fifth Layout Example
3.3.6 Sixth Layout Example
3.4 Operation and Effect 4. Third Embodiment
4.1 Configuration Example of Unit Pixel
4.2 Layout Example of Unit Pixel
4.2.1 First Layout Example
4.2.1.1 With Regard to Potential of Photoelectric Conversion Element
4.2.2 Second Layout Example
4.2.3 Third Layout Example
4.2.4 Fourth Layout Example
4.2.5 Fifth Layout Example
4.3 Operation and Effect
5. Application Example to Moving Body 1. Introduction A typical dynamic vision sensor (DVS) employs a so-called event-driven type driving method in which existence or nonexistence of address event ignition is detected for every unit pixel, and a pixel signal is read out from a unit pixel in which the address event is ignited in a case where the address event ignition is detected.

Furthermore, the unit pixel in this description represents a minimum unit of a pixel including one photoelectric conversion element (also referred to as "light-receiving element"), and corresponds to each dot in image data that is read out from an image sensor as an example. In addition, the address event represents an event that occurs for every address that is allocable to each of a plurality of the unit pixels which are arranged in a two-dimensional lattice shape, and examples thereof include an event in which a current value of a photocurrent based on a charge generated in the photoelectric conversion element or a variation amount thereof exceeds an arbitrary constant threshold value.

2. First Embodiment

First, a solid-state imaging device and an imaging device according to a first embodiment will be described in detail with reference to the accompanying drawings.
2.1 Configuration Example of Imaging Device FIG. 1 is a block diagram illustrating a schematic configuration example of the solid-state imaging device and the imaging device according to the first embodiment. As illustrated in FIG. 1, for example, an imaging device 100 includes an imaging lens 110, a solid-state imaging device 200, a recording unit 120, and a control unit 130. As the imaging device 100, a camera that is mounted in an industrial robot, an in-vehicle camera, and the like are assumed.

The imaging lens 110 is an example of an optical system that condenses incident light and images an image of the incident light to a light-receiving surface of the solid-state imaging device 200. The light-receiving surface is a surface on which photoelectric conversion elements in the solid-state imaging device 200 are arranged. The solid-state imaging device 200 photoelectrically converts the incident light to generate image data. In addition, the solid-state imaging device 200 executes predetermined signal processing such as noise removal and white balance adjustment with respect to the generated image data. A result obtained by the signal processing and a detection signal indicating existence or nonexistence of address event ignition are output to the recording unit 120 through a signal line 209. Furthermore, a method of generating the detection signal indicating existence or nonexistence of the address event ignition will be described later.

For example, the recording unit 120 is constituted by a flash memory, a dynamic random access memory (DRAM), a static random access memory (SRAM), or the like, and records data input from the solid-state imaging device 200.

Figure 2:
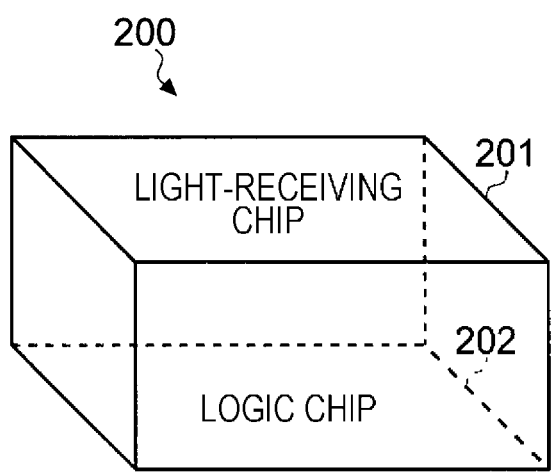
FIG. 2 is a view illustrating a lamination structure example of the solid-state imaging device according to the first embodiment.

For example, the control unit 130 is constituted by a central processing unit (CPU) and the like, and outputs various instructions through a signal line 139 to control respective units such as the solid-state imaging device 200 in the imaging device 100.
2.2 Configuration Example of Solid-State Imaging Device Next, a configuration example of the solid-state imaging device 200 will be described in detail with reference to the accompanying drawings.
2.2.1 Lamination Configuration Example of Solid-State Imaging Device FIG. 2 is a view illustrating a lamination structure example of the solid-state imaging device according to the first embodiment. As illustrated in FIG. 2, the solid-state imaging device 200 has a structure in which a light-receiving chip 201 and a logic chip 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

Figure 3:
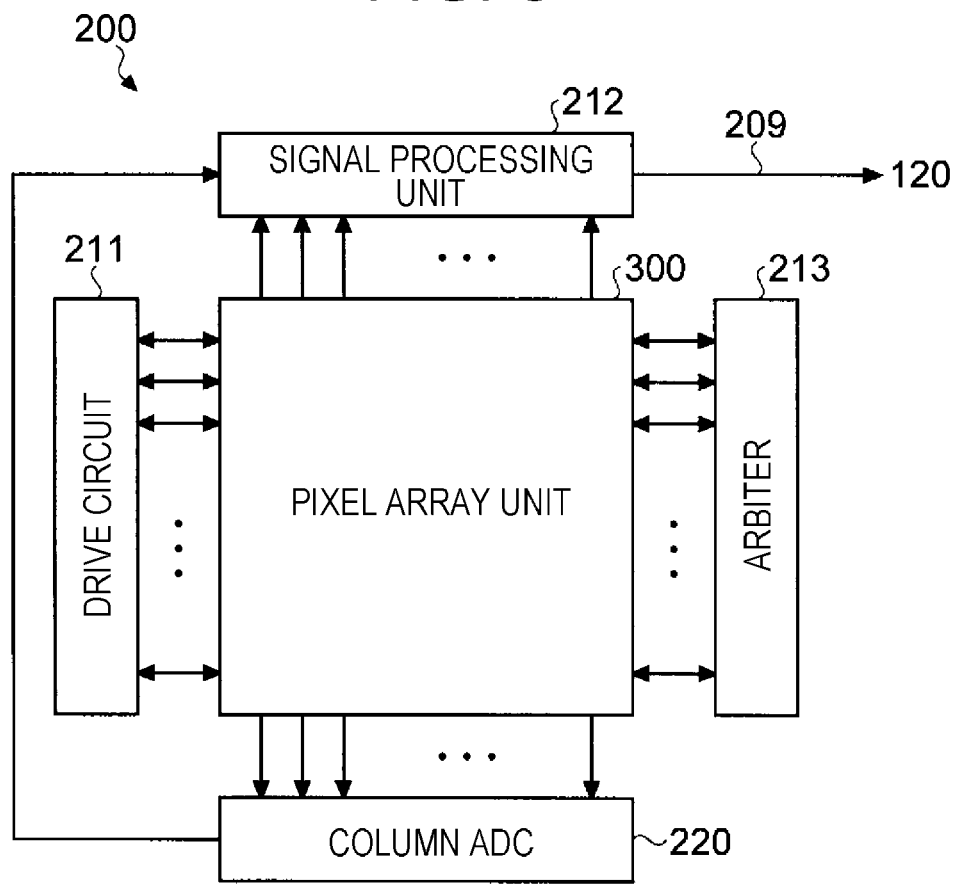
FIG. 3 is a block diagram illustrating a functional configuration example of the solid-state imaging device according to the first embodiment.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.
2.2.2 Functional Configuration Example of Solid-State Imaging Device FIG. 3 is a block diagram illustrating a functional configuration example of the solid-state imaging device according to the first embodiment. As illustrated in FIG. 3, the solid-state imaging device 200 includes a drive circuit 211, a signal processing unit 212, an arbiter 213, a column ADC 220, and a pixel array unit 300.

A plurality of unit cells are arranged in the pixel array unit 300 in a two-dimensional lattice shape. Details of the unit pixels will be described later. For example, each of the unit pixels includes a photoelectric conversion element such as a photodiode, and a circuit that generates a pixel signal of a voltage value corresponding to the amount of charges generated in the photoelectric conversion element (hereinafter, referred to as a pixel circuit or a pixel signal generation unit). Here, the pixel circuit may be shared by a plurality of photoelectric conversion elements. In this case, the unit pixel includes one photoelectric conversion element and a pixel circuit that is shared.

The plurality of unit pixels are arranged in the pixel array unit 300 in a two-dimensional lattice shape. The plurality of unit pixels may be grouped into a plurality pixel blocks, each including a predetermined number of unit pixels. Hereinafter, an assembly of unit pixels or pixel blocks which are arranged in a horizontal direction is referred to as "row", and an assembly of unit pixels or pixel blocks which are arranged in a direction orthogonal to the row is referred to as "column".

Each of the unit pixels generates charges corresponding to light-reception amount of the photoelectric conversion element. In addition, the unit pixel detects existence or nonexistence of address event ignition on the basis of whether or not a current value of a current (hereinafter, referred to as a photocurrent) by charges generated in the photoelectric conversion element or a variation amount thereof exceeds a predetermined threshold value. In addition, when the address event is ignited, the unit pixel outputs a request for reading out a pixel signal of a voltage value corresponding to the light-reception amount of the photoelectric conversion element to the arbiter 213.

The drive circuit 211 drives each of the unit pixels, and allows each of the unit pixels to output a pixel signal to the column ADC 220.

The arbiter 213 arbitrates a request from each of the unit pixels, and transmits a predetermined response to the unit pixel which issues the request on the basis of the arbitration result. The unit pixel which receives the response supplies a detection signal indicating existence or nonexistence of the address event ignition (hereinafter, simply referred to as "address event detection signal") to the drive circuit 211 and the signal processing unit 212.

For every unit pixel column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

2.3 Example of Pixel Array Unit

In the configuration illustrated in FIG. 3, for example, the pixel array unit 300 is constituted by an assembly of unit pixels which receive wavelength components necessary to reconstruct a color. For example, in the case of reconstructing a color on the basis of three primary colors of RGB, in the pixel array unit 300, a unit pixel that receives light of a red (R) color, a unit pixel that receives light of a green (G) color, and a unit pixel that receives light of a blue (B) color are arranged in a predetermined color filter array.

Examples of the color filter array include various arrays such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). Here, in the following description, a case where the Bayer Array is employed as the color filter array will be exemplified.

Figure 4:
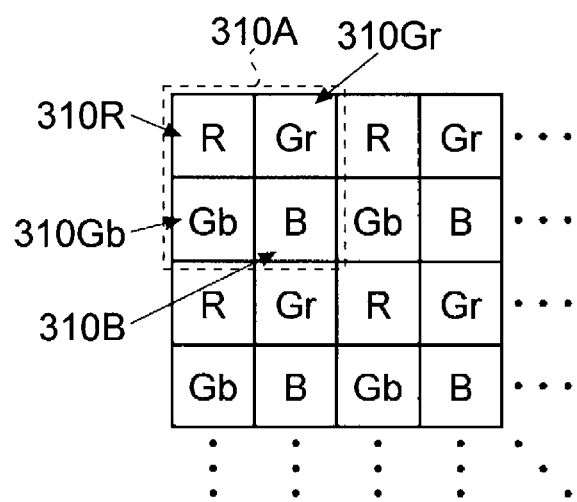
FIG. 4 is a schematic view illustrating an array example of unit pixels according to the first embodiment in a case of employing a Bayer array in a color filter array.

FIG. 4 is a schematic view illustrating an array example of unit pixels in the case of employing the Bayer array in the color filter array. As illustrated in FIG. 4, in the case of employing the Bayer array as the color filter array, in the pixel array unit 300, a basic pattern 310A including a total of four unit pixels of 2×2 pixels is repetitively arranged in a column direction and a row direction. For example, the basic pattern 310A is constituted by a unit pixel 310R including a color filter of a red (R) color, a unit pixel 310Gr including a color filter of a green (Gr) color, a unit pixel 310Gb including a color filter of a green (Gb) color, and a unit pixel 310B including a color filter of a blue (B) color.

2.4 Configuration Example of Unit Pixel

Figure 5:
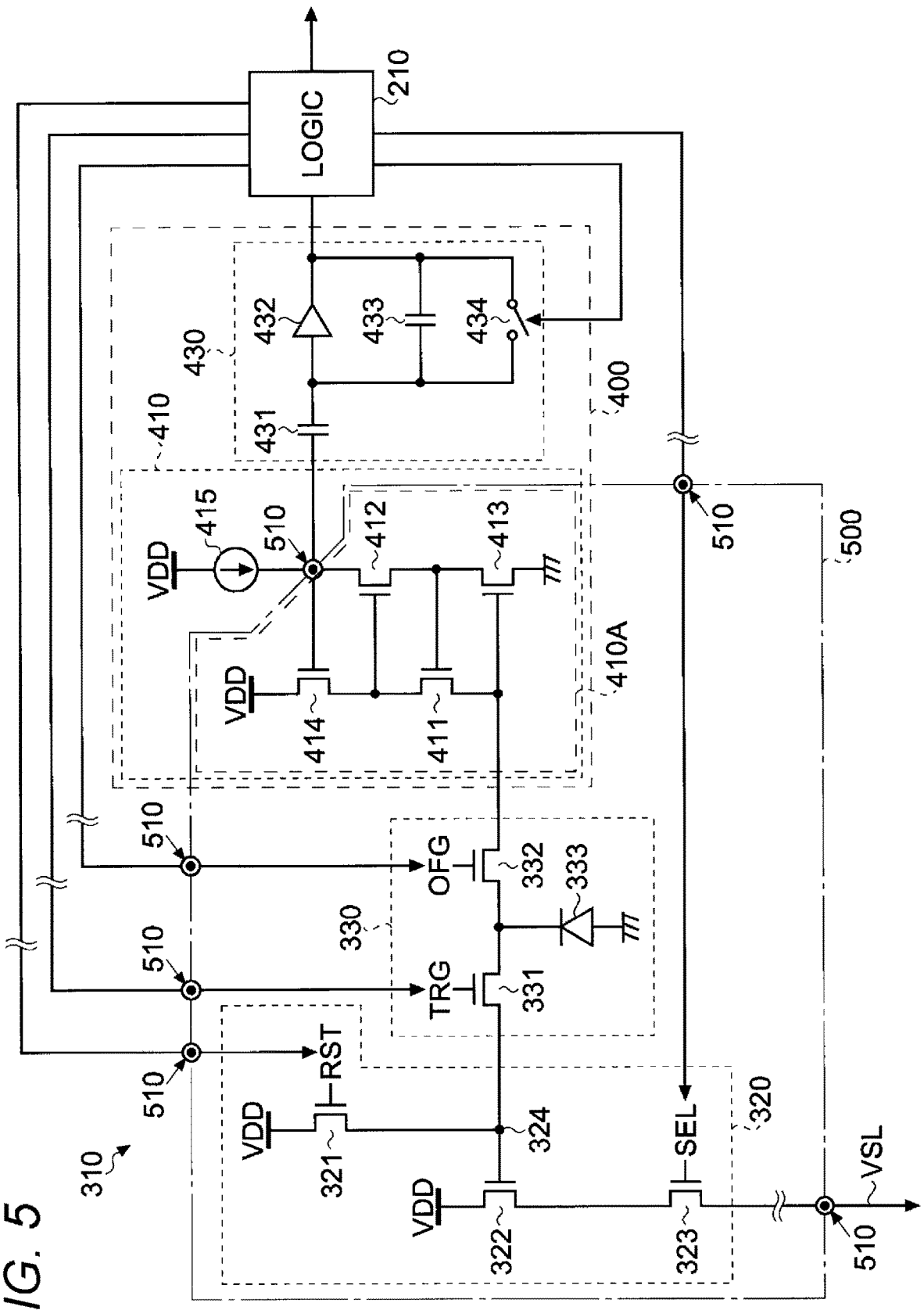
FIG. 5 is a circuit diagram illustrating a schematic configuration example of a unit pixel according to the first embodiment.

Next, a configuration example of a unit pixel 310 will be described. FIG. 5 is a circuit diagram illustrating a schematic configuration example of the unit pixel according to the first embodiment. As illustrated in FIG. 5, the unit pixel 310 includes, for example, a pixel signal generation unit (or readout circuit) 320, a light-receiving unit 330, and an address event detection unit (or readout circuit) 400. According to at least one example embodiment, the readout circuit 400 is configured to control the readout circuit 320 based on charge generated by a photoelectric conversion element (or photoelectric conversion region) 333. Furthermore, the logic circuit 210 in FIG. 5 is a logic circuit including, for example, the drive circuit 211, the signal processing unit 212, and the arbiter 213 in FIG. 3.

For example, the light-receiving unit 330 includes a transmission transistor (first transistor) 331, an overflow gate (OFG) transistor (fifth transistor) 332, and a photoelectric conversion element 333. A transmission signal TRG transmitted from the drive circuit 211 is supplied to a gate of the transmission transistor 331 of the light-receiving unit 330, and a control signal OFG transmitted from the drive circuit 211 is supplied to a gate of the OFG transistor 332. An output through the transmission transistor 331 of the light-receiving unit 330 is connected to the pixel signal generation unit 320, and an output through the OFG transistor 332 is connected to the address event detection unit 400.

For example, the pixel signal generation unit 320 includes a reset transistor (second transistor) 321, an amplification transistor (third transistor) 322, a selection transistor (fourth transistor) 323, and a floating diffusion layer (FD) 324.

The transmission transistor 331 and the OFG transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel signal generation unit 320 are each constituted, for example, by using the NMOS transistor.

For example, the address event detection unit 400 includes a current-voltage conversion unit 410 and a subtractor 430. However, the address event detection unit 400 is further provided with a buffer, a quantizer, and a transmission unit. Details of the address event detection unit 400 will be described in the following description by using FIG. 6 and the like.

In the configuration, the photoelectric conversion element 333 of the light-receiving unit 330 photoelectrically converts incident light to generate a charge. The transmission transistor 331 transmits a charge generated in the photoelectric conversion element 333 to the floating diffusion layer 324 in accordance with the transmission signal TRG. The OFG transistor 332 supplies an electric signal (photocurrent) based on the charge generated in the photoelectric conversion element 333 to the address event detection unit 400 in accordance with the control signal OFG.

The floating diffusion layer 324 accumulates charges transmitted from the photoelectric conversion element 333 through the transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to a charge amount of charges accumulated in the floating diffusion layer 324 to appear in a vertical signal line VSL. The selection transistor 323 switches connection between the amplification transistor 322 and the vertical signal line VSL in accordance with a selection signal SEL transmitted from the drive circuit 211. Furthermore, the analog pixel signal that appears in the vertical signal line VSL is read out by the column ADC 220, and is converted into a digital pixel signal.

When an instruction for address event detection initiation is given by the control unit 130, the drive circuit 211 in the logic circuit 210 outputs the control signal OFG for setting the OFG transistor 332 of all light-receiving units 330 in the pixel array unit 300 to an ON-state. With this arrangement, a photocurrent generated in the photoelectric conversion element 333 of the light-receiving unit 330 is supplied to the address event detection unit 400 of each unit pixel 310 through the OFG transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a predetermined response to the unit pixel 310 that issues the request on the basis of the arbitration result. The unit pixel 310 that receives the response supplies a detection signal indicating existence or nonexistence of the address event ignition (hereinafter, referred to as "address event detection signal") to the drive circuit 211 and the signal processing unit 212 in the logic circuit 210.

The drive circuit 211 sets the OFG transistor 332 in the unit pixel 310 that is a supply source of the address event detection signal to an OFF-state. With this arrangement, supply of the photocurrent from the light-receiving unit 330 to the address event detection unit 400 in the unit pixel 310 is stopped.

Next, the drive circuit 211 sets the transmission transistor 331 in the light-receiving unit 330 of the unit pixel 310 to an ON-state by the transmission signal TRG. With this arrangement, a charge generated in the photoelectric conversion element 333 of the light-receiving unit 330 is transmitted to the floating diffusion layer 324 through the transmission transistor 331. In addition, a pixel signal of a voltage value corresponding to a charge amount of charges accumulated in the floating diffusion layer 324 appears in the vertical signal line VSL that is connected to the selection transistor 323 of the pixel signal generation unit 320.

As described above, in the solid-state imaging device 200, a pixel signal SIG is output from the unit pixel 310 in which the address event ignition is detected to the column ADC 220.

Furthermore, for example, the light-receiving unit 330, the pixel signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other configurations are disposed, for example, in the logic chip 202 that is joined to the light-receiving chip 201 through the Cu—Cu joining. Therefore, in the following description, in the unit pixel 310, configurations which are disposed in the light-receiving chip 201 are referred to as "upper layer circuit", and the two LG transistors 411 and 414 and the two amplification transistors 412 and 413 in the current-voltage conversion unit 410 are referred to as "upper layer detection circuit 410A".

2.5 Configuration Example of Address Event Detection Unit

Figure 6:
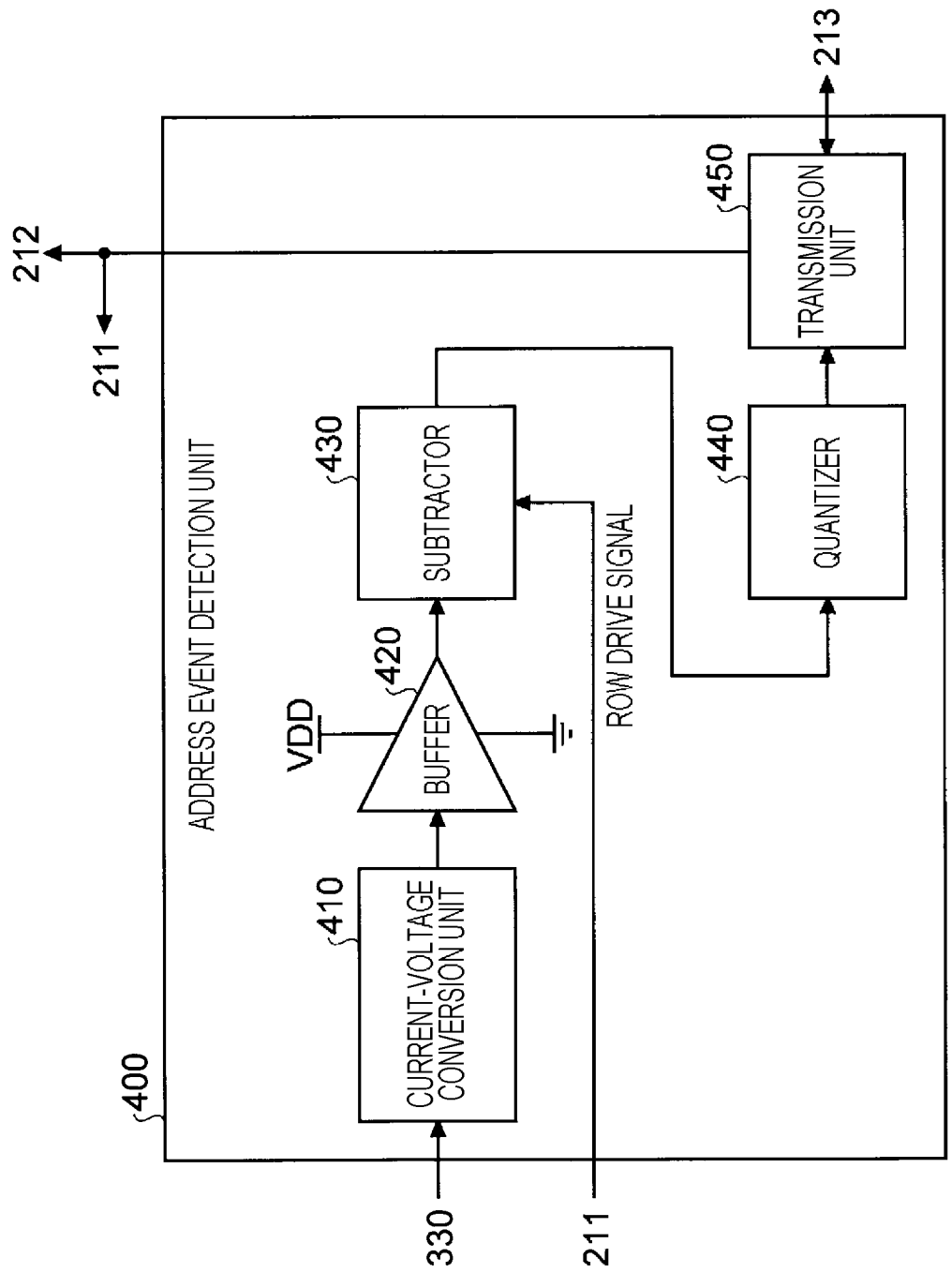
FIG. 6 is a block diagram illustrating a schematic configuration example of an address event detection unit according to the first embodiment.

FIG. 6 is a block diagram illustrating a schematic configuration example of the address event detection unit according to the first embodiment. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211, and supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

2.5.1 Configuration Example of Current-Voltage Conversion Unit

For example, the current-voltage conversion unit 410 in the configuration illustrated in FIG. 6 includes the two LG transistors 411 and 414, the two amplification transistors 412 and 413, and a constant-current circuit 415 as illustrated in FIG. 5.

For example, a source of the LG transistor 411 and a gate of the amplification transistor 413 are connected to a drain of the OFG transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

2.5.2 Configuration Example of Subtractor and Quantizer

Figure 7:
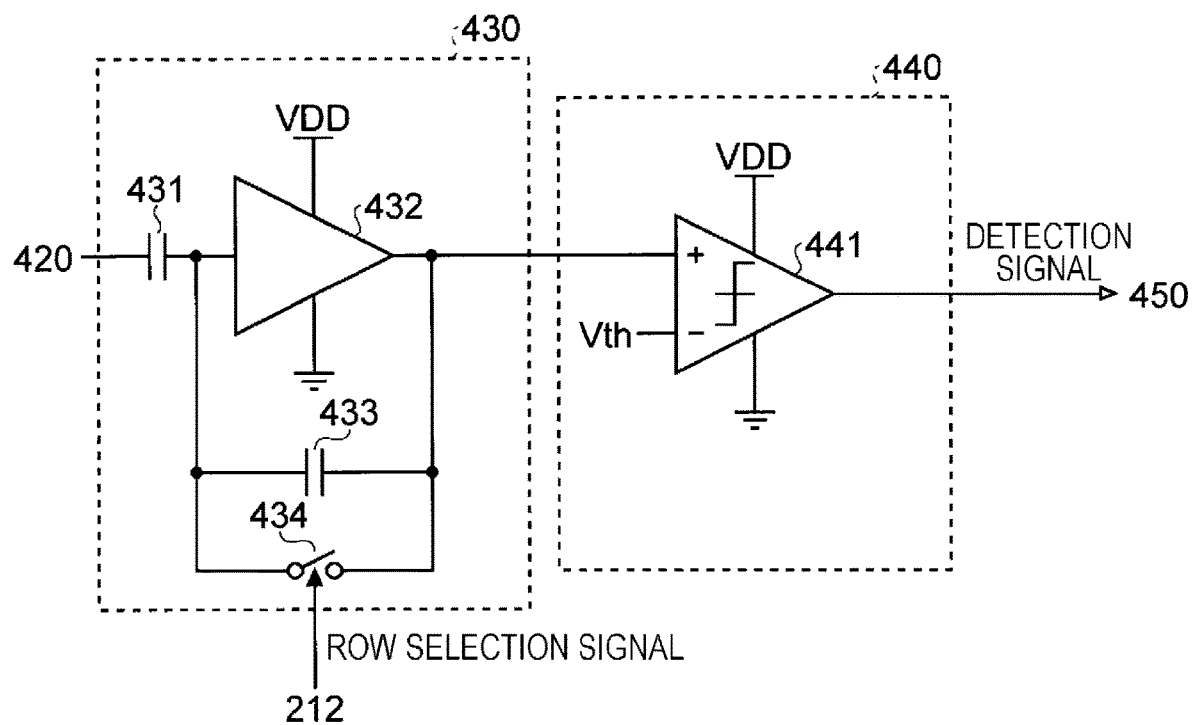
FIG. 7 is a circuit diagram illustrating a schematic configuration example of a subtractor and a quantizer according to the first embodiment.

FIG. 7 is a circuit diagram illustrating a schematic configuration example of the subtractor and the quantizer according to the first embodiment. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is turned on, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Q\text{init} = C1 \times V\text{init} \tag{1}$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Q\text{after} = C1 \times V\text{after} \tag{2}$$

On the other hand, when an output voltage is set as Vout, a charge Q2 accumulated in the capacitor 433 is expressed by the following Expression (3).

$$Q2 = -C2 \times V\text{out} \tag{3}$$

At this time, a total charge amount of the capacitors 431 and 433 does not vary, and thus the following Expression (4) is established.

$$Q\text{init} = Q\text{after} + Q2 \tag{4}$$

When Expression (1) to Expression (3) are substituted for Expression (4), the following Expression (5) is obtained.

$$V\text{out} = -(C1/C2) \times (V\text{after} - V\text{init}) \tag{5}$$

Expression (5) represents a subtraction operation of a voltage signal, and a gain of the subtraction result becomes C1/C2. Typically, it is desired to maximize (or alter-natively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Math. 1]

$$A = \frac{CG_{log} \cdot C1}{C2} \sum_{n=1}^{N} i_{photo\_n} \tag{6}$$

In Expression (6), $i_{photo\_n}$ represents a photocurrent of an nth unit pixel, and a unit thereof is, for example, an ampere (A). N represents the number of the unit pixels 310 in a pixel block, and is "1" in this embodiment.

2.5.3 Configuration Example of Column ADC

Figure 8:
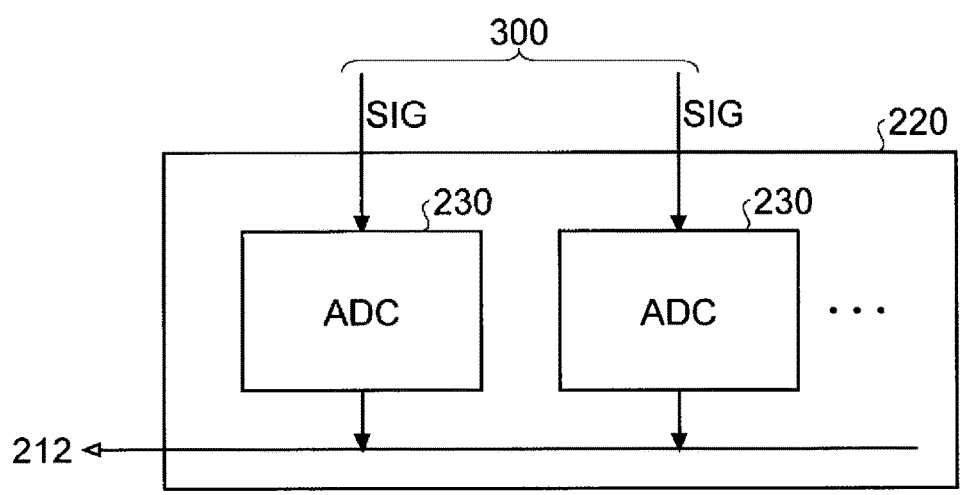
FIG. 8 is a block diagram illustrating a schematic configuration example of a column ADC according to the first embodiment.

FIG. 8 is a block diagram illustrating a schematic configuration example of the column ADC according to the first embodiment. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212.

2.6 Operation Example of Solid-State Imaging Device

Next, an operation of the solid-state imaging device 200 according to this embodiment will be described in detail with reference to the accompanying drawings.

2.6.1 Timing Chart

Figure 9:
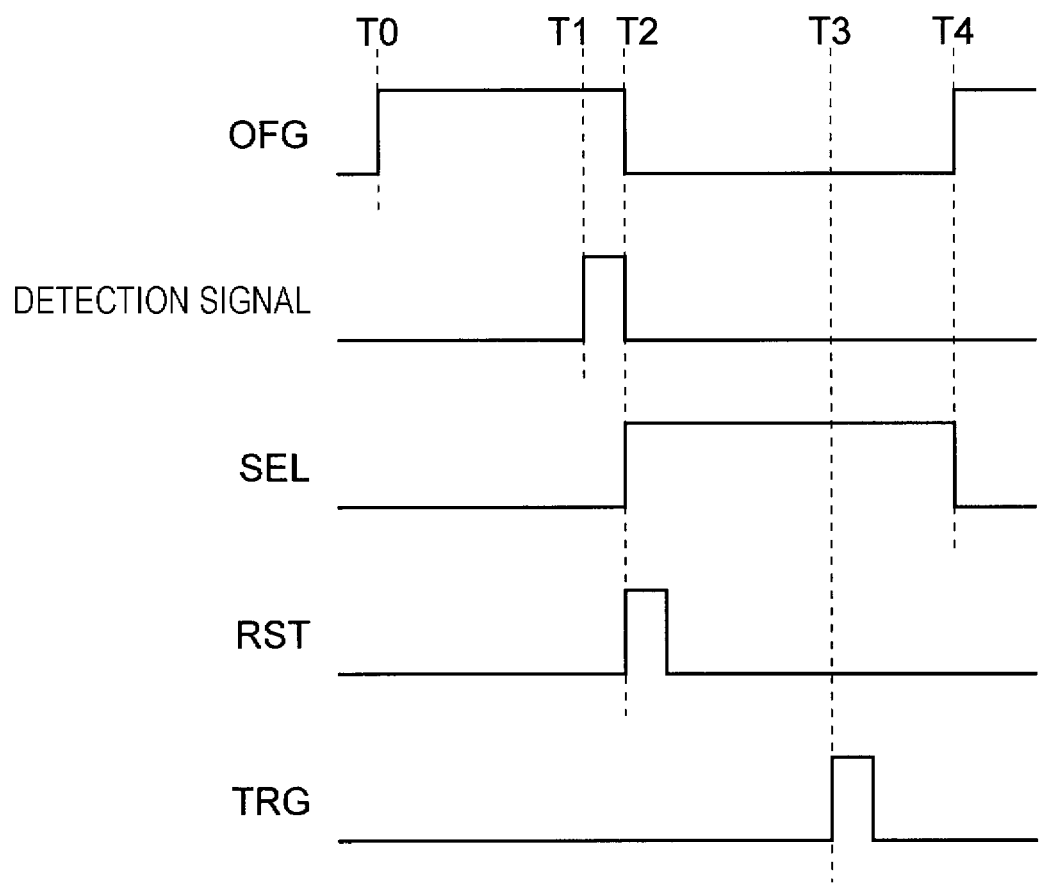
FIG. 9 is a timing chart illustrating an example of an operation of the solid-state imaging device according to the first embodiment.

First, an example of the operation of the solid-state imaging device 200 will be described by using a timing chart. FIG. 9 is a timing chart illustrating an example of the operation of the solid-state imaging device according to the first embodiment.

As illustrated in FIG. 9, at a timing T0, when an instruction for address event detection initiation is given by the control unit 130, the drive circuit 211 raises the control signal OFG applied to the gate of the OFG transistor 332 of all of the light-receiving units 330 in the pixel array unit 300 to a high level. With this arrangement, a plurality of the OFG transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal OFG is in a high level, all of the transmission signals TRG applied to the gate of the transmission transistor 331 in each of the light-receiving units 330 are maintained in a low level.

Accordingly, in this period, a plurality of the transmission transistors 331 in all of the light-receiving units 330 are in an OFF-state.

Next, a case where the address event detection unit 400 of an arbitrary unit pixel 310 detects address event ignition in a period in which the control signal OFG is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal indicating a detection result of an ON event.

The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel signal generation unit 320 to a high level for a constant pulse period, thereby discharging (initializing) charges accumulated in the floating diffusion layer 324 of the pixel signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") of the light-receiving unit 330, and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel signal generation unit 320 of the reading-out target unit pixel 310 to a low level, and raises the control signal OFG that is applied to the gate of the OFG transistor 332 of all of the light-receiving units 330 in the pixel array unit 300 to a high level. With this arrangement, address event ignition detection in all of the light-receiving units 330 in the pixel array unit 300 is restarted.

2.6.2 Flowchart

Figure 10:
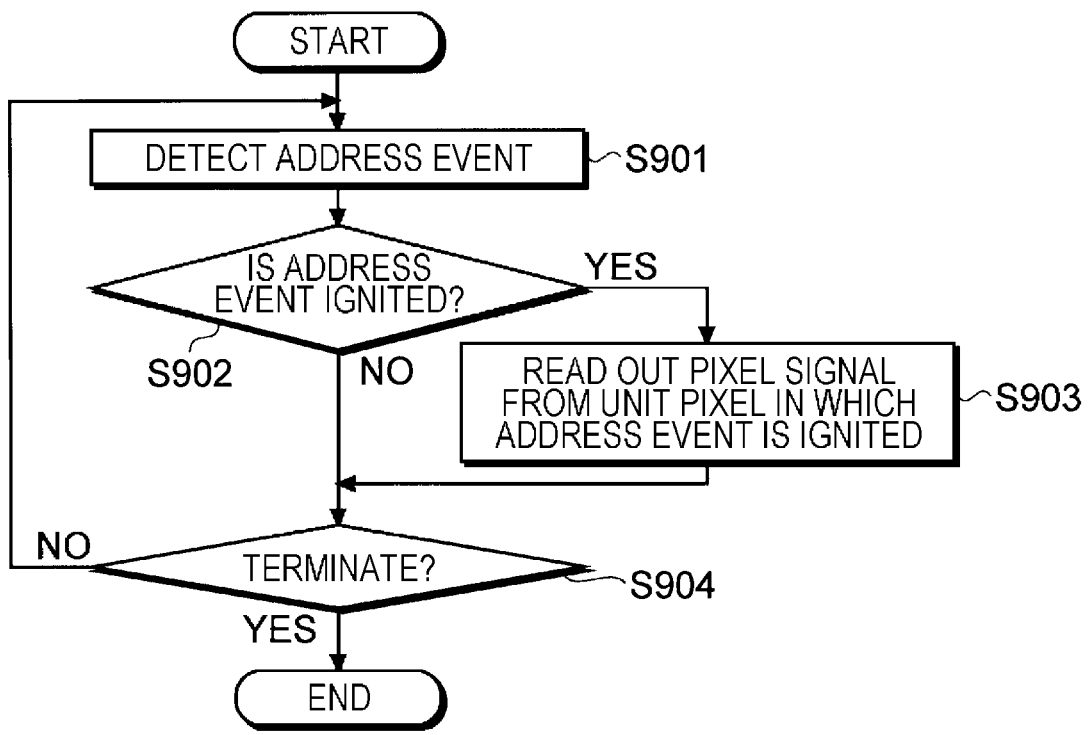
FIG. 10 is a flowchart illustrating an example of the operation of the solid-state imaging device according to the first embodiment.

Next, an example of the operation of the solid-state imaging device 200 will be described by using a flowchart. FIG. 10 is a flowchart illustrating an example of the operation of the solid-state imaging device according to the first embodiment. For example, this operation is initiated when a predetermined application for detecting an address event is executed.

As illustrated in FIG. 10, in this operation, first, each of the unit pixels 310 in the pixel array unit 300 detects existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

2.7 Layout Example of Unit Pixel

As described above, in the configuration illustrated in FIG. 5, for example, an upper layer circuit 500 including the light-receiving unit 330, the pixel signal generation unit 320, the two LG transistors 411 and 414 and the two amplification transistors 412 and 413 in the current-voltage conversion unit 410 of the address event detection unit 400 is disposed in the light-receiving chip 201 illustrated in FIG. 2 as an example, and the other configurations are disposed in the logic chip 202 that is joined to the light-receiving chip 201 through the Cu—Cu joining as an example. Hereinafter, with regard to a layout example in the light-receiving chip 201 of the upper layer circuit 500, several examples will be described.

2.7.1 First Layout Example

Figure 11:
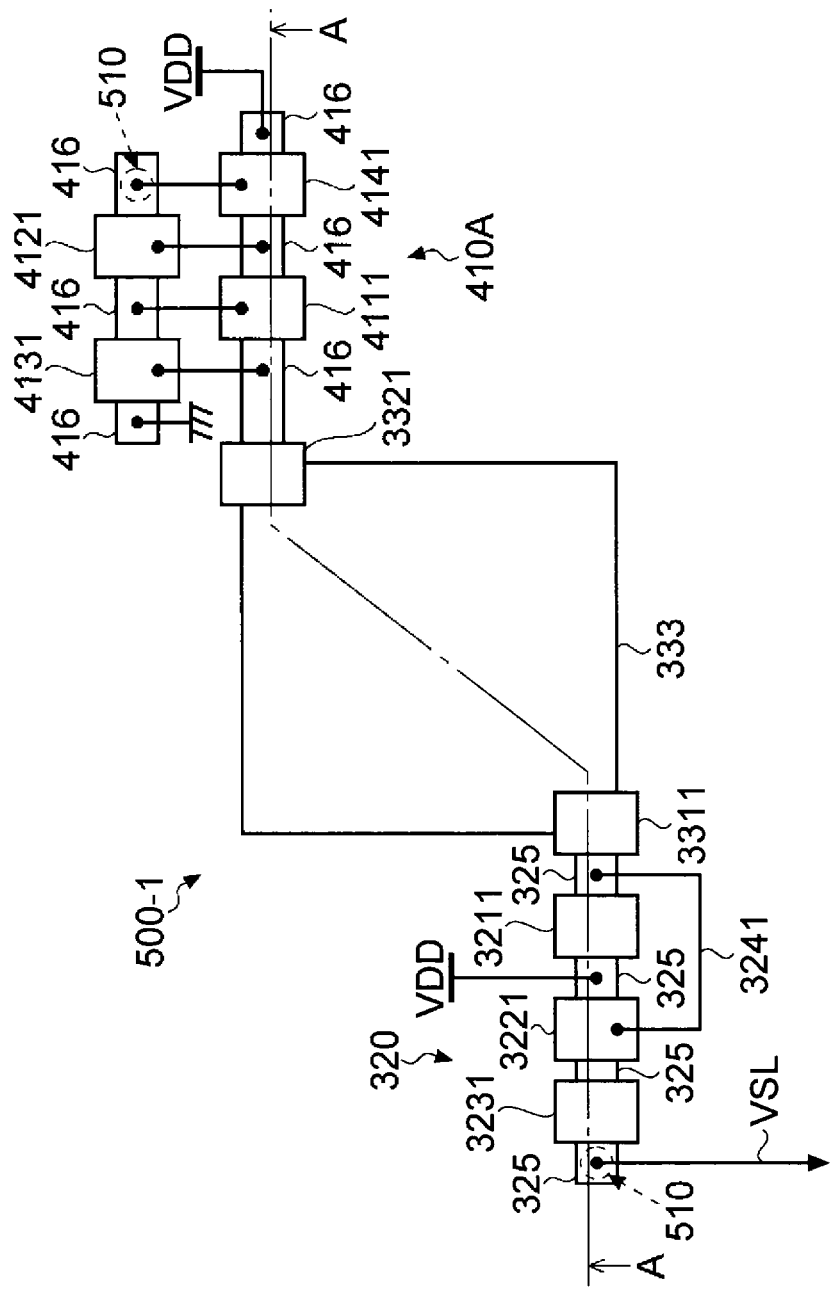
FIG. 11 is a top view illustrating a schematic configuration example of an upper layer circuit according to a first layout example of the first embodiment.

FIG. 11 is a top view illustrating a schematic configuration example of the upper layer circuit according to a first layout example. In addition, FIG. 12 is a view illustrating a cross-sectional structure example of a unit pixel in a case where the solid-state imaging device is cut along plane A-A in FIG. 11.

Figure 12:
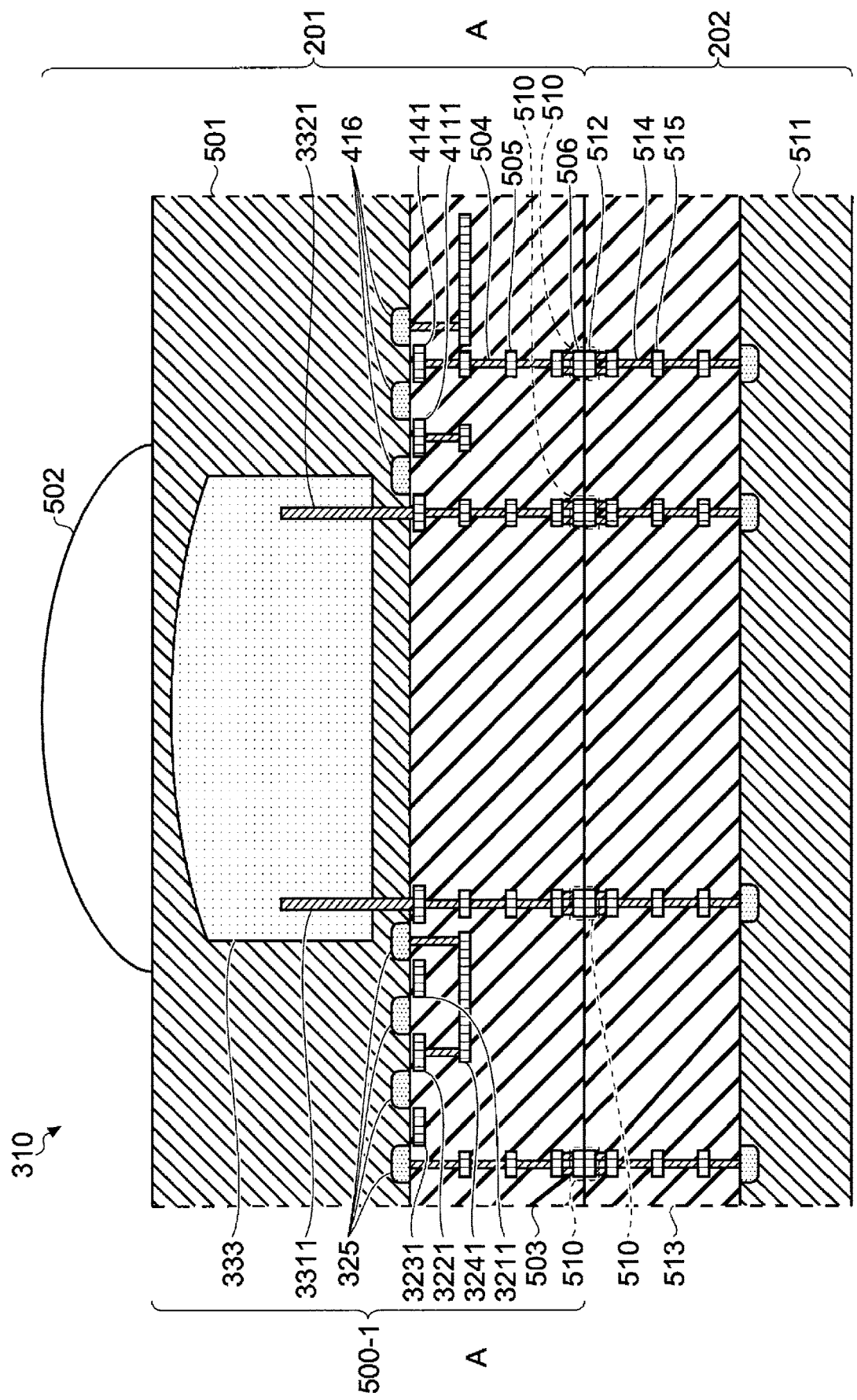
FIG. 12 is a view illustrating a cross-sectional structure example of a unit pixel in a case where the solid-state imaging device is cut out along plane A-A in FIG. 11.

As illustrated in FIG. 12, for example, the unit pixel 310 has a rear surface irradiation type structure in which a surface (hereinafter, referred to as "rear surface") opposite to an element forming surface (a lower surface in the drawing) of a semiconductor substrate 501 is set as a light incident surface. Here, the unit pixel 310 has a structure in which the light-receiving chip 201 including the semiconductor substrate 501 and an interlayer insulating film 503, and the logic chip 202 including a semiconductor substrate 511 and an interlayer insulating film 513 are joined by a Cu—Cu joint 510.

As described above, an upper layer circuit 500-1 is formed in the light-receiving chip 201. A microlens 502 is provided for every unit pixel 310 on a rear surface of the semiconductor substrate 501 in the light-receiving chip 201 to condense incident light to a photoelectric conversion element 333. Furthermore, although not illustrated in the drawing, for example, color filters arranged in a predetermined color filter array as illustrated in FIG. 4 may be disposed on the rear surface of the semiconductor substrate 501.

In addition, as illustrated in FIG. 11 and FIG. 12, the upper layer circuit 500-1 according to the first layout example includes the photoelectric conversion element 333 that is formed by injecting an N-type dopant (donor) into the semiconductor substrate 501 in which a P-type dopant (acceptor) is diffused. A transmission gate 3311 of the transmission transistor 331, which is formed in a trench ranging from the element forming surface of the semiconductor substrate 501 to the photoelectric conversion element 333, is disposed at one corner portion of the photoelectric conversion element 333 in which a light-receiving surface has a rectangular shape. In addition, an OFG gate 3321 of the OFG transistor 332, which is formed in a trench ranging from the element forming surface of the semiconductor substrate 501 to the photoelectric conversion element 333, is formed at a corner portion that is diagonally located with respect to the corner portion at which the transmission gate 3311 is provided.

A reset gate 3211 of the reset transistor 321, an amplification gate 3221 of the amplification transistor 322, and a selection gate 3231 of the selection transistor 323 in the pixel signal generation unit 320 are linearly arranged in a line from the corner portion at which the transmission gate 3311 is disposed in parallel to a row direction. Furthermore, a gate insulating film is disposed between each of the reset gate 3211, the amplification gate 3221, and the selection gate 3231, and the semiconductor substrate 501.

In the semiconductor substrate 501, a diffusion region 325 that functions as a connection node is formed in a region between the transmission gate 3311 and the reset gate 3211. In addition, a diffusion region 325 that functions as a source and a drain is formed in each region between the reset gate 3211, the amplification gate 3221, and the selection gate 3231.

The diffusion region 325 between the transmission gate 3311 and the reset gate 3211, and the amplification gate 3221 are connected to each other by an interconnection 3241 that is formed in the interlayer insulating film 503 and functions as the floating diffusion layer 324. The diffusion region 325 between the reset gate 3211 and the amplification gate 3221 is connected to a power supply terminal VDD.

On the other hand, an LG gate 4111 of the LG transistor 411 and an LG gate 4141 of the LG transistor 414 in the upper layer detection circuit 410A are linearly arranged in a line from the corner portion at which the OFG gate 3321 is disposed in parallel to the row direction on a side opposite to the pixel signal generation unit 320. In addition, an amplification gate 4121 of the amplification transistor 412 and an amplification gate 4131 of the amplification transistor 413 are arranged in parallel to the array of the LG gates 4111 and 4141. Furthermore, in FIG. 12, the amplification transistors 412 and 413 are omitted due to a cross-sectional position relationship. In addition, a gate insulating film is disposed between the LG gates 4111 and 4141 and the semiconductor substrate 501, and between the amplification gates 4121 and 4131 and the semiconductor substrate 501.

In the semiconductor substrate 501, a diffusion region 416 that functions as a connection node is formed in a region between the OFG gate 3321 and the LG gate 4111. In addition, a diffusion region 416 that functions as a source and a drain is formed in each of a region between the LG gate 4111 and the LG gate 4141 and a region between the amplification gate 4121 and the amplification gate 4131. In addition, a diffusion region 416 that functions as a drain of the LG transistor 414 is connected to a power supply terminal VDD, and a diffusion region 416 that functions as a drain of the amplification transistor 413 is grounded.

In addition, the diffusion region 416 between the OFG gate 3321 and the LG gate 4111 is connected to the amplification gate 4131, the diffusion region 416 between the LG gate 4111 and the LG gate 4141 is connected to the amplification gate 4121, the diffusion region 416 between the amplification gate 4121 and the amplification gate 4131 is connected to the LG gate 4111, and a diffusion region 416 that functions as a drain of the amplification transistor 412 is connected to the LG gate 4141.

In the above-described configuration, the diffusion region 325 that functions as a drain of the selection transistor 323, and the diffusion region 416 that functions as the drain of the amplification transistor 412 are each connected to a copper (Cu) pad 506 in a surface (a lower surface in the drawing) of the interlayer insulating film 503 through an interconnection 504 and a pad 505 which are formed in the interlayer insulating film 503. The Cu pad 506 is joined to a Cu pad 512 that is formed in a surface of the interlayer insulating film 513 on the semiconductor substrate 511 to form the Cu—Cu joint 510. The Cu—Cu joint 510 functions as a connection portion that electrically connects the light-receiving chip 201 and the logic chip 202, and also functions as a joint for mechanically laminating the light-receiving chip 201 and the logic chip 202. Furthermore, the Cu pad 512 in the surface of the interlayer insulating film 513 is connected to the semiconductor substrate 511, for example, through an interconnection 514 and a pad 515 which are formed in the interlayer insulating film 513.

Accordingly, the diffusion region 325 that functions as the drain of the selection transistor 323 is connected to the vertical signal line VSL on the logic chip 202 side through the interconnection 504, the pad 505, and the Cu—Cu joint 510 in the interlayer insulating film 503. In addition, the diffusion region 416 that functions as the drain of the amplification transistor 412 is connected to remaining circuit configurations of the current-voltage conversion unit 410 that is disposed on the logic chip 202 side through the interconnection 504, the pad 505, and the Cu—Cu joint 510 in the interlayer insulating film 503.

In addition, although not illustrated in the drawing, as illustrated in FIG. 5, the transmission gate 3311 and the OFG gate 3321 in the light-receiving unit 330, and the reset gate 3211 and the selection gate 3231 in the pixel signal generation unit 320 are connected to the drive circuit 211 of the logic chip 202 through the interconnection 504, the pad 505, and the Cu—Cu joint 510 in the interlayer insulating film 503.

As described above, when the pixel signal generation unit 320 and the upper layer detection circuit 410A are laid out to linearly extend from the corner portions of the photoelectric conversion element 333, respectively, it is possible to shorten an interconnection length. With this arrangement, it is possible to reduce the occupation ratio of the pixel signal generation unit 320 and the upper layer detection circuit 410A on the light-receiving surface, and thus the occupation ratio of the photoelectric conversion element 333 increases. As a result, it is possible to improve light-reception efficiency.

In addition, it is possible to use an NMOS transistor as the respective transistors which constitute the pixel signal generation unit 320, and the respective transistors which constitute the upper layer detection circuit 410A. Accordingly, when disposing the transistors in the same light-receiving chip 201, it is possible to simplify a manufacturing process of the light-receiving chip 201.

In addition, a layout of the respective transistors which constitute the pixel signal generation unit 320, and a layout of the respective transistors which constitute the upper layer detection circuit 410A are similar to each other, and thus when the configurations are disposed in the same light-receiving chip 201, it is also possible to make a layout design of the light-receiving chip 201 easy.

2.7.1.1 Array Example

Figure 13:
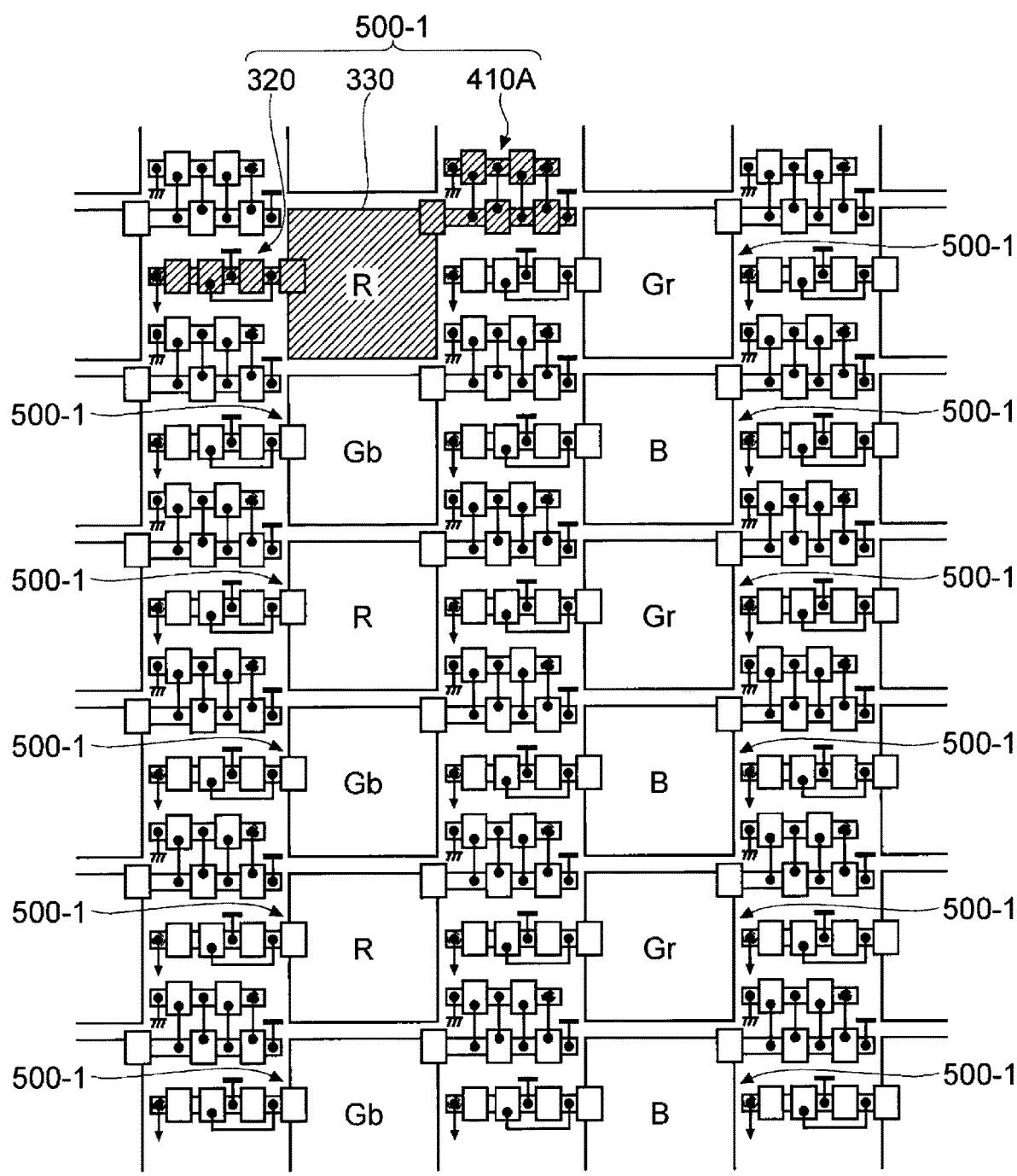
FIG. 13 is a schematic view illustrating an array example of the upper layer circuit according to the first layout example of the first embodiment in a pixel array unit.

FIG. 13 is a schematic view illustrating an array example of the upper layer circuit according to the first layout example in the pixel array unit. Furthermore, in FIG. 13, one among a plurality of the upper layer circuits 500-1 is hatched for clarification. In addition, FIG. 13 illustrates a case where the transmission gate 3311 of the transmission transistor 331 is provided at a side opposite to the side at which the upper layer detection circuit 410A is disposed in the photoelectric conversion element 333 differently from the upper layer circuit 500-1 illustrated in FIG. 11.

As illustrated in FIG. 13, in the first layout example, for example, a plurality of the photoelectric conversion elements 333 are arranged to be adjacent to each other in an upper and lower direction (that is, a column direction), and to alternately exist in a right and left direction (that is, a row direction). When employing the array, it is possible to interpolate a pixel value of a region in which the photoelectric conversion element 333 does not exist (that is, a region occupied by the pixel signal generation unit 320 and the upper layer detection circuit 410A) with a pixel value obtained by the photoelectric conversion element 333 at the periphery of the region.

In addition, it is possible to integrate the pixel signal generation unit 320 and the upper layer detection circuit 410A in a region corresponding to one piece of the photoelectric conversion element 333 between the upper layer circuits 500-1 adjacent to each other, and thus it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

2.7.1.2 Modification Example of First Layout Example

Figure 14:
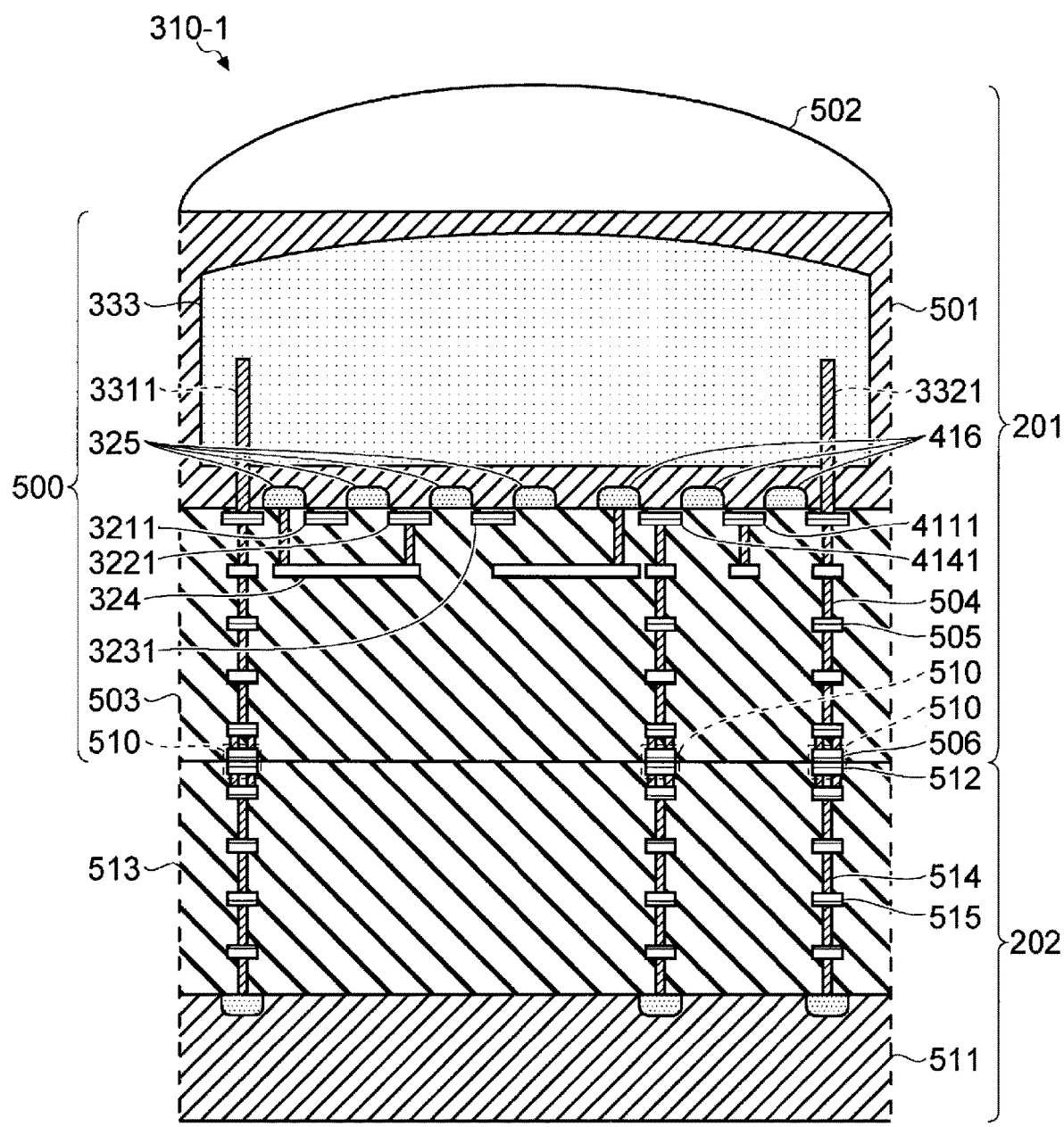
FIG. 14 is a view illustrating a modification example of a cross-sectional structure of a unit pixel according to the first layout example of the first embodiment.

Furthermore, in the first layout example, the pixel signal generation unit 320 and the upper layer detection circuit 410A are laid out to linearly extend from the corner portions of the photoelectric conversion element 333. However, for example, as in a unit pixel 310-1 illustrated in FIG. 14, the pixel signal generation unit 320 and the upper layer detection circuit 410A may be laid out to be folded back toward a surface (a lower surface in the drawing) of the photoelectric conversion element 333 from the corner portions of the photoelectric conversion element 333. With this arrangement, it is possible to further reduce the occupation ratio of the pixel signal generation unit 320 and the upper layer detection circuit 410A on the light-receiving surface, and thus the occupation ratio of the photoelectric conversion element 333 increases. As a result, it is possible to further improve the light-reception efficiency.

2.7.2 Second Layout Example

Figure 15:
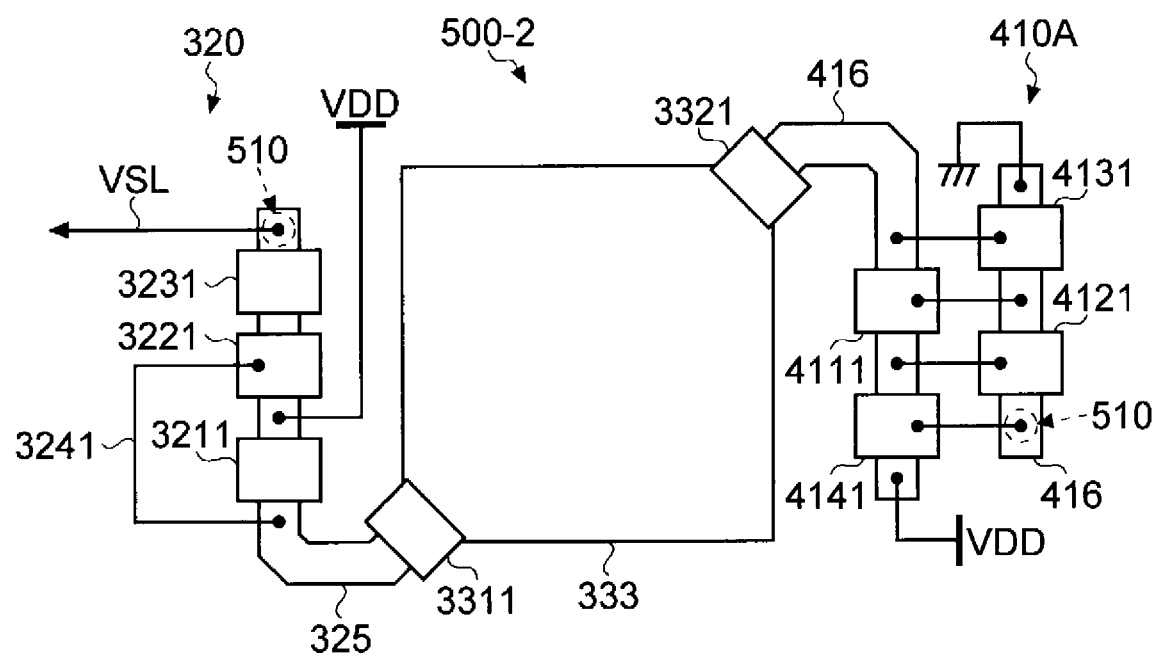
FIG. 15 is a top view illustrating a schematic configuration example of an upper layer circuit according to a second layout example of the first embodiment.

FIG. 15 is a top view illustrating a schematic configuration example of an upper layer circuit according to a second layout example. As illustrated in FIG. 15, in an upper layer circuit 500-2 according to the second layout example, in a similar manner as in the first layout example, the transmission gate 3311 and the OFG gate 3321 are respectively disposed at diagonally located corner portions of the photoelectric conversion element 333.

The reset gate 3211, the amplification gate 3221, and the selection gate 3231 in the pixel signal generation unit 320 are linearly arranged in a line in parallel to a column direction along a side of the photoelectric conversion element 333 from a corner portion, at which the transmission gate 3311 is disposed, of the photoelectric conversion element 333.

On the other hand, the LG gates 4111 and 4141 in the upper layer detection circuit 410A are arranged in parallel to the column direction along a side opposite to the side along which the pixel signal generation unit 320 is disposed from a corner portion, at which the OFG gate 3321 is disposed, of the photoelectric conversion element 333. In addition, the amplification gates 4121 and 4131 are arranged in parallel to the array of the LG gates 4111 and 4141.

According to the layout, it is possible to set a shape of an outer edge of the upper layer circuit 500-2 to a rectangular shape, and thus it is possible to make a layout design of the upper layer circuit 500-2 in the pixel array unit 300 easy. The other configurations and effects may be similar to those in the first layout example.

Figure 16:
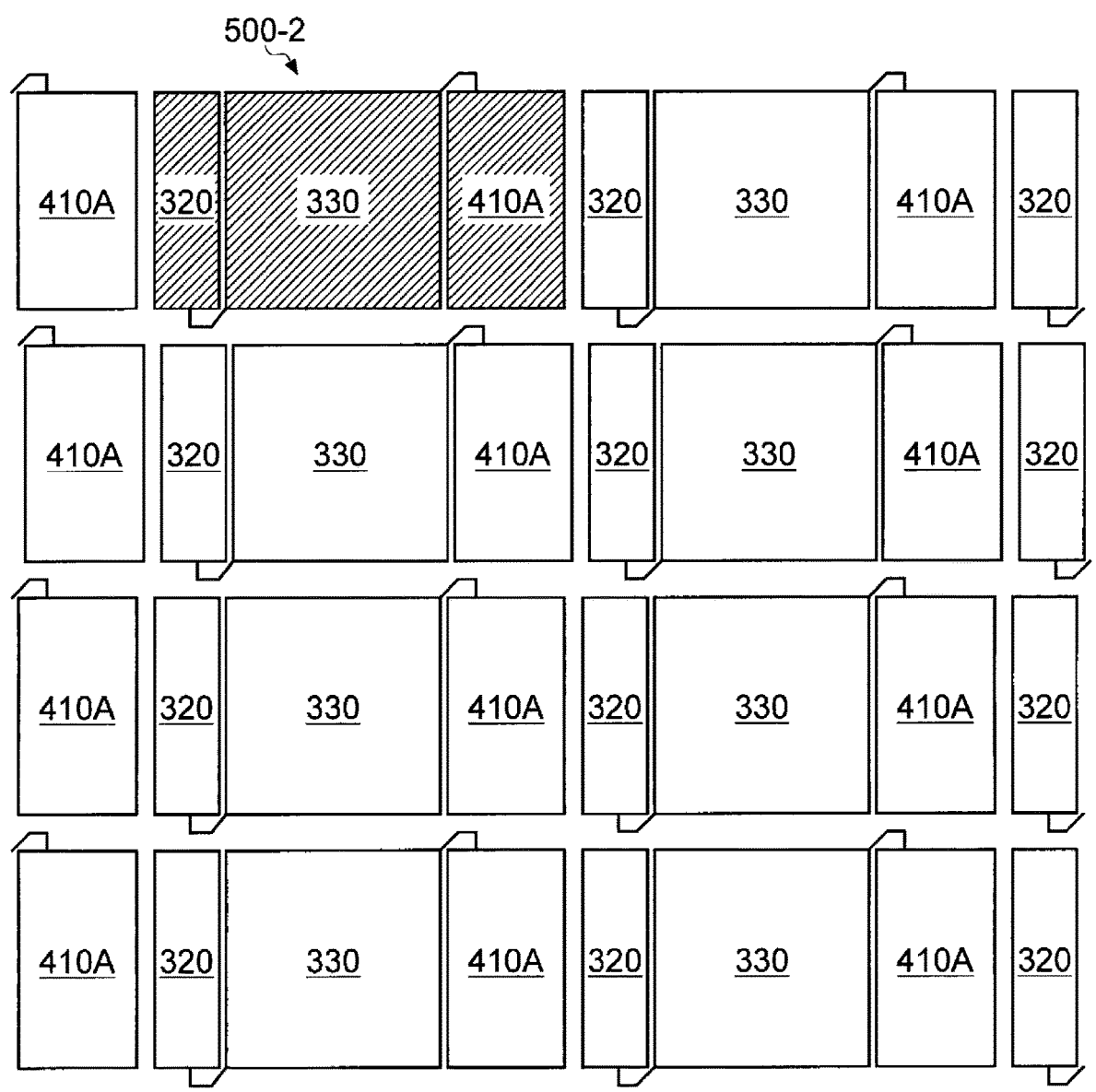
FIG. 16 is a schematic view illustrating an array example of the upper layer circuit according to the second layout example of the first embodiment in the pixel array unit.

2.7.2.1 Array Example FIG. 16 is a schematic view illustrating an array example of the upper layer circuit according to the second layout example in the pixel array unit. Furthermore, in FIG. 16, one among a plurality of the upper layer circuits 500-2 is hatched for clarification.

As illustrated in FIG. 16, in the second layout example, for example, in a similar manner as in the first layout example, the photoelectric conversion elements 333 are arranged to be adjacent to each other in the upper and lower direction (that is, the column direction), and to alternately exist in the right and left direction (that is, the row direction). When employing the array, it is possible to interpolate a pixel value of a region in which the photoelectric conversion element 333 does not exist (that is, a region occupied by the pixel signal generation unit 320 and the upper layer detection circuit 410A) with a pixel value obtained by the photoelectric conversion element 333 at the periphery of the region.

In addition, in a similar manner as in the first layout example, it is possible to integrate the pixel signal generation unit 320 and the upper layer detection circuit 410A in a region corresponding to one piece of the photoelectric conversion element 333 between the upper layer circuits 500-2 adjacent to each other, and thus it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

The other configurations and effects may be similar to those in the above-described layout example.

2.7.3 Third Layout Example

Figure 17:
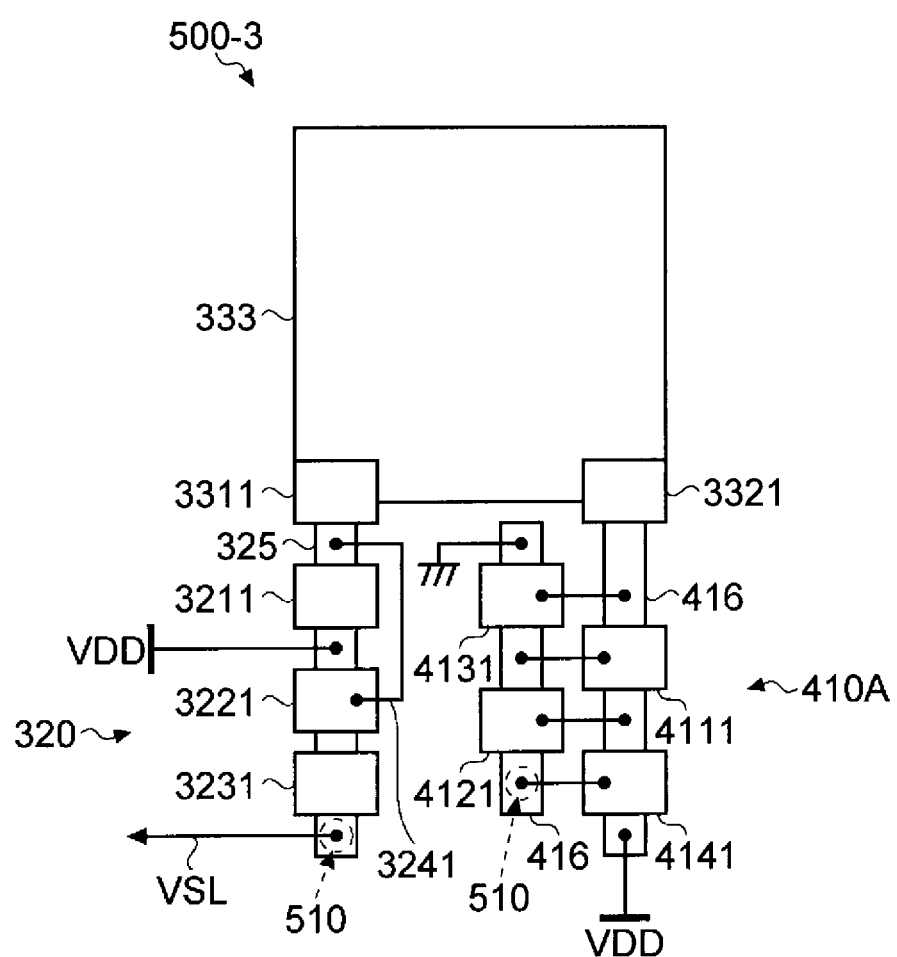
FIG. 17 is a top view illustrating a schematic configuration example of an upper layer circuit according to a third layout example of the first embodiment.

FIG. 17 is a top view illustrating a schematic configuration example of an upper layer circuit according to a third layout example. As illustrated in FIG. 17, in an upper layer circuit 500-3 according to the third layout example, the transmission gate 3311 and the OFG gate 3321 are respectively disposed at corner portions (for example, two corner portions on a lower side in the drawing) which are adjacent to each other in the photoelectric conversion element 333.

In a similar manner as in the first embodiment, the reset gate 3211, the amplification gate 3221, and the selection gate 3231 in the pixel signal generation unit 320 are linearly arranged in a line in parallel to the column direction from a corner portion, at which the transmission gate 3311 is disposed, of the photoelectric conversion element 333.

On the other hand, the LG gates 4111 and 4141 in the upper layer detection circuit 410A are linearly arranged in a line in parallel to the reset gate 3211, the amplification gate 3221, and the selection gate 3231 of the pixel signal generation unit 320 from a corner portion, at which the OFG gate 3321 is disposed, of the photoelectric conversion element 333.

In addition, the amplification gates 4121 and 4131 are arranged in parallel to the array of the LG gates 4111 and 4141 between the reset gate 3211, the amplification gate 3221, and the selection gate 3231 of the pixel signal generation unit 320, and the LG gates 4111 and 4141 of the upper layer detection circuit 410A.

The pixel signal generation unit 320 and the upper layer detection circuit 410A are integrated, for example, in a region having a size that is the same as or equal to or less than a size of the photoelectric conversion element 333. When employing this configuration, it is possible to set a shape of an outer edge of the upper layer circuit 500-3 to a rectangular shape.

2.7.3.1 Array Example

Figure 18:
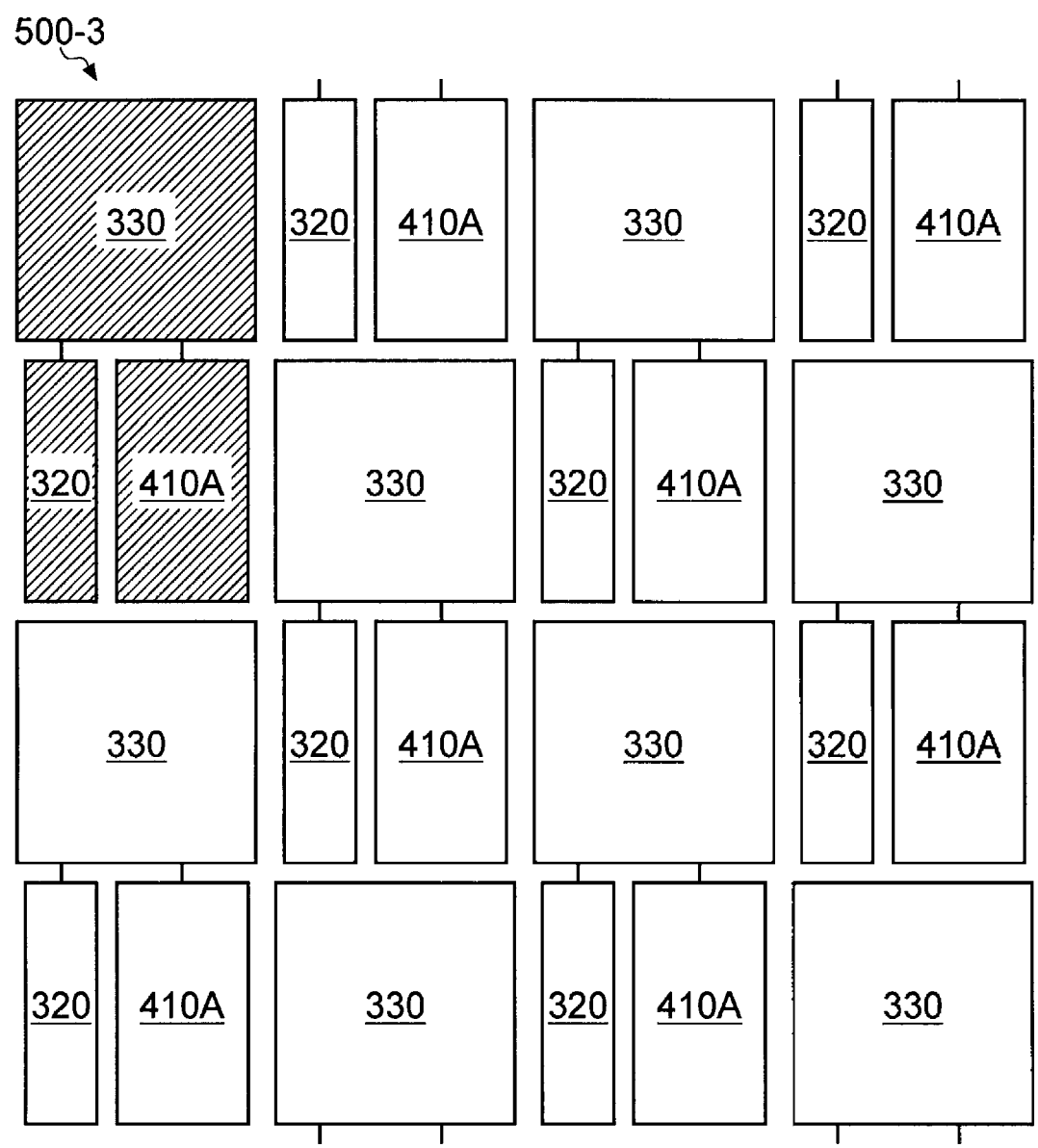
FIG. 18 is a schematic view illustrating an array example of the upper layer circuit according to the third layout example of the first embodiment in the pixel array unit.

FIG. 18 is a schematic view illustrating an array example of the upper layer circuit according to the third layout example in the pixel array unit. Furthermore, in FIG. 18, one among a plurality of the upper layer circuits 500-3 is hatched for clarification.

As illustrated in FIG. 18, in the third layout example, for example, the photoelectric conversion elements 333 may be arranged to alternately exist in the upper and lower direction and the right and left direction (that is, the row direction and the column direction). When employing the array, it is possible to interpolate a pixel value of a region in which the photoelectric conversion element 333 does not exist (that is, a region occupied by the pixel signal generation unit 320 and the upper layer detection circuit 410A) with a pixel value obtained by the photoelectric conversion element 333 at the periphery of the region.

As described above, when employing the array in which the pixel signal generation unit 320 and the upper layer detection circuit 410A are integrated on one-side side of the photoelectric conversion element 333, it is possible to set a shape of an external edge of each of the upper layer circuits 500-3 to a rectangular shape, and thus it is possible to make a layout design of the upper layer circuit 500-3 in the pixel array unit 300 easy.

In addition, when the pixel signal generation unit 320 and the upper layer detection circuit 410A are integrated on the one-side side of the photoelectric conversion element 333, it is possible to reduce an area of the upper layer circuit 500-3. Accordingly, it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

In addition, when a plurality of the upper layer circuits 500-3 are arranged so that the photoelectric conversion elements 333 alternately exist in the upper and lower direction and the right and left direction, it is possible to interpolate a pixel value of a region in which the photoelectric conversion element 333 does not exist with a pixel value obtained by the photoelectric conversion element 333 at the periphery of the region. With this arrangement, it is possible to realize an event-driven type image sensor without deteriorating resolution of image data acquired by the solid-state imaging device 200.

The other configurations and effects may be similar to those in the above-described layout examples.

2.7.4 Fourth Layout Example

Figure 19:
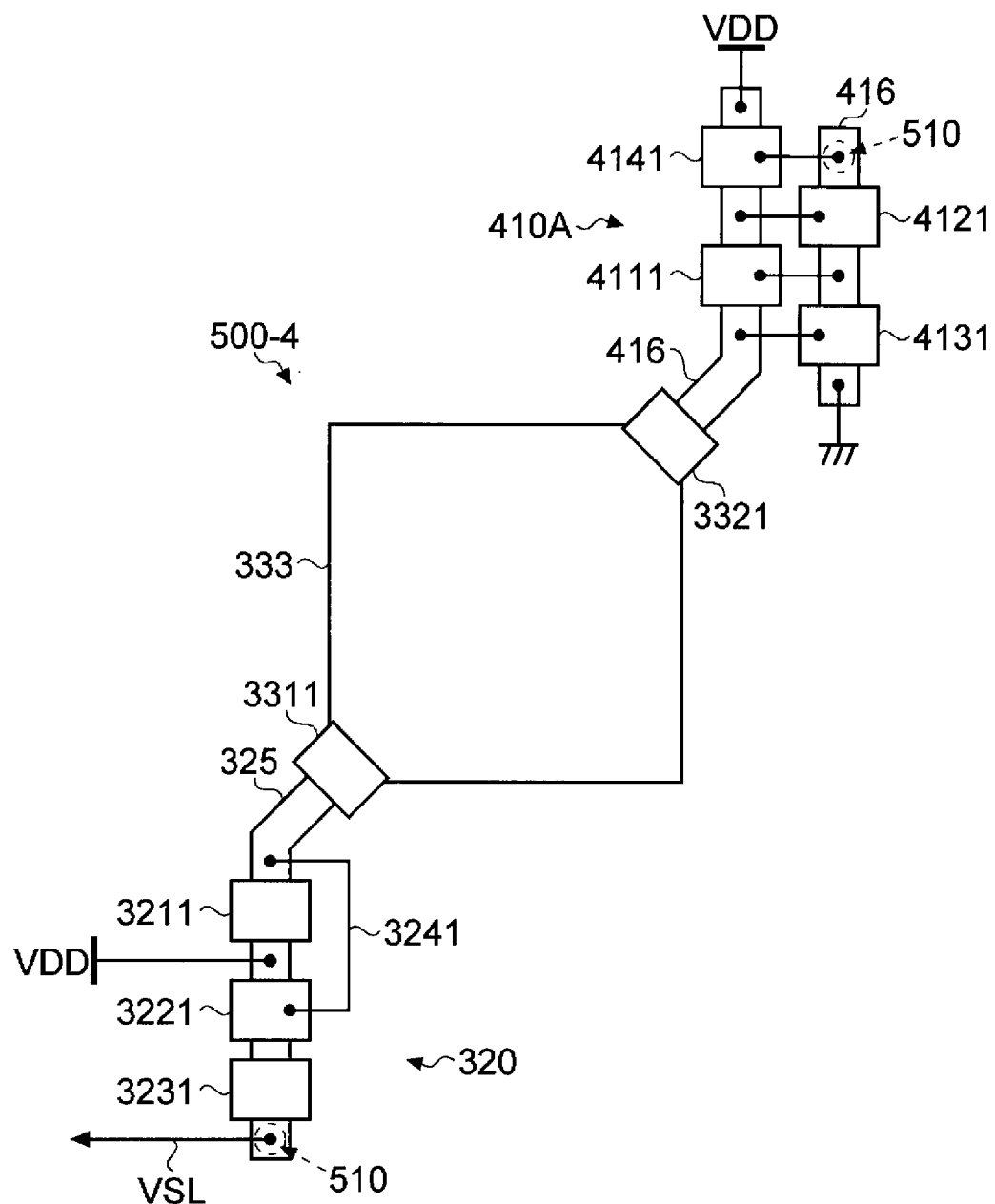
FIG. 19 is a top view illustrating a schematic configuration example of an upper layer circuit according to a fourth layout example of the first embodiment.

FIG. 19 is a top view illustrating a schematic configuration example of an upper layer circuit according to a fourth layout example. As illustrated in FIG. 19, in an upper layer circuit 500-4 according to the fourth layout example, in a similar manner as in the first layout example, the transmission gate 3311 and the OFG gate 3321 are respectively disposed at diagonally located corner portions of the photoelectric conversion element 333.

The pixel signal generation unit 320 is disposed in a region that faces a corner portion at which the transmission gate 3311 is disposed, that is, a left obliquely downward region with respect to the region in which the photoelectric conversion element 333 is disposed in the example illustrated in FIG. 19. In the left obliquely downward region, the reset gate 3211, the amplification gate 3221, and the selection gate 3231 in the pixel signal generation unit 320 are linearly arranged in a line in parallel to the column direction.

On the other hand, the upper layer detection circuit 410A is disposed in a region that faces a corner portion at which the OFG gate 3321 is disposed, that is, a right obliquely upward region with respect to the region in which the photoelectric conversion element 333 is disposed in the example illustrated in FIG. 19. In the right obliquely upward region, the LG gates 4111 and 4141 in the upper layer detection circuit 410A are linearly arranged in a line in parallel to the column direction. In addition, the amplification gates 4121 and 4131 are arranged in parallel to the array of the LG gates 4111 and 4141.

For example, a size of the pixel signal generation unit 320 in the column direction is set to be approximately the same as or equal to or less than a size of the photoelectric conversion element 333 in the column direction. Similarly, for example, a size of the upper layer detection circuit 410A in the column direction is set to be approximately the same as or equal to or less than the size of the photoelectric conversion element 333 in the column direction.

2.7.4.1 First Array Example

Figure 20:
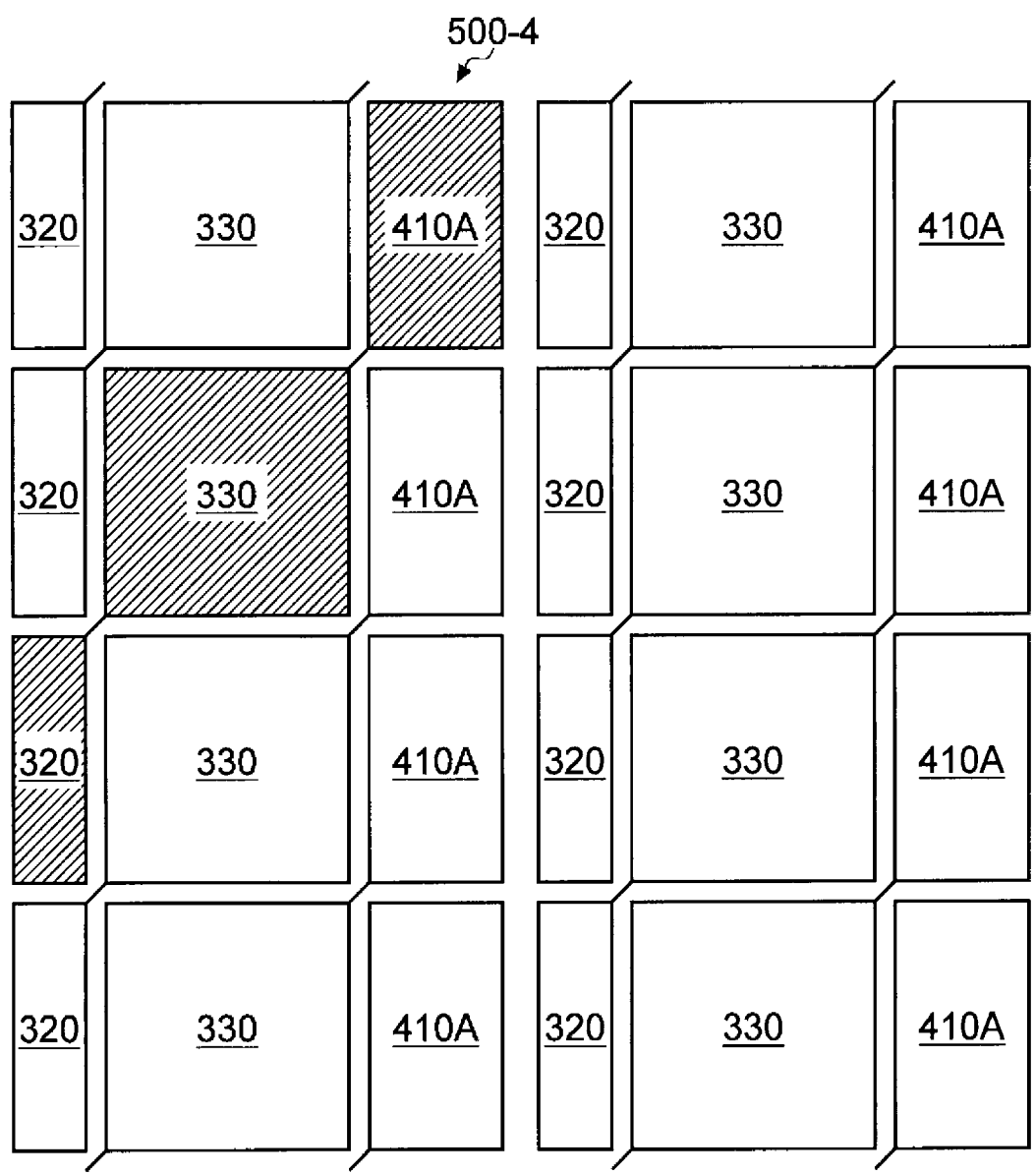
FIG. 20 is a schematic view illustrating a first array example of the upper layer circuit according to the fourth layout example of the first embodiment in the pixel array unit.

FIG. 20 is a schematic view illustrating a first array example in the pixel array unit of the upper layer circuit according to the fourth layout example. Furthermore, in FIG. 20, one among a plurality of the upper layer circuits 500-4 is hatched for clarification.

As illustrated in FIG. 20, in the first array example, for example, a plurality of the upper layer circuits 500-4 according to the fourth layout example are arranged so that the photoelectric conversion elements 333 are linearly arranged in a line in the column direction. When employing the array, it is possible to accommodate one piece of the pixel signal generation unit 320 and one piece of the upper layer detection circuit 410A in a region that is adjacent to each of the photoelectric conversion elements 333 in the right and left direction (row direction).

2.7.4.2 Second Array Example

Figure 21:
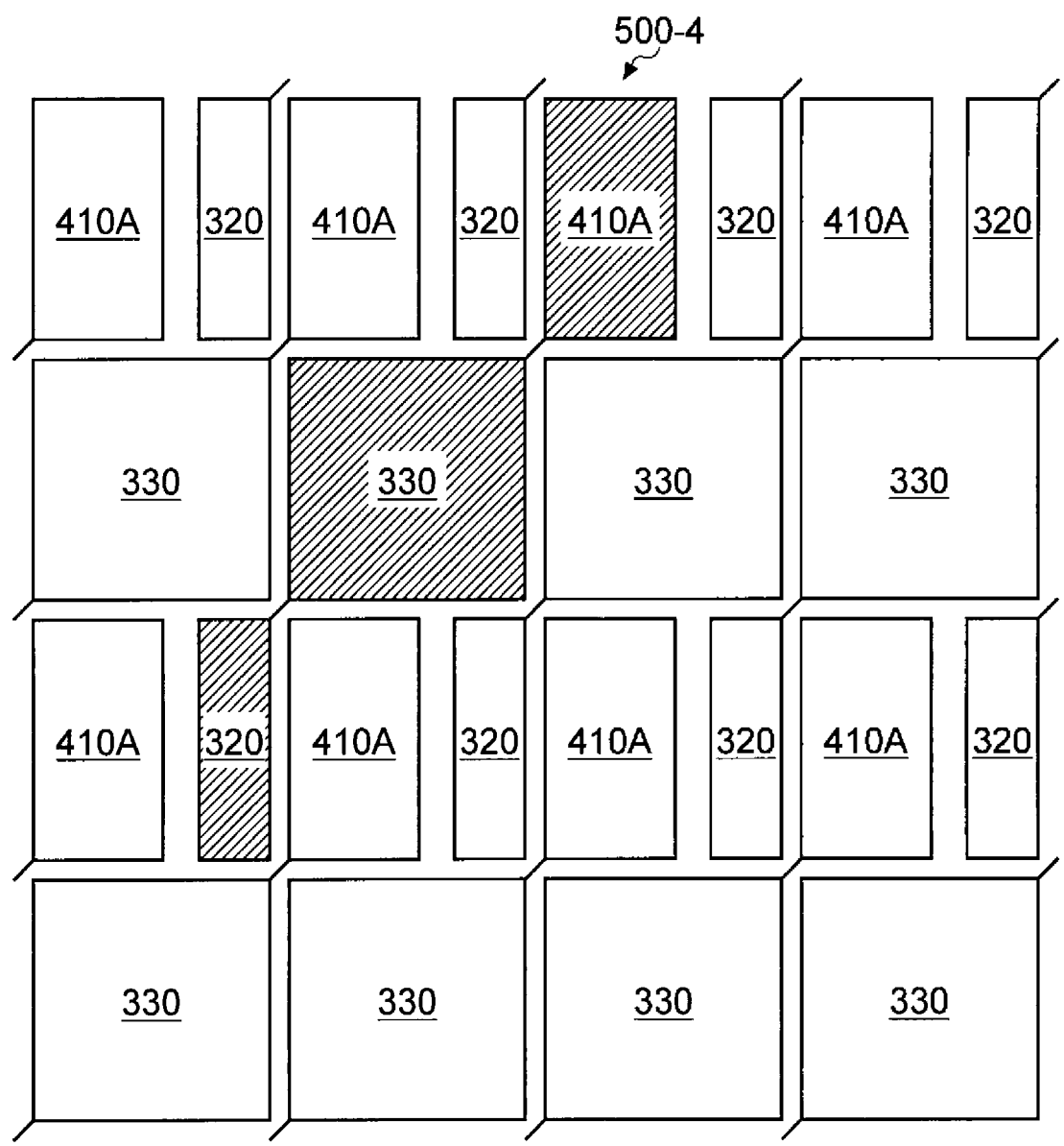
FIG. 21 is a schematic view illustrating the first array example of the upper layer circuit according to the fourth layout example of the first embodiment in the pixel array unit.

FIG. 21 is a schematic view illustrating a second array example in the pixel array unit of the upper layer circuit according to the fourth layout example. Furthermore, in FIG. 21, one among a plurality of the upper layer circuits 500-4 is hatched for clarification.

As illustrated in FIG. 21, in the second array example, for example, the upper layer circuits 500-4 according to the fourth layout example are arranged so that the photoelectric conversion elements 333 are linearly arranged in the row direction. When employing the array, it is possible to accommodate one piece of the pixel signal generation unit 320 and one piece of the upper layer detection circuit 410A in a region that is adjacent to each of the photoelectric conversion elements 333 in the upper and lower direction (column direction).

As described above, according to the fourth layout example, it is possible to accommodate one piece of the pixel signal generation unit 320 and one piece of the upper layer detection circuit 410A in a region that is adjacent to each of the photoelectric conversion elements 333 in the right and left direction (row direction) or the upper and lower direction (column direction), and thus it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

In addition, the upper layer circuits 500-4 are arranged so that the photoelectric conversion element 333 alternately exists in the right and left direction (row direction) or the upper and lower direction (column direction), and thus it is possible to interpolate a pixel value of a region in which the photoelectric conversion element 333 does not exist with a pixel value obtained by the photoelectric conversion element 333 at the periphery of the region. With this arrangement, it is possible to realize an event-driven type image sensor without deteriorating resolution of image data acquired by the solid-state imaging device 200.

The other configurations and effects may be similar to those in the above-described layout examples.

2.7.5 Fifth Layout Example

Figure 22:
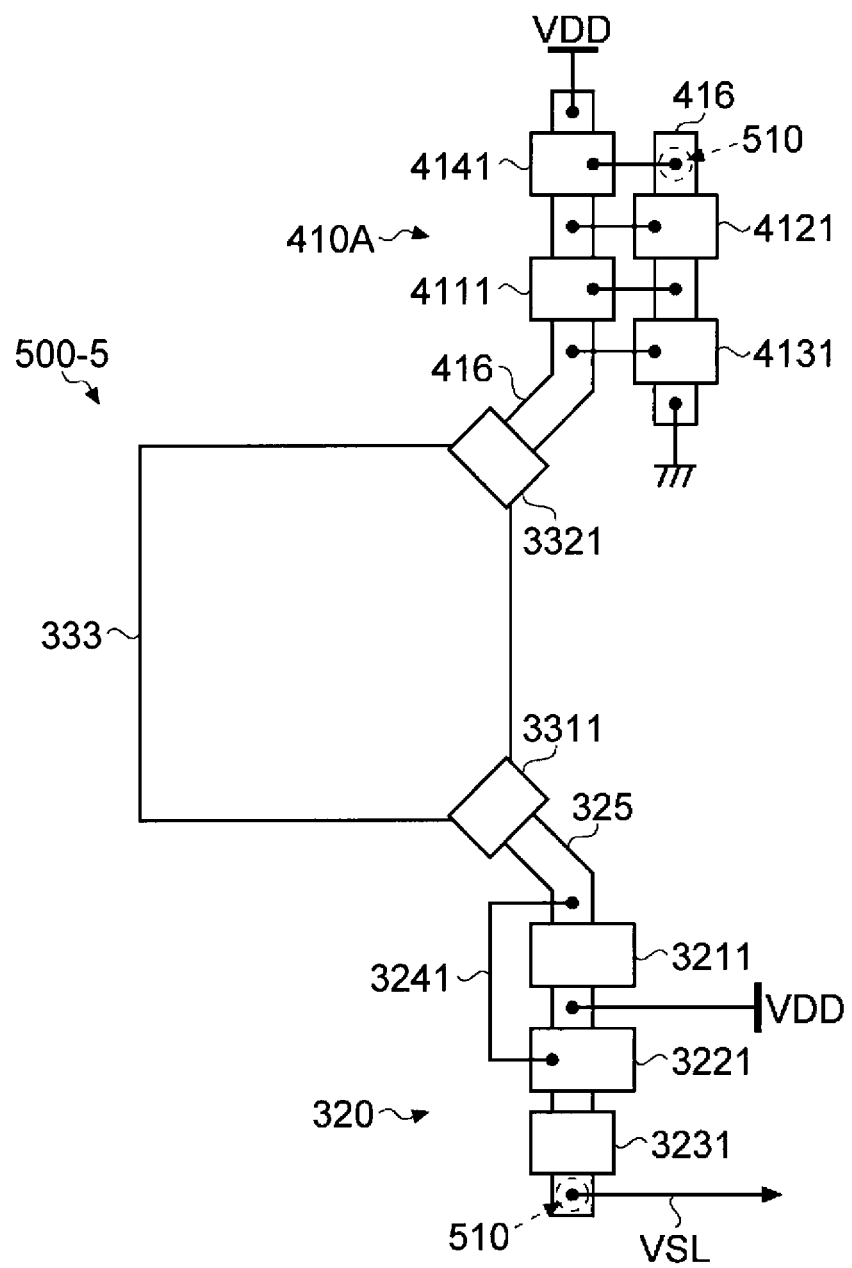
FIG. 22 is a top view illustrating a schematic configuration example of an upper layer circuit according to a fifth layout example of the first embodiment.

FIG. 22 is a top view illustrating a schematic configuration example of an upper layer circuit according to a fifth layout example. As illustrated in FIG. 22, in an upper layer circuit 500-5 according to the fifth layout example, in a similar manner as in the third layout example, the transmission gate 3311 and the OFG gate 3321 are respectively disposed at corner portions (for example, two corner portions on a right side in the drawing) which are adjacent to each other in the photoelectric conversion element 333.

The pixel signal generation unit 320 is disposed in a region that faces a corner portion at which the transmission gate 3311 is disposed, that is, a right obliquely downward region with respect to the region in which the photoelectric conversion element 333 is disposed in the example illustrated in FIG. 22. In the right obliquely downward region, the reset gate 3211, the amplification gate 3221, and the selection gate 3231 in the pixel signal generation unit 320 are linearly arranged in a line in parallel to the column direction.

On the other hand, the upper layer detection circuit 410A is disposed in a region that faces a corner portion at which the OFG gate 3321 is disposed, that is, a right obliquely upward region with respect to the region in which the photoelectric conversion element 333 is disposed in the example illustrated in FIG. 22. In the right obliquely upward region, the LG gates 4111 and 4141 in the upper layer detection circuit 410A are linearly arranged in a line in parallel to the column direction. In addition, the amplification gates 4121 and 4131 are arranged in parallel to the array of the LG gates 4111 and 4141.

For example, a size of the pixel signal generation unit 320 in the column direction is set to be approximately the same as or equal to or less than a size of the photoelectric conversion element 333 in the column direction. Similarly, for example, a size of the upper layer detection circuit 410A in the column direction is set to be approximately the same as or equal to or less than the size of the photoelectric conversion element 333 in the column direction.

2.7.5.1 Array Example

Figure 23:
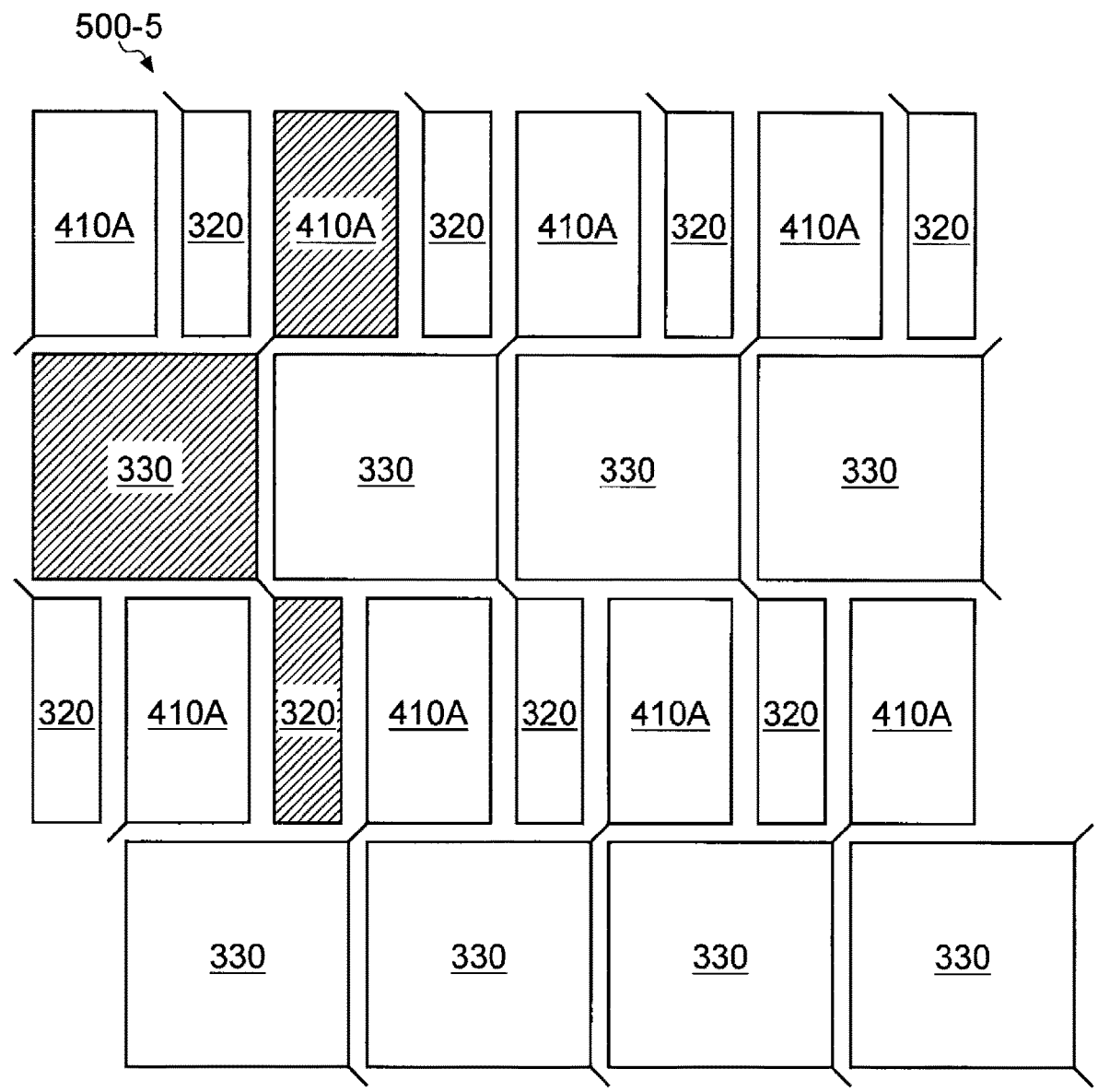
FIG. 23 is a schematic view illustrating an array example of the upper layer circuit according to the fifth layout example of the first embodiment in the pixel array unit.

FIG. 23 is a schematic view illustrating an array example of the upper layer circuit according to the fifth layout example in the pixel array unit. Furthermore, in FIG. 23, one among a plurality of the upper layer circuits 500-5 is hatched for clarification.

As illustrated in FIG. 23, for example, the upper layer circuits 500-5 according to the fifth layout example are arranged so that the photoelectric conversion elements 333 are linearly arranged in the row direction. When employing the array, it is possible to accommodate one piece of the pixel signal generation unit 320 and one piece of the upper layer detection circuit 410A in a region that is adjacent to each of the photoelectric conversion elements 333 in the upper and lower direction (column direction).

As described above, according to the fifth layout example, it is possible to accommodate one piece of the pixel signal generation unit 320 and one piece of the upper layer detection circuit 410A in a region that is adjacent to each of the photoelectric conversion elements 333 in the upper and lower direction (column direction), and thus it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

In addition, the upper layer circuits 500-5 are arranged so that the photoelectric conversion element 333 alternately exists in the upper and lower direction (column direction), and thus it is possible to interpolate a pixel value of a region in which the photoelectric conversion element 333 does not exist with a pixel value obtained by the photoelectric conversion element 333 at the periphery of the region. With this arrangement, it is possible to realize an event-driven type image sensor without deteriorating resolution of image data acquired by the solid-state imaging device 200.

The other configurations and effects may be similar to those in the above-described layout examples.

2.7.6 Sixth Layout Example

Figure 24:
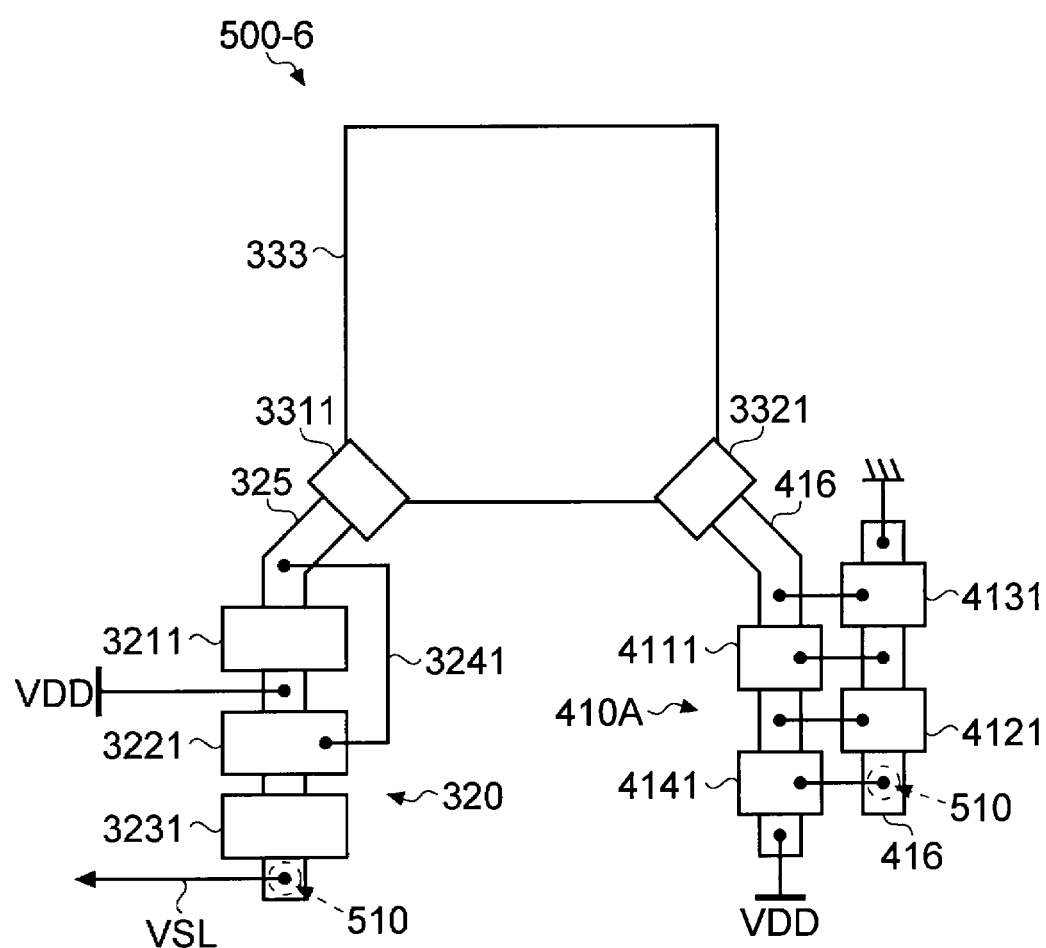
FIG. 24 is a top view illustrating a schematic configuration example of an upper layer circuit according to a sixth layout example of the first embodiment.

FIG. 24 is a top view illustrating a schematic configuration example of an upper layer circuit according to a sixth layout example. As illustrated in FIG. 24, in an upper layer circuit 500-6 according to the sixth layout example, in a similar manner as in the third layout example, the transmission gate 3311 and the OFG gate 3321 are respectively disposed at corner portions (for example, two corner portions on a lower side in the drawing) which are adjacent to each other in the photoelectric conversion element 333.

The pixel signal generation unit 320 is disposed in a region that faces a corner portion at which the transmission gate 3311 is disposed, that is, a left obliquely downward region with respect to the region in which the photoelectric conversion element 333 is disposed in the example illustrated in FIG. 24. In the left obliquely downward region, the reset gate 3211, the amplification gate 3221, and the selection gate 3231 in the pixel signal generation unit 320 are linearly arranged in a line in parallel to the column direction.

On the other hand, the upper layer detection circuit 410A is disposed in a region that faces a corner portion at which the OFG gate 3321 is disposed, that is, a right obliquely downward region with respect to the region in which the photoelectric conversion element 333 is disposed in the example illustrated in FIG. 24. In the right obliquely downward region, the LG gates 4111 and 4141 in the upper layer detection circuit 410A are linearly arranged in a line in parallel to the column direction. In addition, the amplification gates 4121 and 4131 are arranged in parallel to the array of the LG gates 4111 and 4141. In view of the above, it should be appreciated the FIG. 24 shows a first readout circuit 320 coupled to the photoelectric conversion region at a first location, and a second readout circuit 400 including a portion 410A coupled to the photoelectric conversion region at a second location. The second readout circuit 400 is configured to control the first readout circuit 320 in accordance with the operations described herein. As shown in FIG. 24, the first location and the second location are on a same side (also on a same half) of the photoelectric conversion region 333. As also shown, the first location and the second location are a same distance from a center of an edge of the photoelectric conversion region 333 that defines the side. For example, the first location is at a first corner of the photoelectric conversion region 333, and the second location is at a second corner of the photoelectric conversion region 333. As further shown, the first readout circuit 320 includes a first transistor having a first gate 3311 at the first location, and the second readout circuit 400 includes a second transistor having a second gate 3321 at the second location. The first readout circuit 320 includes a plurality of third transistors (with gates 3211, 3221, 3231) coupled to the first transistor 3311. The second readout circuit 400 includes a plurality of fourth transistors (with gates 4111, 4141, 4131, 4121) coupled to the second transistor 3321. A number of the plurality of fourth transistors is more than a number of the plurality of third transistors. The plurality of fourth transistors includes first and second sets of transistors arranged in a first direction, and the first set of transistors (with gates 4111 and 4141) is arranged adjacent to the second set of transistors (with gates 4131 and 4121) in a second direction that is perpendicular to the first direction. The second set of transistors are further away from the side of the photoelectric conversion region 333 than the first set of transistors. As shown, the plurality of third transistors (with gates 32111, 3221, 3231) are arranged in the first direction.

For example, a size of the pixel signal generation unit 320 in the column direction is set to be approximately the same as or equal to or less than a size of the photoelectric conversion element 333 in the column direction. Similarly, for example, a size of the upper layer detection circuit 410A in the column direction is set to be approximately the same as or equal to or less than the size of the photoelectric conversion element 333 in the column direction.

2.7.6.1 Array Example

Figure 25:
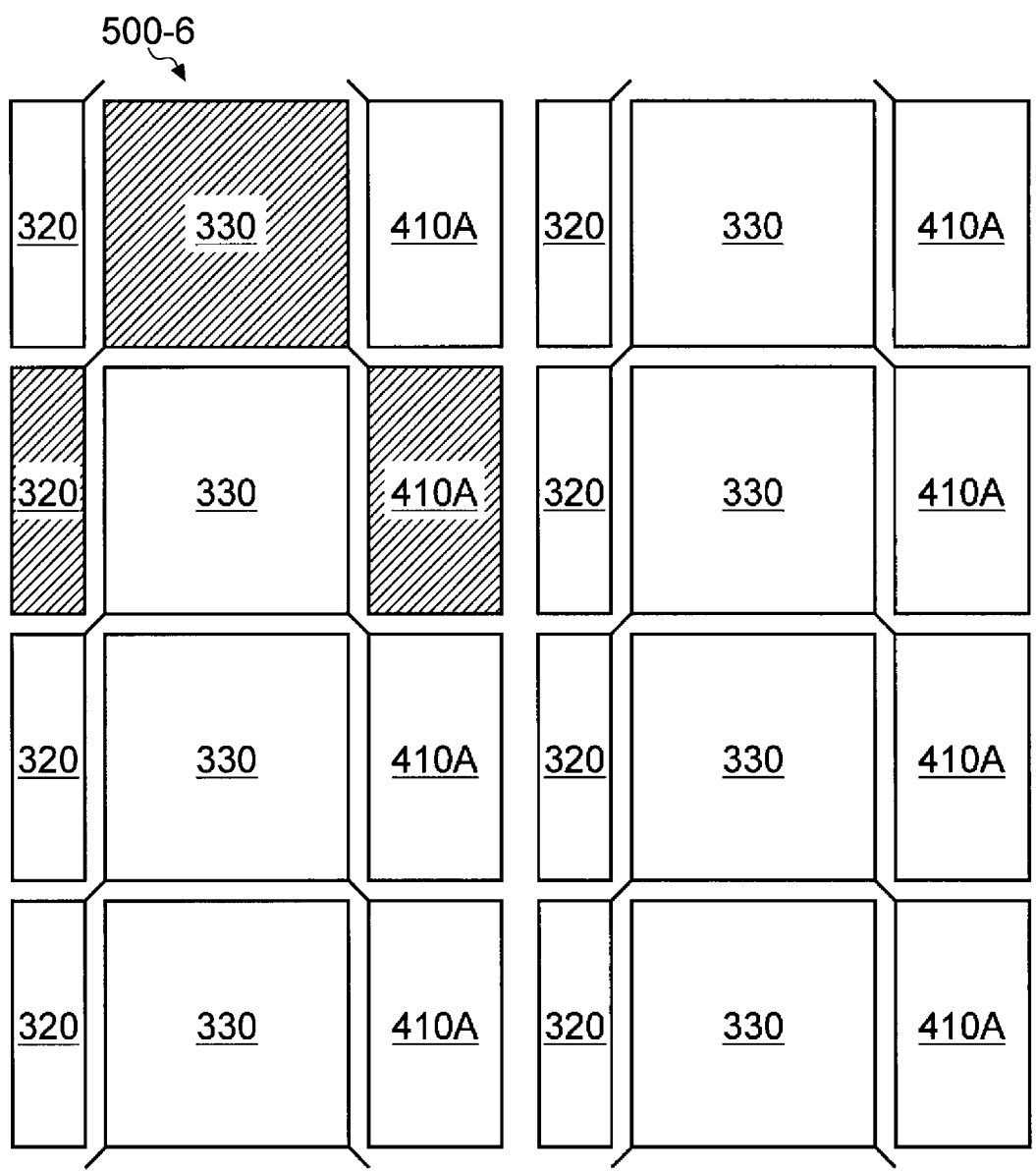
FIG. 25 is a schematic view illustrating an array example of the upper layer circuit according to the sixth layout example of the first embodiment in the pixel array unit.

FIG. 25 is a schematic view illustrating an array example of the upper layer circuit according to the sixth layout example in the pixel array unit. Furthermore, in FIG. 25, one among a plurality of the upper layer circuits 500-6 is hatched for clarification.

As illustrated in FIG. 25, for example, the upper layer circuits 500-6 according to the sixth layout example are arranged so that the photoelectric conversion elements 333 are linearly arranged in the column direction. When employing the array, it is possible to accommodate one piece of the pixel signal generation unit 320 and one piece of the upper layer detection circuit 410A in a region that is adjacent to each of the photoelectric conversion elements 333 in the right and left direction (row direction).

As described above, according to the sixth layout example, it is possible to accommodate one piece of the pixel signal generation unit 320 and one piece of the upper layer detection circuit 410A in a region that is adjacent to each of the photoelectric conversion elements 333 in the right and left direction (row direction), and thus it is possible to further reduce the occupation ratio of the pixel signal generation unit 320 and the upper layer detection circuit 410A on the light-receiving surface. With this arrangement, the occupation ratio of the photoelectric conversion element 333 increases, and thus it is possible to further improve the light-reception efficiency.

In addition, the upper layer circuits 500-6 are arranged so that the photoelectric conversion element 333 alternately exists in the upper and lower direction (column direction), and thus it is possible to interpolate a pixel value of a region in which the photoelectric conversion element 333 does not exist with a pixel value obtained by the photoelectric conversion element 333 at the periphery of the region. With this arrangement, it is possible to realize an event-driven type image sensor without deteriorating resolution of image data acquired by the solid-state imaging device 200.

The other configurations and effects may be similar to those in the above-described layout examples.

2.8 Operation and Effect

As described above, according to this embodiment, it is possible to reduce the occupation ratio of the pixel signal generation unit 320 and the upper layer detection circuit 410A on the light-receiving surface, and thus the occupation ratio of the photoelectric conversion element 333 increases. As a result, it is possible to improve light-reception efficiency.

In addition, it is possible to use an NMOS transistor as the respective transistors which constitute the pixel signal generation unit 320, and the respective transistors which constitute the upper layer detection circuit 410A. Accordingly, when disposing the transistors in the same light-receiving chip 201, it is possible to simplify a manufacturing process of the light-receiving chip 201.

In addition, a layout of the respective transistors which constitute the pixel signal generation unit 320, and a layout of the respective transistors which constitute the upper layer detection circuit 410A are similar to each other, and thus when the configurations are disposed in the same light-receiving chip 201, it is also possible to make a layout design of the light-receiving chip 201 easy.

In addition, it is possible to interpolate a pixel value of a region in which the photoelectric conversion element 333 does not exist with a pixel value obtained by the photoelectric conversion element 333 at the periphery of the region. With this arrangement, it is possible to realize an event-driven type image sensor without deteriorating resolution of image data acquired by the solid-state imaging device 200.

3. Second Embodiment

Next, a solid-state imaging device and an imaging device according to a second embodiment will be described in detail with reference to the accompanying drawing. Furthermore, in the following description, with regard to configurations similar to those in the above-described embodiment, the configurations will be cited, and redundant description thereof will be omitted.

For example, it is necessary for the capacity of the photoelectric conversion element 333 to be small in order for the address event to be ignited with sensitivity with respect to incident light. On the other hand, it is necessary for the capacity of the photoelectric conversion element 333 to be large to widen a dynamic range of an image that is acquired. Therefore, in this embodiment, the capacity of the photoelectric conversion element 333 is switched between a period of monitoring the address event ignition and a period of reading out a pixel signal.

For example, the imaging device and the solid-state imaging device according to this embodiment may be similar to the imaging device 100 and the solid-state imaging device 200 described in the first embodiment. However, in this embodiment, the unit pixel 310 is substituted with a unit pixel 610 as described later.

3.1 Configuration Example of Unit Pixel

Figure 26:
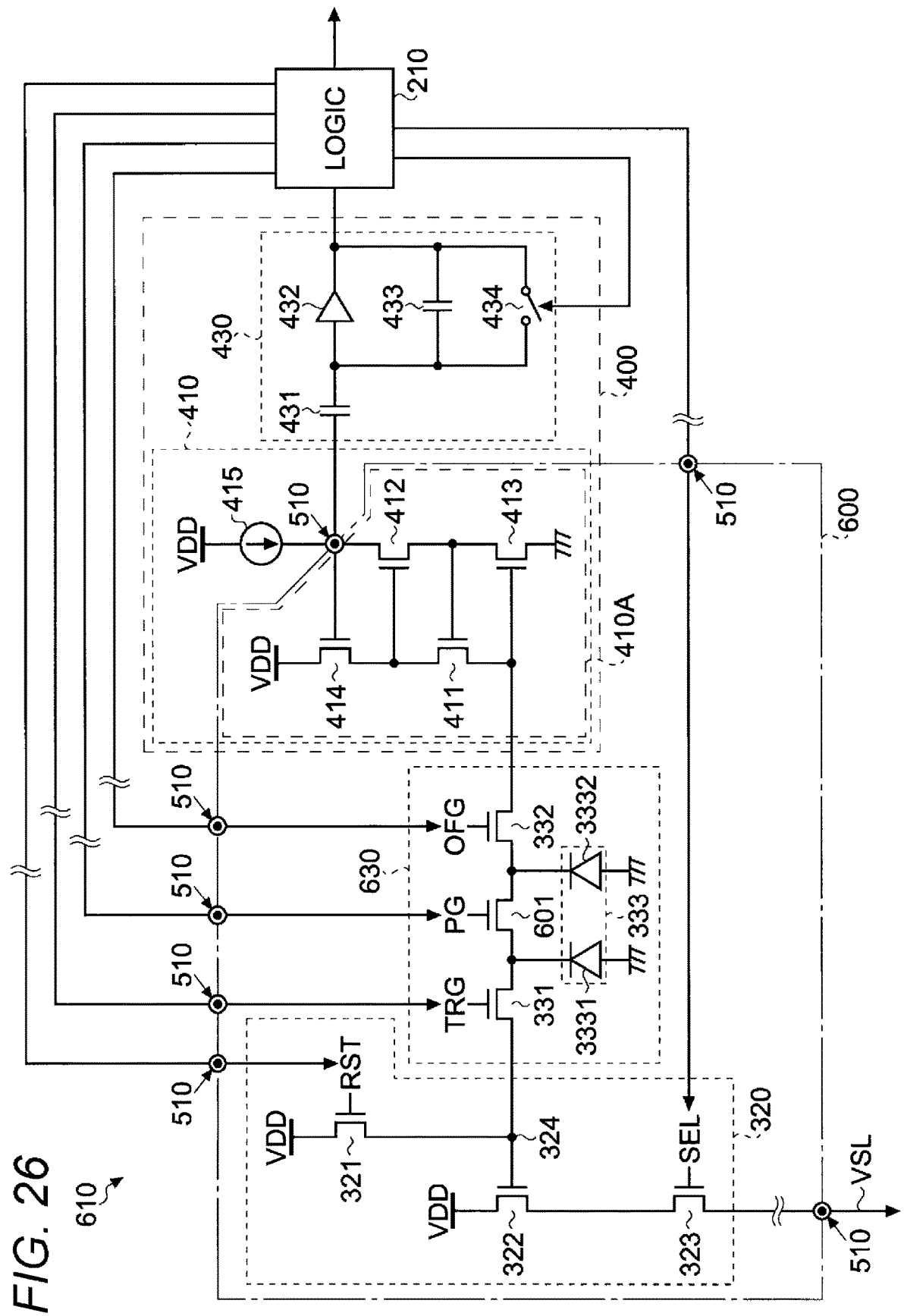
FIG. 26 is a circuit diagram illustrating a schematic configuration example of a unit pixel according to a second embodiment.

FIG. 26 is a circuit diagram illustrating a schematic configuration example of the unit pixel according to the second embodiment. As illustrated in FIG. 26, for example, the unit pixel 610 has a configuration similar to the configuration of the unit pixel 310 as illustrated in FIG. 5, and the light-receiving unit 330 is substituted with a light-receiving unit 630. Furthermore, in this embodiment, a reference numeral of the upper layer circuit is set to 600 for convenience of explanation.

In the light-receiving unit 630, a photoelectric conversion element 333 includes two photoelectric conversion elements 3331 and 3332. In addition, cathodes of the two photoelectric conversion elements 3331 and 3332 are connected to each other through a photogate 601.

A control signal PG is supplied to the photogate 601 from the drive circuit 211. When a high-level control signal PG is supplied from the drive circuit 211, the photogate 601 enters an ON-state. With this arrangement, the two photoelectric conversion elements 3331 and 3332 function as two photoelectric conversion elements.

The other configurations may be similar to the configurations in the unit pixel 310 according to the first embodiment.

3.2 Operation Example of Solid-State Imaging Device

Figure 27:
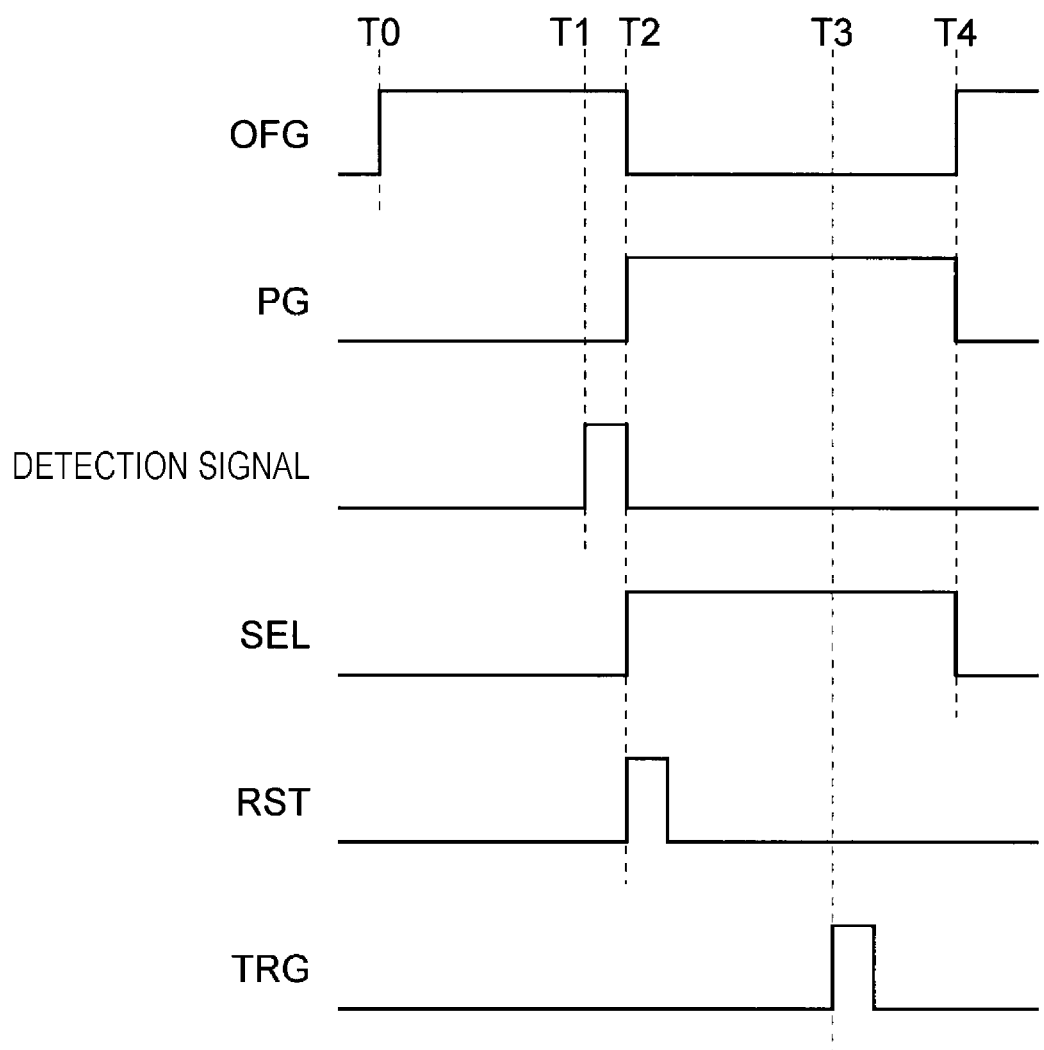
FIG. 27 is a timing chart illustrating an example of an operation of a solid-state imaging device according to the second embodiment.

Next, an operation of the solid-state imaging device 200 according to this embodiment will be described in detail with reference to the accompanying drawings. FIG. 27 is a timing chart illustrating an example of an operation of the solid-state imaging device according to the second embodiment. Furthermore, a flowchart may be similar to the flowchart illustrated in FIG. 10 in the first embodiment, and thus description thereof will be omitted here.

As illustrated in FIG. 27, in this embodiment, in a similar manner as in the operation described with reference to FIG. 9 in the first embodiment, at a timing T0, when an instruction for address event detection initiation is given by the control unit 130, the drive circuit 211 raises the control signal OFG applied to the gate of the OFG transistor 332 of all of the light-receiving units 630 in the pixel array unit 300 to a high level. With this arrangement, a plurality of the OFG transistors 332 of all of the light-receiving units 630 enter an ON-state.

On the other hand, the drive circuit 211 maintains a control signal PG that is applied to the photogate 601 of all of the light-receiving units 630 in the pixel array unit 300 to a low level. Accordingly, a photocurrent based on a charge generated in one photoelectric conversion element 3332 between the two photoelectric conversion elements 3331 and 3332 is supplied to each address event detection unit 400 from each of the light-receiving units 630.

Furthermore, during a period in which the control signal OFG is set to a high level, all transmission signals TRG that are applied to the gate of the transmission transistor 331 in each of the light-receiving units 630 are maintained to a low level, and thus during this period, a plurality of the transmission transistors 331 of all of the light-receiving units 630 enter an OFF-state.

Next, a case where the address event detection unit 400 of an arbitrary unit pixel 310 detects address event ignition in a period in which the control signal OFG is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal indicating a detection result of an ON event.

The drive circuit 211 to which a high-level detection signal is input from the address event detection unit 400 at the timing T1 lowers all control signals OFG to a low level at a subsequent timing T2. With this arrangement, supply of a photocurrent from all of the light-receiving units 630 of the pixel array unit 300 to the address event detection unit 400 is stopped.

On the other hand, at the timing T2, the drive circuit 211 raises the control signal PG that is applied to the photogate 601 in the light-receiving unit 630 of the unit pixel 610 in which the address event ignition is detected (hereinafter, referred to as "reading-out target unit pixel") to a high level. With this arrangement, in the light-receiving unit 630 in the reading-out target unit pixel 610, cathodes of the two photoelectric conversion elements 3331 and 3332 are connected to each other, and thus the two photoelectric conversion elements function as one photoelectric conversion element.

In addition, at the timing T2, the drive circuit 211 raises a selection signal SEL that is applied to a gate of the selection transistor 323 in the pixel signal generation unit 320 of the reading-out target unit pixel 610 to a high level, and raises a reset signal RST that is applied to a gate of the reset transistor 321 of the same pixel signal generation unit 320 to a high level for a constant pulse period, thereby discharging (initializing) charges accumulated in the floating diffusion layer 324 of the pixel signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the transmission transistor 331 of the light-receiving unit 630 in the reading-out target unit pixel 610. With this arrangement, a charge generated in the photoelectric conversion elements 3331 and 3332 of the light-receiving unit 630 is transmitted to the floating diffusion layer 324 in the pixel signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal (hereinafter, simply referred to as "signal level") of the light-receiving unit 630, and is converted into a digital value.

The signal processing unit 212 executes CDS processing in which a difference between the reset level and the signal level which are read out as described above is obtained as a net pixel signal corresponding to a total light-reception amount of the photoelectric conversion elements 3331 and 3332.

Next, at a timing T4, the drive circuit 211 lowers the selection signal SEL that is applied to the gate of the selection transistor 323 in the pixel signal generation unit 320 of the reading-out target unit pixel 610 and the control signal PG that is applied to the photogate 601 of the light-receiving unit 630 to a low level, and raises the control signal OFG that is applied to the gate of the OFG transistor 332 of all of the light-receiving units 630 in the pixel array unit 300 to a high level. With this arrangement, address event ignition detection in all of the light-receiving units 630 in the pixel array unit 300 is restarted.

As described above, during a period in which the control signal OFG that is applied to the gate of the OFG transistor 332 of all of the light-receiving units 630 is raised to a high level, and a plurality of the OFG transistors 332 of all of the light-receiving units 630 enter an ON-state, that is, during a period in which the address event ignition is monitored, the control signal PG that is applied to the photogate 601 of all of the light-receiving units 630 in the pixel array unit 300 is maintained to a low level, and a photoelectric conversion element that is used in monitoring of the address event ignition is set, for example, to the photoelectric conversion element 3332 of which a capacity is approximately the half of the capacity of the photoelectric conversion element 333. Accordingly, it is possible to detect address event ignition with sensitivity with respect to incident light.

In addition, when reading out a pixel signal from the unit pixel 610 in which the address event ignition is detected, the control signal PG that is applied to the photogate 601 in the light-receiving unit 630 of the reading-out target unit pixel 610 is raised to a high level, and thus it is possible to receive incident light with the two photoelectric conversion elements 3331 and 3332. Accordingly, it is possible to widen the dynamic range of an image that is acquired.

3.3 Layout Example of Unit Pixel

Next, with regard to a layout example in the light-receiving chip 201 of the upper layer circuit 600 in the unit pixel 610 according to this embodiment, several examples will be described.

3.3.1 First Layout Example

Figure 28:
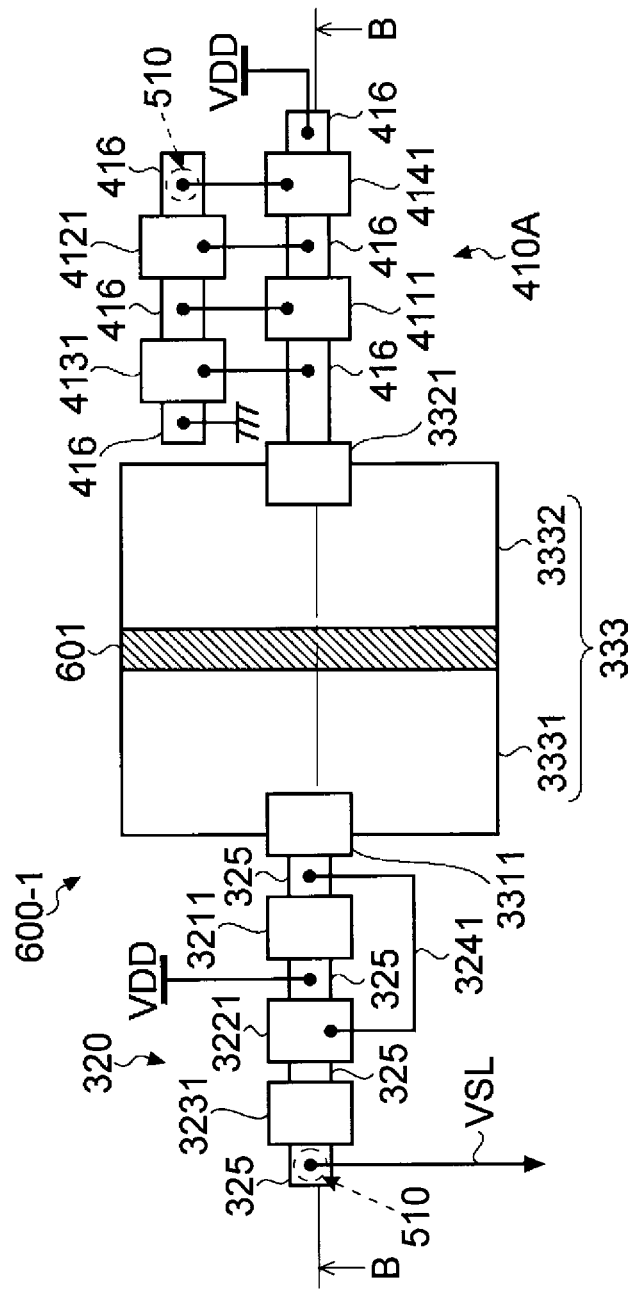
FIG. 28 is a top view illustrating a schematic configuration example of an upper layer circuit according to a first layout example of the second embodiment.

FIG. 28 is a top view illustrating a schematic configuration example of the upper layer circuit according to a first layout example. In addition, FIG. 29 is a cross-sectional view illustrating a schematic configuration example of plane B-B in FIG. 28.

Figure 29:
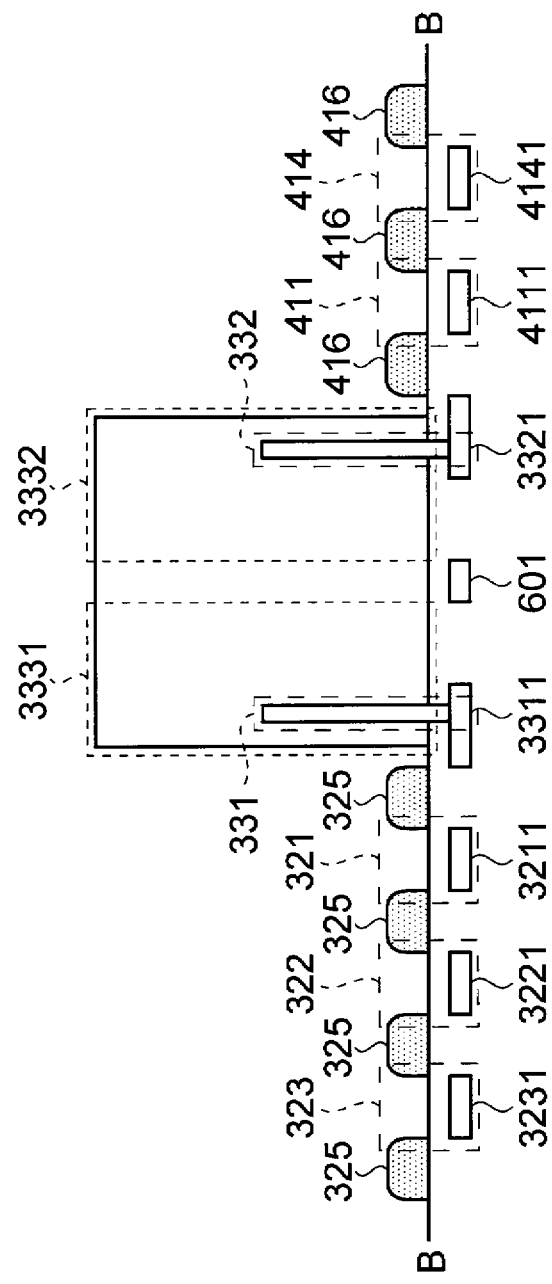
FIG. 29 is a cross-sectional view illustrating a schematic configuration example of a plane B-B in FIG. 28.

As illustrated in FIG. 28 and FIG. 29, in an upper layer circuit 600-1 according to the first layout example, for example, in a configuration similar to the configuration of the upper layer circuit 500-1 according to the first layout example described by using FIG. 11 and FIG. 12 in the first embodiment, the transmission gate 3311 is disposed at approximately the center of a side that does not intersect the photogate 601 among four sides of the photoelectric conversion element 333, and the OFG gate 3321 is disposed at approximately the center of a side that is opposite to the side at which the transmission gate 3311 is provided.

Furthermore, the reset gate 3211 of the reset transistor 321, the amplification gate 3221 of the amplification transistor 322, and the selection gate 3231 of the selection transistor 323 in the pixel signal generation unit 320 are linearly arranged in a line in parallel to the row direction from the side at which the transmission gate 3311 is disposed.

Similarly, the LG gate 4111 of the LG transistor 411 and the LG gate 4141 of the LG transistor 414 in the upper layer detection circuit 410A are linearly arranged in a line in parallel to the row direction on a side opposite to the pixel signal generation unit 320 from the side at which the OFG gate 3321 is disposed. In addition, the amplification gate 4121 of the amplification transistor 412 and the amplification gate 4131 of the amplification transistor 413 are arranged in parallel to the array of the LG gates 4111 and 4141. Furthermore, in FIG. 29, the amplification transistors 412 and 413 are omitted due to a cross-sectional position relationship.

In the configuration, the photogate 601 is disposed in the photoelectric conversion element 333 in such a manner that the region in which the N-type dopant is diffused is divided into two regions including a region including the side at which the transmission gate 3311 is provided, and a region including the side at which the OFG gate 3321 is provided.

The other configurations are similar to the configurations of the upper layer circuit 500-1 described by using FIG. 11 and FIG. 12 in the first embodiment, and thus detailed description thereof will be omitted here.

3.3.1.1 with Regard to Potential of Photoelectric Conversion Element

Figure 30:
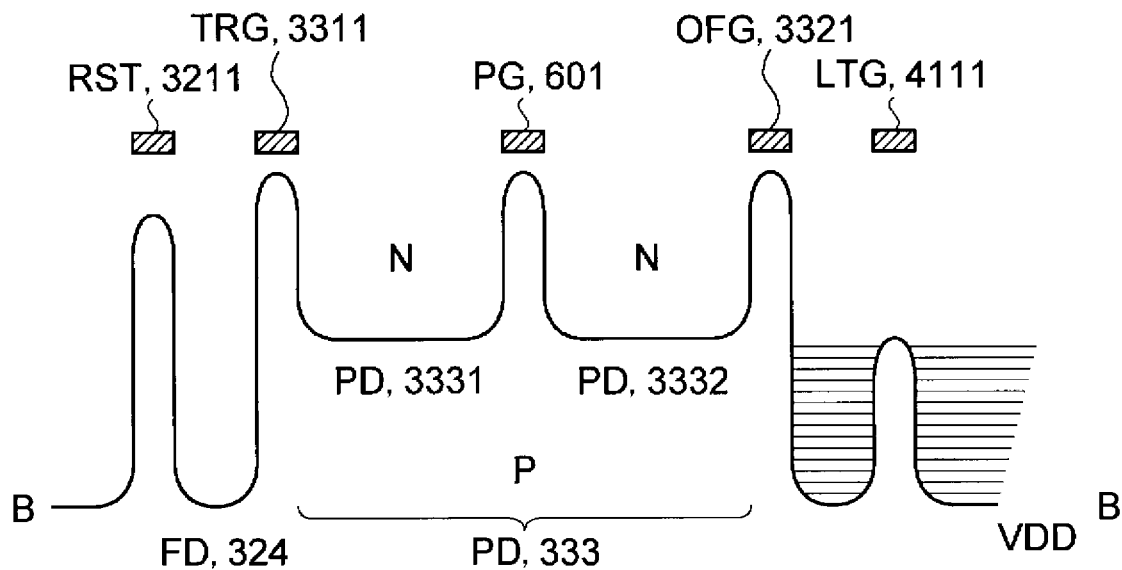
FIG. 30 is a band diagram illustrating a potential of a photoelectric conversion element according to the second embodiment (OFF state).
Figure 31:
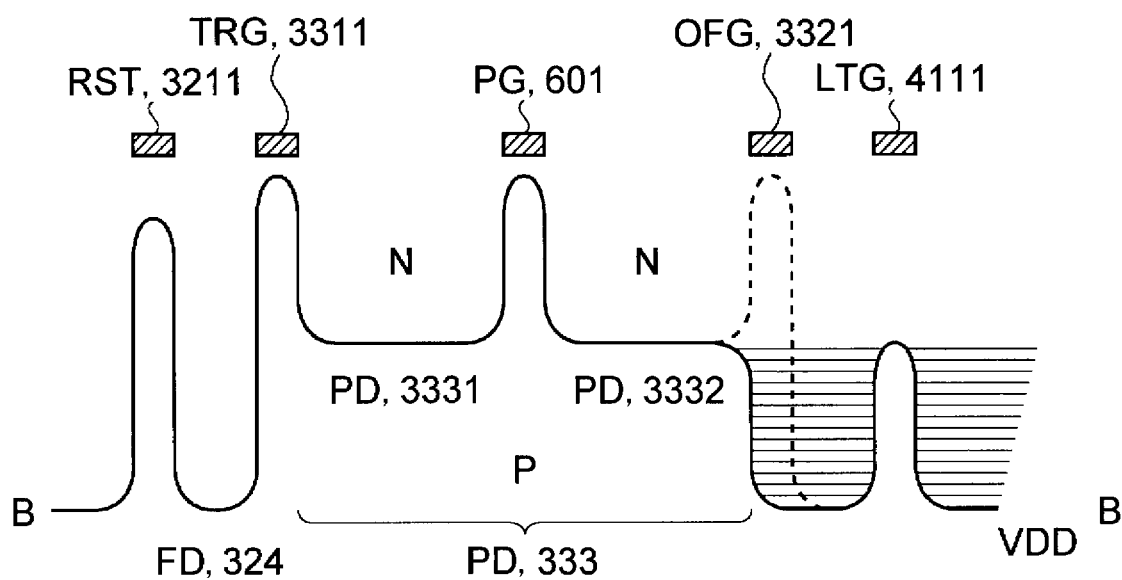
FIG. 31 is a band diagram illustrating the potential of the photoelectric conversion element according to the second embodiment (monitoring state).
Figure 32:
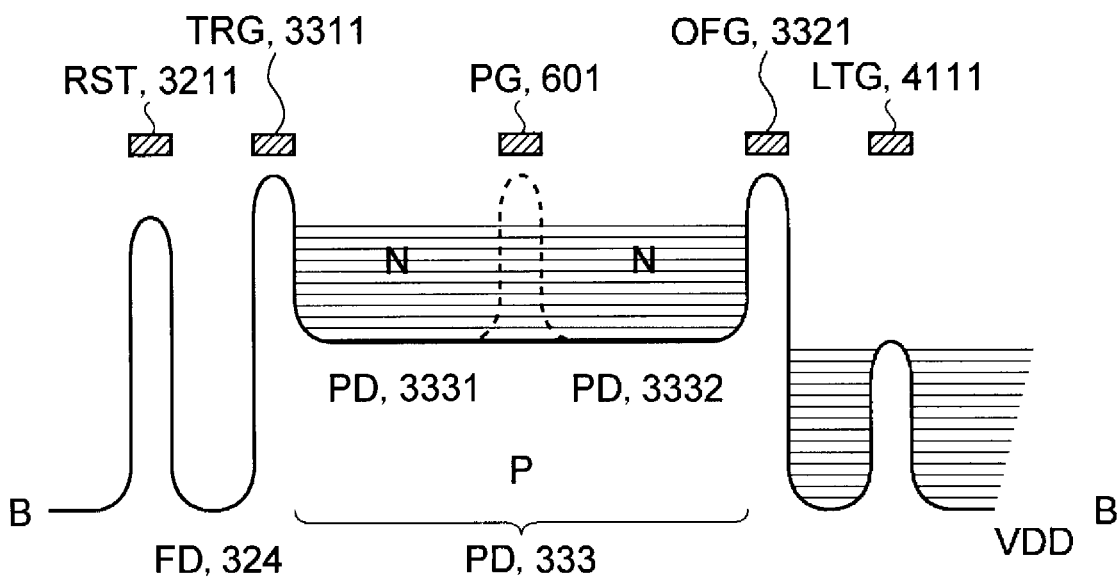
FIG. 32 is a band diagram illustrating the potential of the photoelectric conversion element according to the second embodiment (accumulation state).

FIG. 30 to FIG. 32 are band diagrams illustrating a potential of the photoelectric conversion element according to the second embodiment. Furthermore, FIG. 30 illustrates a potential when the transmission transistor 331 and the OFG transistor 332 of the light-receiving unit 630 are set to an OFF-state, that is, in a state in which the drive circuit 211 does not drive the unit pixel 610. FIG. 31 illustrates a potential when the transmission transistor 331 of the light-receiving unit 630 is set to an OFF-state, and the OFG transistor 332 is set to an ON-state, that is, in a state in which the address event ignition is being monitored. FIG. 32 illustrates a potential when the photogate 601 is set to an ON-state, that is, in a state in which charges are accumulated by using the two photoelectric conversion elements 3331 and 3332.

As illustrated in FIG. 30, in a state in which the drive circuit 211 does not drive the unit pixel 610, the photoelectric conversion element 333 is divided by the two photoelectric conversion elements 3331 and 3332 by a potential wall under the photogate 601. Accordingly, when the OFG transistor 332 is set to an ON-state from the state in FIG. 30, as illustrated in FIG. 31, a photocurrent based on a charge generated in the photoelectric conversion element 3332 on one side flows to the LG transistor 411.

In addition, as illustrated in FIG. 32, in a case where the photogate 601 is set to an ON-state, the potential wall that divides the photoelectric conversion element 333 into the two photoelectric conversion elements 3331 and 3332 disappears, and thus one piece of the photoelectric conversion element 333 appears. Accordingly, in a case where the transmission transistor 331 is set to an ON-state, charges generated at the entirety of the photoelectric conversion element 333 are transmitted to the floating diffusion layer 324.

3.3.2 Second Layout Example

Figure 33:
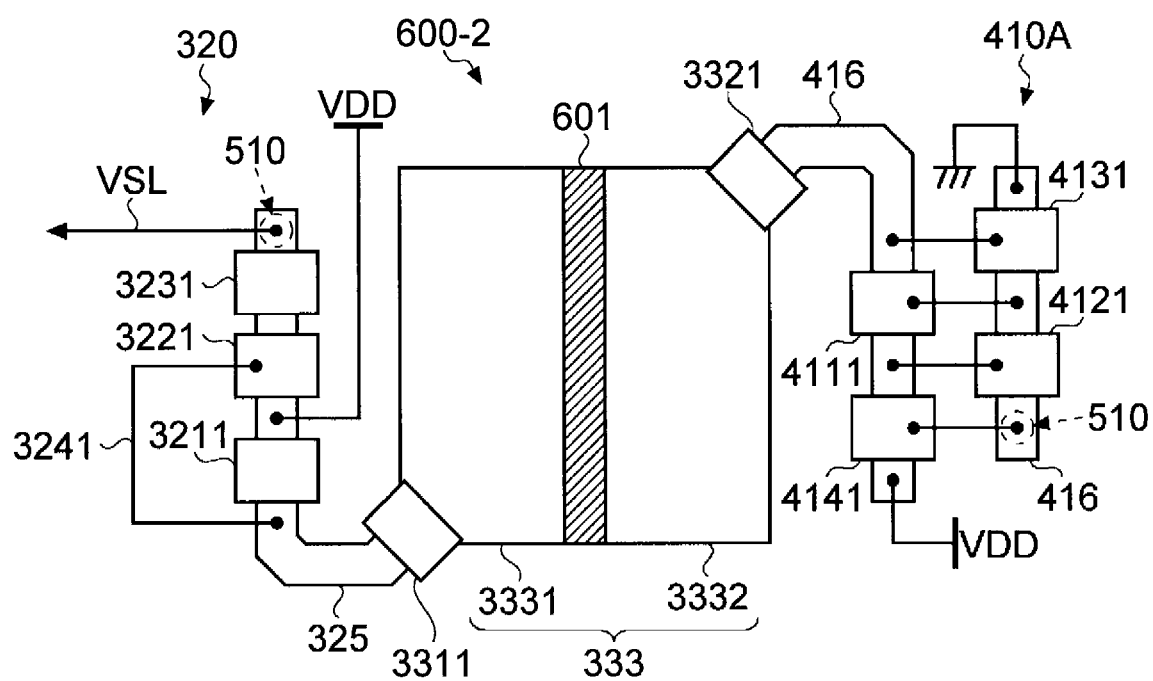
FIG. 33 is a top view illustrating a schematic configuration example of an upper layer circuit according to a second layout example of the second embodiment.

FIG. 33 is a top view illustrating a schematic configuration example of the upper layer circuit according to a second layout example. As in an upper layer circuit 600-2 illustrated in FIG. 33, for example, the photogate 601 according to this embodiment is also applicable to the upper layer circuit 500-2 according to the second layout example described by using FIG. 15 in the first embodiment.

3.3.3 Third Layout Example

Figure 34:
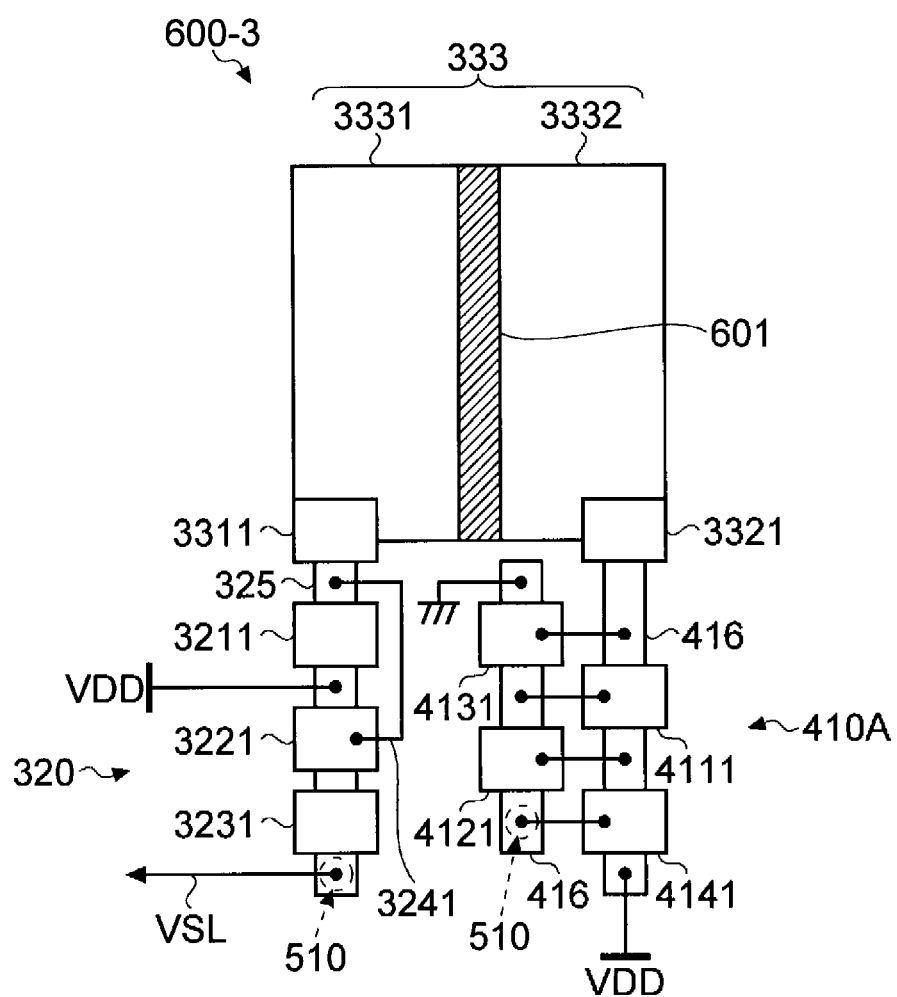
FIG. 34 is a top view illustrating a schematic configuration example of an upper layer circuit according to a third layout example of the second embodiment.

FIG. 34 is a top view illustrating a schematic configuration example of the upper layer circuit according to a third layout example. As in an upper layer circuit 600-3 illustrated in FIG. 34, for example, the photogate 601 according to this embodiment is also applicable to the upper layer circuit 500-3 according to the third layout example described by using FIG. 17 in the first embodiment.

3.3.3.1 Modification Example

Figure 35:
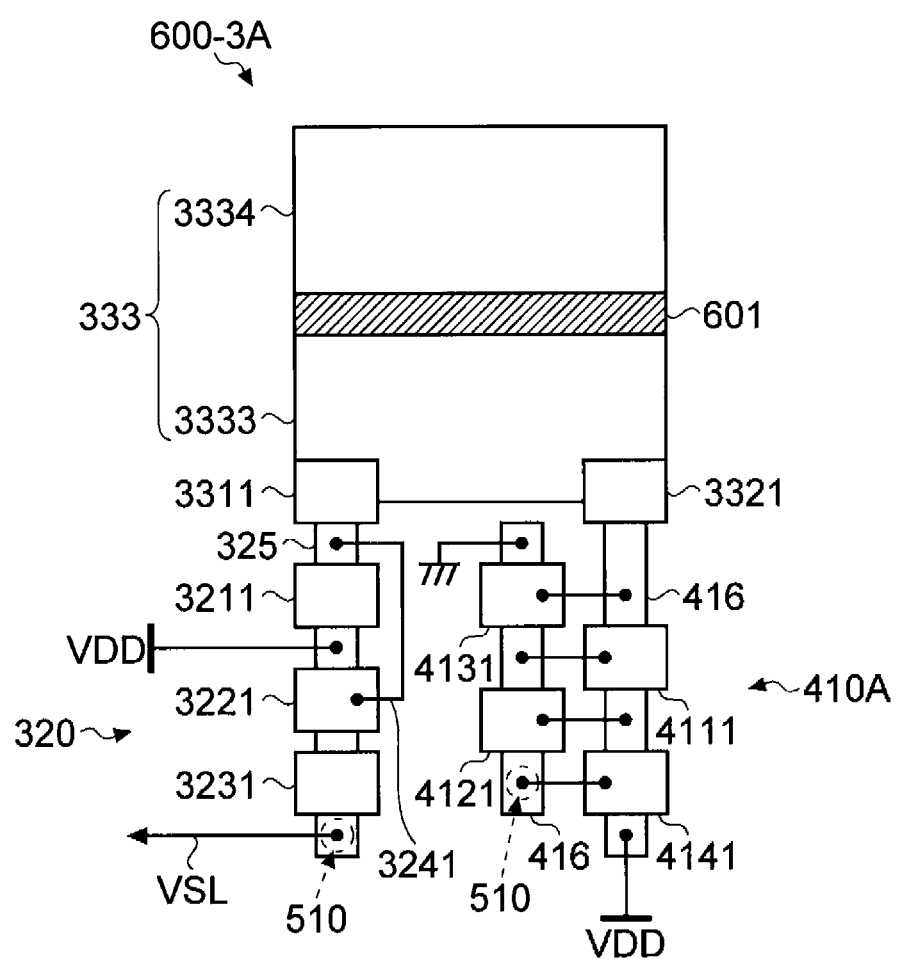
FIG. 35 is a top view illustrating a schematic configuration example of an upper layer circuit according to a modification example of the third layout example of the second embodiment.

Furthermore, as in the third layout example, in a case where the transmission gate 3311 and the OFG gate 3321 are respectively disposed at corner portions adjacent to each other in the photoelectric conversion element 333, as in an upper layer circuit 600-3A illustrated in FIG. 35, the photoelectric conversion element 333 can also be divided into a region in which both of the transmission gate 3311 and the OFG gate 3321 are provided, and a region that does not include the transmission gate 3311 and the OFG gate 3321.

3.3.4 Fourth Layout Example

Figure 36:
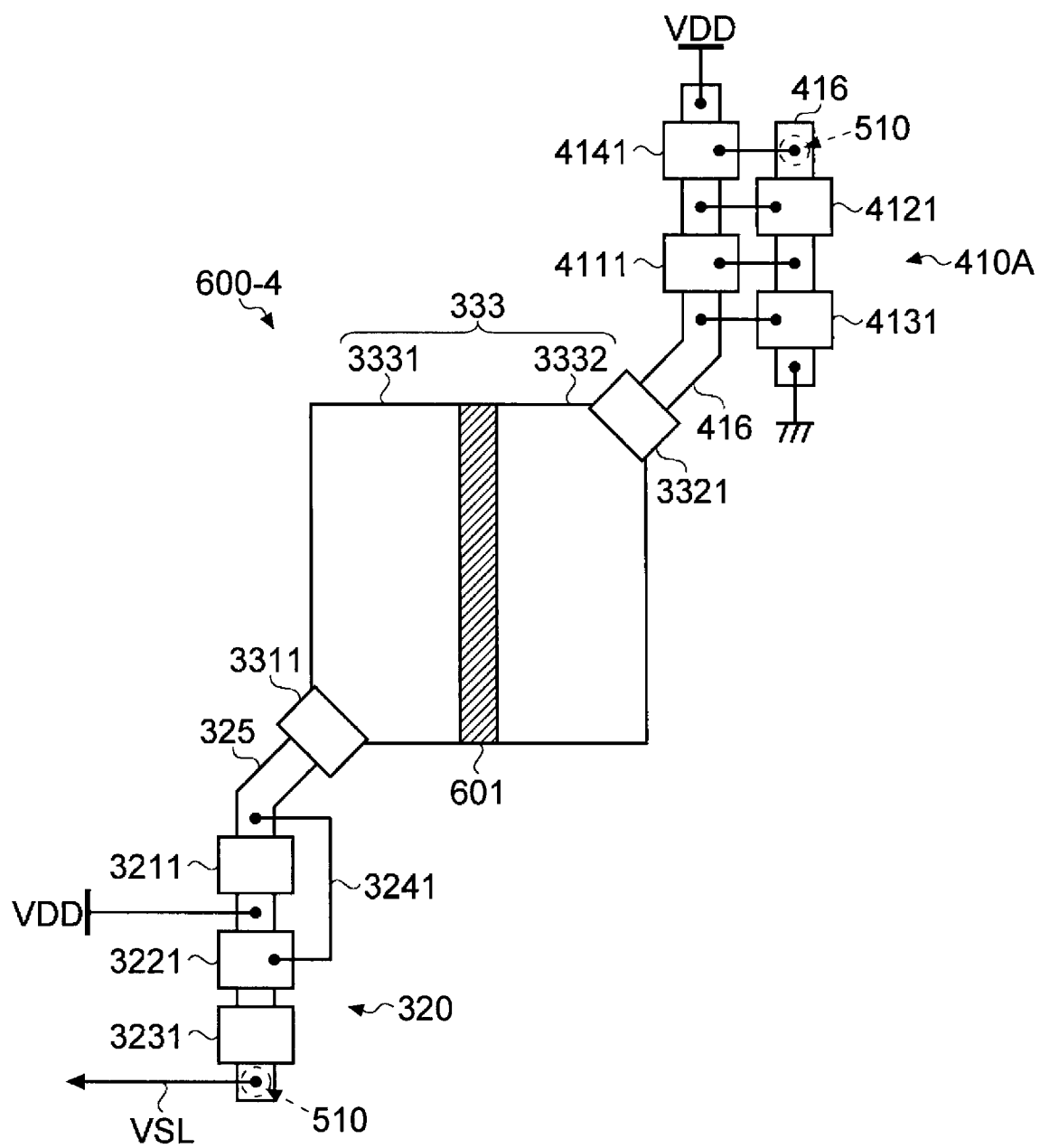
FIG. 36 is a top view illustrating a schematic configuration example of an upper layer circuit according to a fourth layout example of the second embodiment.

FIG. 36 is a top view illustrating a schematic configuration example of the upper layer circuit according to a fourth layout example. As in an upper layer circuit 600-4 illustrated in FIG. 36, for example, the photogate 601 according to this embodiment is also applicable to the upper layer circuit 500-4 according to the fourth layout example described by using FIG. 19 in the first embodiment.

3.3.5 Fifth Layout Example

Figure 37:
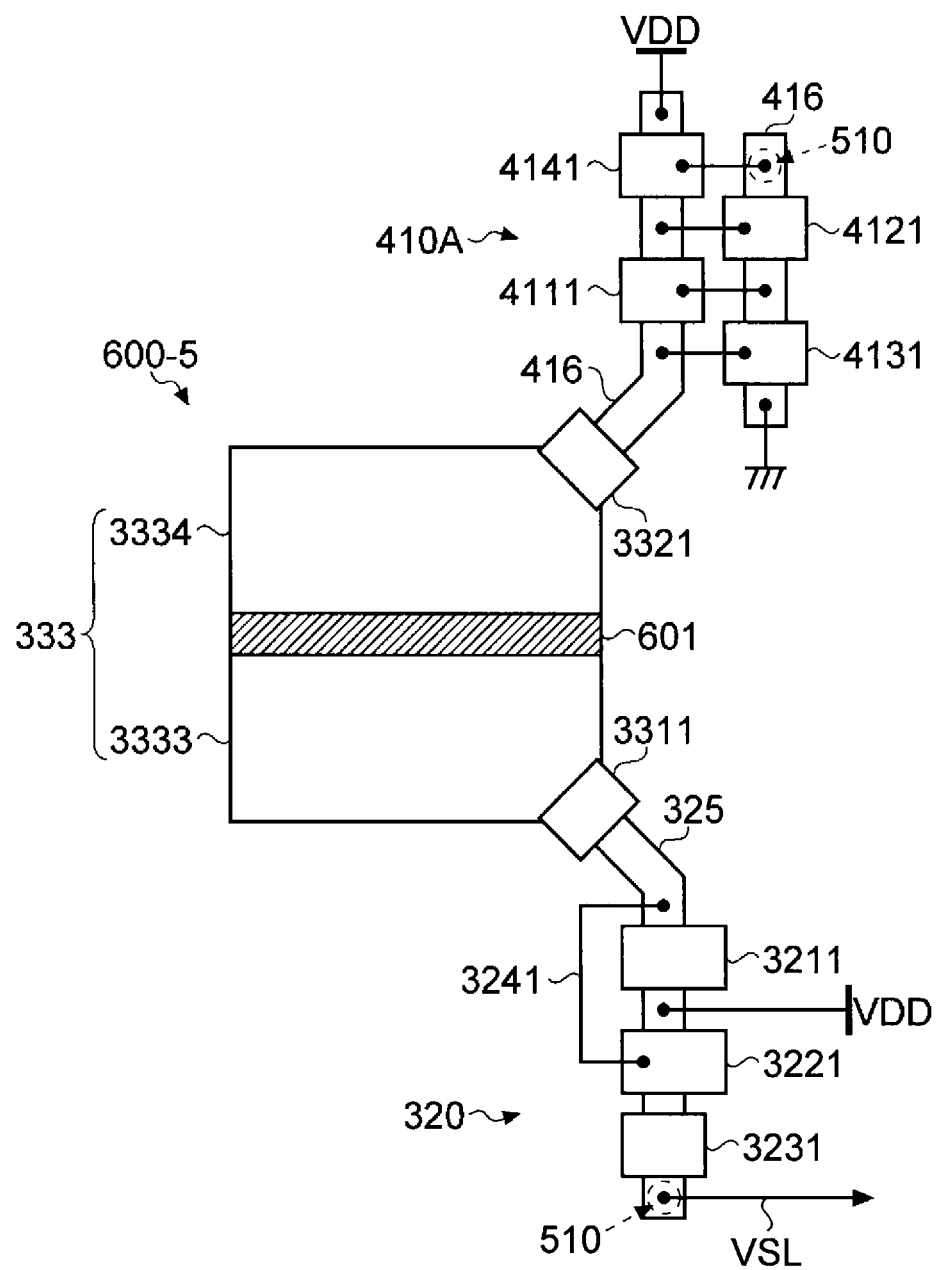
FIG. 37 is a top view illustrating a schematic configuration example of an upper layer circuit according to a fifth layout example of the second embodiment.

FIG. 37 is a top view illustrating a schematic configuration example of the upper layer circuit according to a fifth layout example. As in an upper layer circuit 600-5 illustrated in FIG. 37, for example, the photogate 601 according to this embodiment is also applicable to the upper layer circuit 500-5 according to the fifth layout example described by using FIG. 22 in the first embodiment.

Furthermore, in the fifth layout example, since the transmission gate 3311 and the OFG gate 3321 are respectively disposed at corner portions adjacent to each other in the photoelectric conversion element 333, in a similar manner as in the third layout example, the photoelectric conversion element 333 can also be divided into a region in which both of the transmission gate 3311 and the OFG gate 3321 are provided, and a region that does not include the transmission gate 3311 and the OFG gate 3321.

3.3.6 Sixth Layout Example

Figure 38:
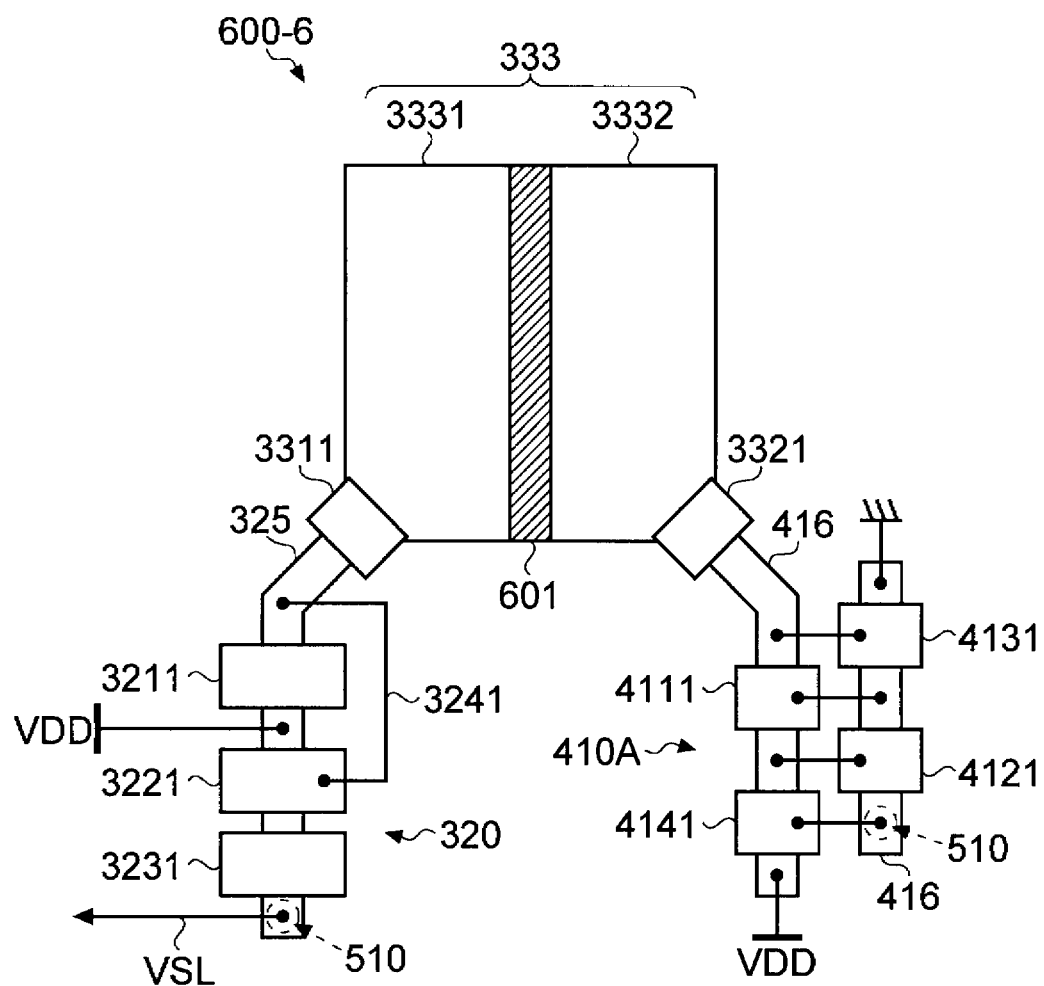
FIG. 38 is a top view illustrating a schematic configuration example of an upper layer circuit according to a sixth layout example of the second embodiment.

FIG. 38 is a top view illustrating a schematic configuration example of the upper layer circuit according to a sixth layout example. As in an upper layer circuit 600-6 illustrated in FIG. 38, for example, the photogate 601 according to this embodiment is also applicable to the upper layer circuit 500-6 according to the sixth layout example described by using FIG. 24 in the first embodiment. FIG. 38 shows a photogate 601 that divides a respective photoelectric conversion region 333 into a first portion 3331 and a second portion 3332. In this example, the photogate 601 is located in a central region of the photoelectric conversion region 333.

Furthermore, in the sixth layout example, since the transmission gate 3311 and the OFG gate 3321 are respectively disposed at corner portions adjacent to each other in the photoelectric conversion element 333, in a similar manner as in the third layout example, the photoelectric conversion element 333 can also be divided into a region in which both of the transmission gate 3311 and the OFG gate 3321 are provided, and a region that does not include the transmission gate 3311 and the OFG gate 3321.

3.4 Operation and Effect

As described above, according to this embodiment, during a period in which the address event ignition is monitored, the control signal PG that is applied to the photogate 601 of all of the light-receiving units 630 in the pixel array unit 300 is maintained to a low level, and a photoelectric conversion element that is used in monitoring of the address event ignition is set, for example, to the photoelectric conversion element 3332 of which a capacity is approximately the half of the capacity of the photoelectric conversion element 333. Accordingly, it is possible to detect address event ignition with sensitivity with respect to incident light.

In addition, when reading out a pixel signal from the unit pixel 610 in which the address event ignition is detected, the control signal PG that is applied to the photogate 601 in the light-receiving unit 630 of the reading-out target unit pixel 610 is raised to a high level, and thus it is possible to receive incident light with the two photoelectric conversion elements 3331 and 3332. Accordingly, it is possible to widen the dynamic range of an image that is acquired.

The other configurations, operations, and effects are similar to those in the first embodiment, and thus detailed description thereof will be omitted here.

4. Third Embodiment

Next, a solid-state imaging device and an imaging device according to a third embodiment will be described in detail with reference to the accompanying drawings. Furthermore, in the following description, with regard to configurations similar to those in the above-described embodiments, the configurations will be cited, and redundant description thereof will be omitted.

In the second embodiment, description has been given of a case where the photoelectric conversion element 333 is divided into two photoelectric conversion elements 3331 and 3332 by providing the photogate 601. In contrast, in the third embodiment, a photoelectric conversion element of which a capacity is substantially variable is used instead of the photoelectric conversion element 333 with a fixed capacity.

An imaging device and a solid-state imaging device according to this embodiment may be similar to, for example, the imaging device 100 and the solid-state imaging device 200 described in the first embodiment. However, in this embodiment, the unit pixel 310 is substituted with a unit pixel 710 as described later.

In addition, an operation of the solid-state imaging device 200 according to this embodiment is similar to, for example, the operation described by using FIG. 9 and FIG. 10 in the first embodiment.

4.1 Configuration Example of Unit Pixel

Figure 39:
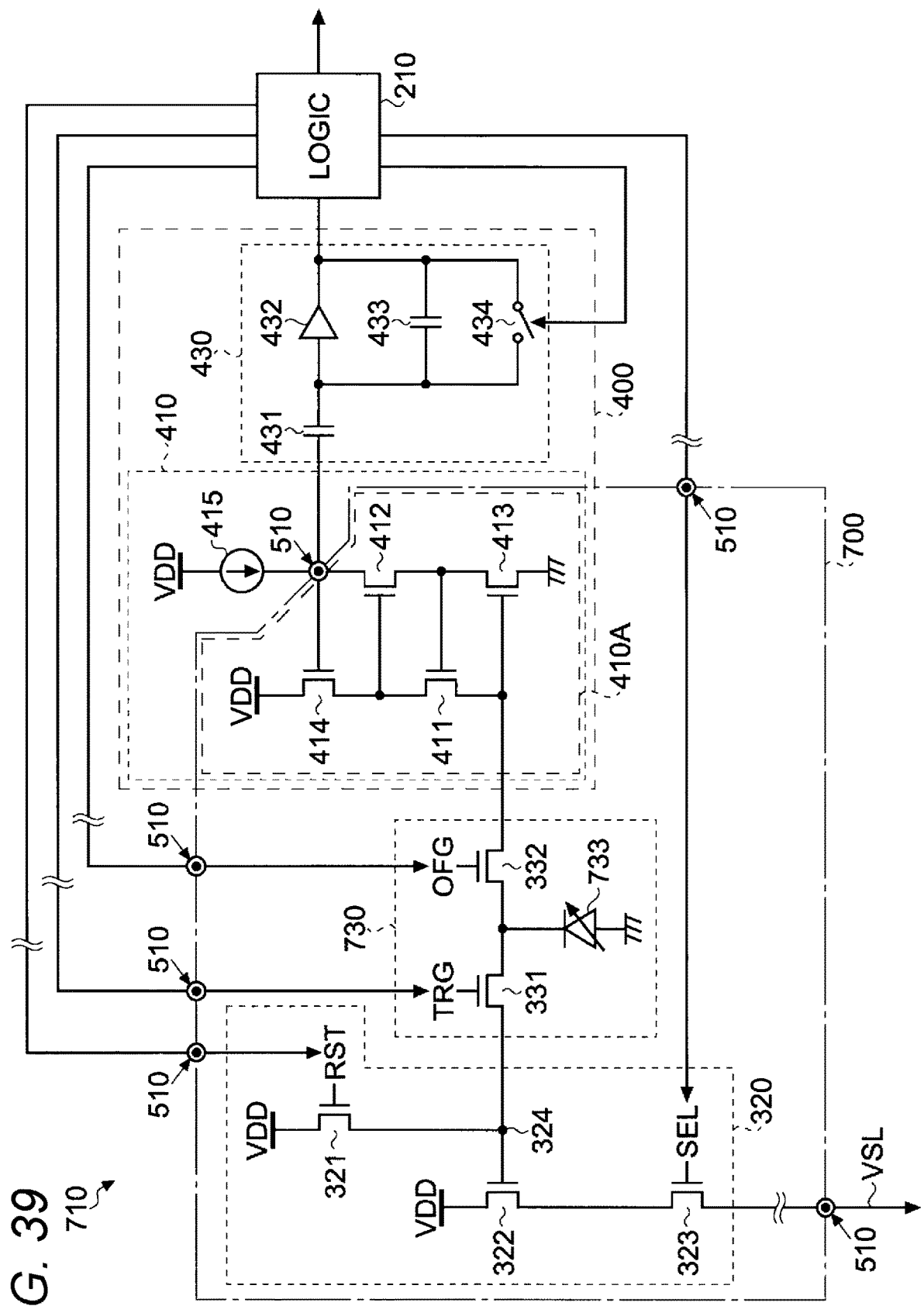
FIG. 39 is a circuit diagram illustrating a schematic configuration example of a unit pixel according to a third embodiment.

FIG. 39 is a circuit diagram illustrating a schematic configuration example of the unit pixel according to the third embodiment. As illustrated in FIG. 39, for example, the unit pixel 710 has a configuration similar to the configuration of the unit pixel 310 as illustrated in FIG. 5, and the light-receiving unit 330 is substituted with a light-receiving unit 730. Furthermore, in this embodiment, a reference numeral of the upper layer circuit is set to 700 for convenience of explanation.

The light-receiving unit 730 includes a photoelectric conversion element 733 of which a capacity is variable instead of the photoelectric conversion element 333. For example, the photoelectric conversion element 733 supplies a photocurrent based on a charge generated through light-reception at a first capacity to the OFG transistor 332, and supplies a charge generated through light-reception at a second capacity greater than the first capacity to the transmission transistor 331.

The other configurations may be similar to the configurations in the unit pixel 310 according to the first embodiment.

4.2 Layout Example of Unit Pixel

Next, with regard to a layout example in the light-receiving chip 201 of the upper layer circuit 700 in the unit pixel 710 according to this embodiment, several examples will be described.

4.2.1 First Layout Example

Figure 40:
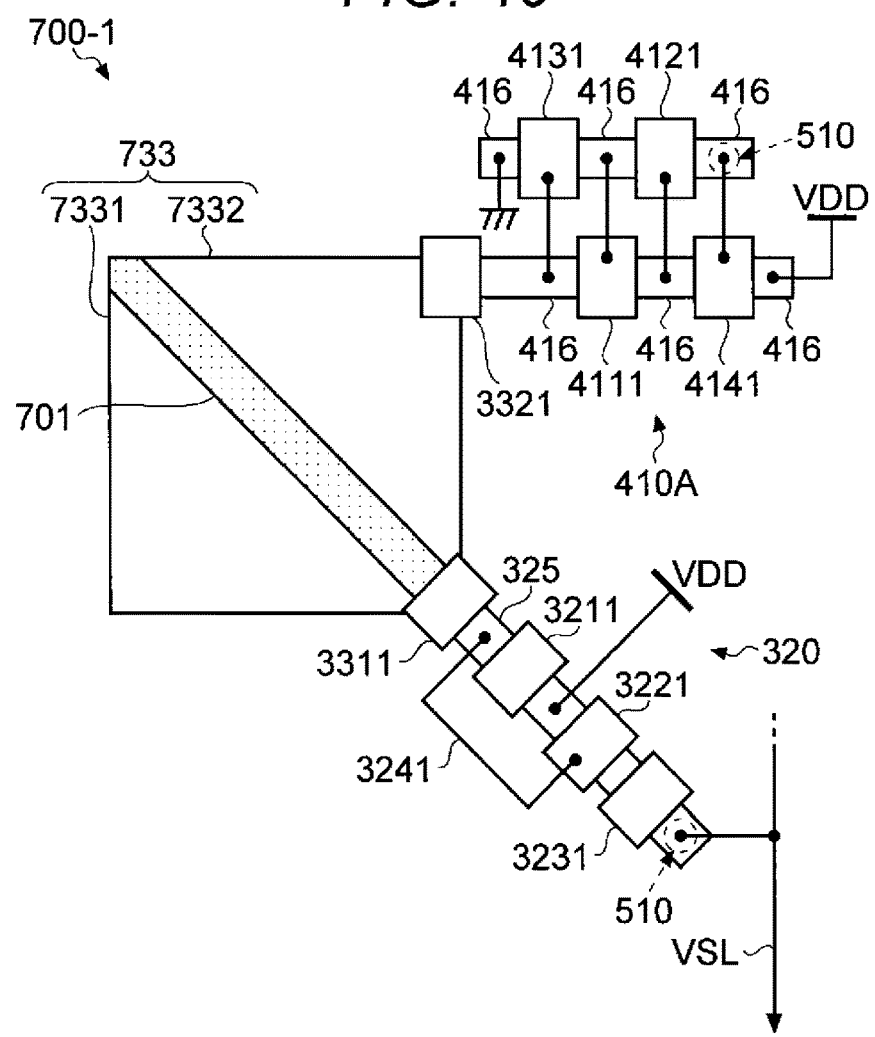
FIG. 40 is a top view illustrating a schematic configuration example of an upper layer circuit according to first layout example of the third embodiment.

FIG. 40 is a top view illustrating a schematic configuration example of the upper layer circuit according to a first layout example. As illustrated in FIG. 40, in an upper layer circuit 700-1 according to the first layout example, for example, a photoelectric conversion element 733 is separated into two photoelectric conversion elements 7331 and 7332 by a separation portion 701 that is provided along a diagonal line of the photoelectric conversion element 733.

In the separation portion 701, for example, it is possible to use various configurations of separating the photoelectric conversion element 733 into the two photoelectric conversion elements 7331 and 7332 such as an insulating film that physically separates the photoelectric conversion element 733 into the two photoelectric conversion elements 7331 and 7332, and a low-diffusion region that is formed by counter-doping, with a P-type dopant, an N-diffusion region in which the photoelectric conversion element 733 is formed.

With regard to the photoelectric conversion element 733, for example, as in a similar manner as in the first layout example described by using FIG. 11 in the first embodiment, the OFG gate 3321 is disposed at one corner portion of the photoelectric conversion element 733 in which a shape of a light-receiving surface is a rectangular shape. The LG gate 4111 of the LG transistor 411 and the LG gate 4141 of the LG transistor 414 in the upper layer detection circuit 410A are linearly arranged in a line from a corner portion at which the OFG gate 3321 is disposed in parallel to the row direction. In addition, the amplification gate 4121 of the amplification transistor 412 and the amplification gate 4131 of the amplification transistor 413 are arranged in parallel to the array of the LG gates 4111 and 4141.

On the other hand, the transmission gate 3311 is disposed at one corner portion of the photoelectric conversion element 733 to be connected to both of the two photoelectric conversion elements 7331 and 7332 which are separated by the separation portion 701. Furthermore, the two photoelectric conversion elements 7331 and 7332 are not short-circuited through the transmission transistor 331.

For example, the reset gate 3211 of the reset transistor 321, the amplification gate 3221 of the amplification transistor 322, and the selection gate 3231 of the selection transistor 323 in the pixel signal generation unit 320 are linearly arranged in a line from the corner portion at which the transmission gate 3311 is disposed toward a right obliquely downward direction.

The other configuration may be similar to the configurations of the upper layer circuit 500-1 described by using FIG. 11 and FIG. 12 in the first embodiment, and thus detailed description thereof will be omitted here.

4.2.1.1 with Regard to Potential of Photoelectric Conversion Element

Figure 41:
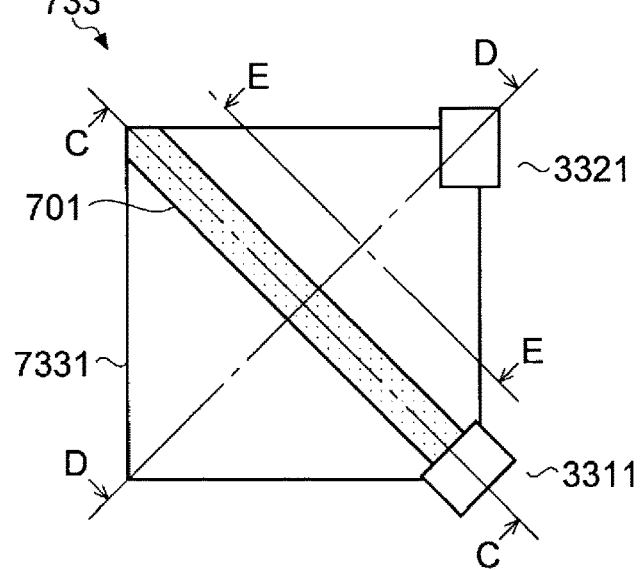
FIG. 41 is a top view of a photoelectric conversion element according to the third embodiment.
Figure 42:
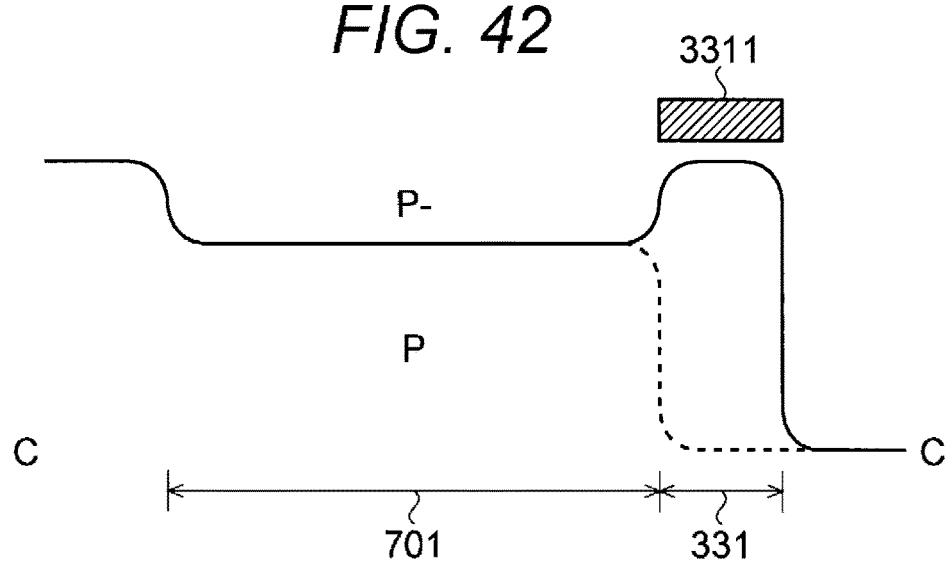
FIG. 42 is a band diagram illustrating a potential of the photoelectric conversion element according to the third embodiment (plane C-C)
Figure 43:
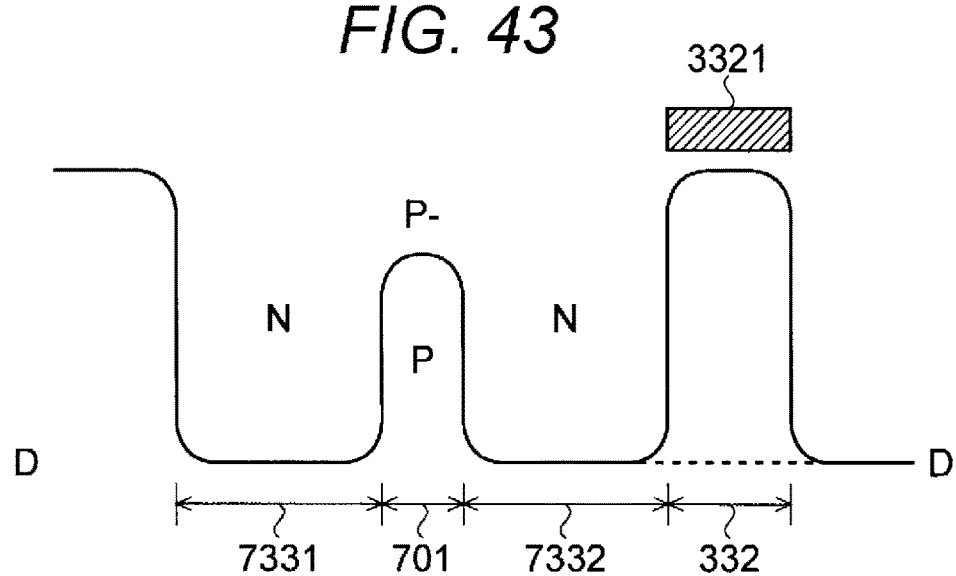
FIG. 43 is a band diagram illustrating a potential of the photoelectric conversion element according to the third embodiment (plane D-D).
Figure 44:
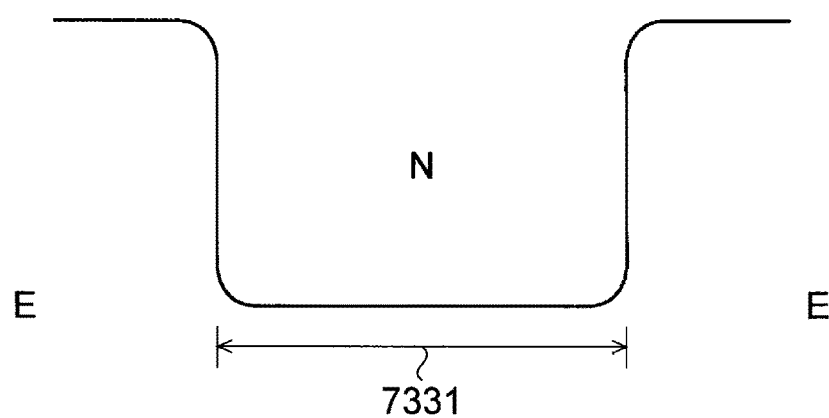
FIG. 44 is a band diagram illustrating a potential of the photoelectric conversion element according to the third embodiment (plane E-E).

FIG. 41 is a top view of the photoelectric conversion element according to the third embodiment. In addition, FIG. 42 to FIG. 44 are band diagrams illustrating a potential of the photoelectric conversion element according to the third embodiment. Furthermore, FIG. 42 illustrates a potential on plane C-C in FIG. 41, FIG. 43 illustrates a potential on plane D-D in FIG. 41, and FIG. 44 illustrates a potential on plane E-E in FIG. 41. In addition, in this description, the separation portion 701 is set to a low-diffusion region.

As illustrated in FIG. 42 to FIG. 44, a potential of the separation portion 701 in the photoelectric conversion element 733 is shallower than a potential of the photoelectric conversion elements 7331 and 7332. When the separation portion 701 having a shallow potential is provided to separate the photoelectric conversion element 733, the photoelectric conversion element 733 is separated into the two photoelectric conversion elements 7331 and 7332.

Accordingly, in a case where the OFG transistor 332 is set to an ON-state, a photocurrent based on a charge generated in the photoelectric conversion element 7332 on one side flows to the LG transistor 411 through the OFG transistor 332. On the other hand, in a case where the transmission transistor 331 is set to an ON-state, charges generated in both of the photoelectric conversion elements 7331 and 7332 are transmitted to the floating diffusion layer 324 through the transmission transistor 331.

4.2.2 Second Layout Example

Figure 45:
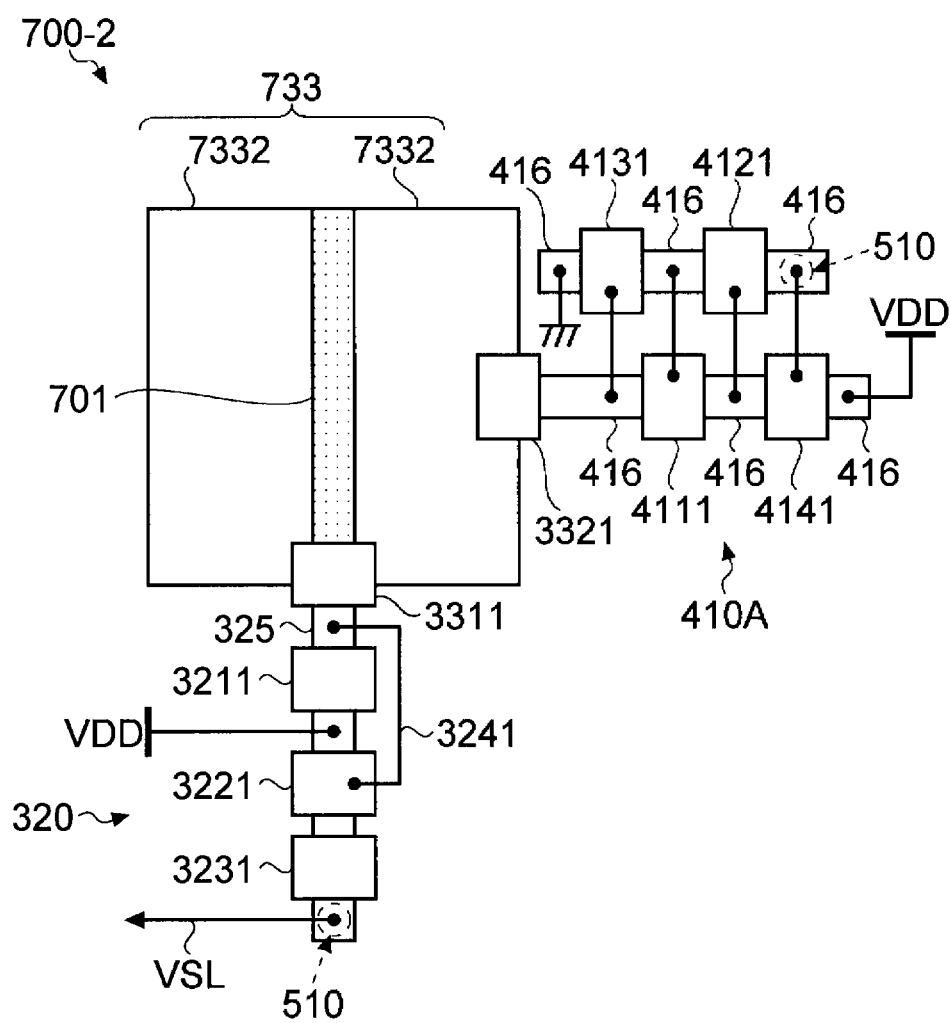
FIG. 45 is a top view illustrating a schematic configuration example of an upper layer circuit according to a second layout example of the third embodiment.

FIG. 45 is a top view illustrating a schematic configuration example of the upper layer circuit according to a second layout example. As illustrated in FIG. 45, in an upper layer circuit 700-2 according to the second layout example, for example, the separation portion 701 is provided to pass through the center of the photoelectric conversion element 733 and to extend along the column direction.

With regard to the photoelectric conversion element 733, for example, in a similar manner as in the first layout example described by using FIG. 28 in the second embodiment, the OFG gate 3321 is disposed at approximately the center of a side that does not interest the separation portion 701 among four sides of the photoelectric conversion element 733. The LG gate 4111 of the LG transistor 411 and the LG gate 4141 of the LG transistor 414 in the upper layer detection circuit 410A are linearly arranged in a line in parallel to the row direction from the side at which the OFG gate 3321 is disposed. In addition, the amplification gate 4121 of the amplification transistor 412 and the amplification gate 4131 of the amplification transistor 413 are arranged in parallel to the array of the LG gates 4111 and 4141.

On the other hand, for example, the transmission gate 3311 is disposed at a side that interests the separation portion 701 among the four sides of the photoelectric conversion element 733 to be connected to the two photoelectric conversion elements 7331 and 7332. The reset gate 3211 of the reset transistor 321, the amplification gate 3221 of the amplification transistor 322, and the selection gate 3231 of the selection transistor 323 in the pixel signal generation unit 320 are linearly arranged in a line in parallel to the row direction from the side at which the transmission gate 3311 is disposed.

4.2.3 Third Layout Example

Figure 46:
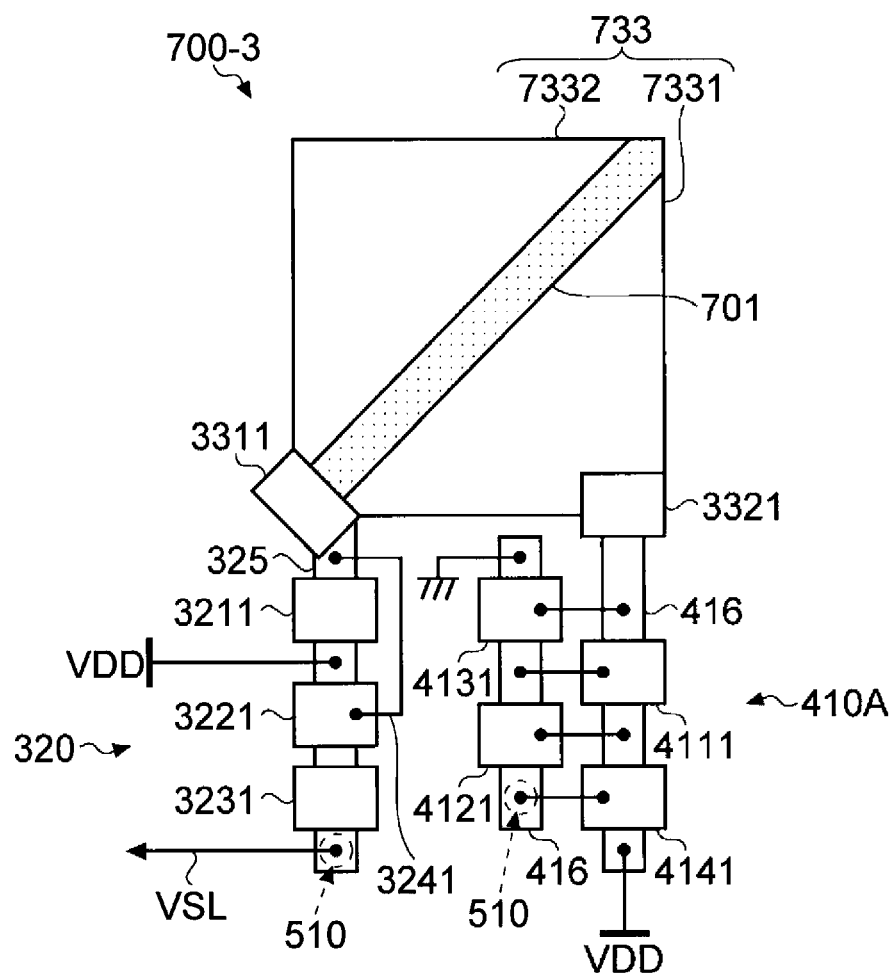
FIG. 46 is a top view illustrating a schematic configuration example of an upper layer circuit according to a third layout example of the third embodiment.

FIG. 46 is a top view illustrating a schematic configuration example of the upper layer circuit according to a third layout example. As in an upper layer circuit 700-3 illustrated in FIG. 46, for example, the photoelectric conversion element 733 according to this embodiment is also applicable to the upper layer circuit 600-3 according to the third layout example described by using FIG. 34 in the second embodiment. However, the separation portion 701 is provided along a diagonal line from the corner portion at which the transmission gate 3311 in the photoelectric conversion element 733 is disposed.

4.2.4 Fourth Layout Example

Figure 47:
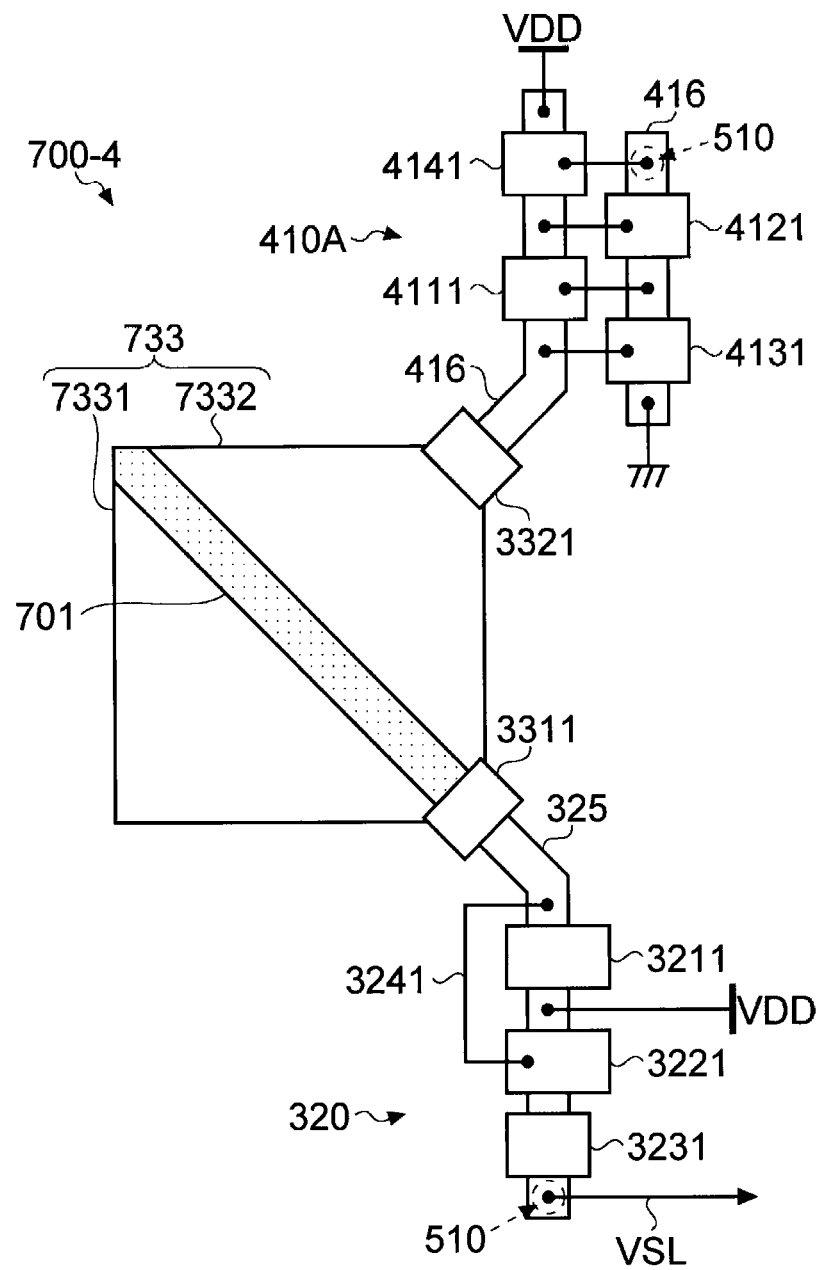
FIG. 47 is a top view illustrating a schematic configuration example of an upper layer circuit according to a fourth layout example of the third embodiment.

FIG. 47 is a top view illustrating a schematic configuration example of the upper layer circuit according to a fourth layout example. As in an upper layer circuit 700-4 illustrated in FIG. 47, for example, the photoelectric conversion element 733 according to this embodiment is also applicable to the upper layer circuit 600-4 according to the fourth layout example described by using FIG. 36 in the second embodiment. However, the separation portion 701 is provided along a diagonal line from the corner portion at which the transmission gate 3311 in the photoelectric conversion element 733 is disposed.

4.2.5 Fifth Layout Example

Figure 48:
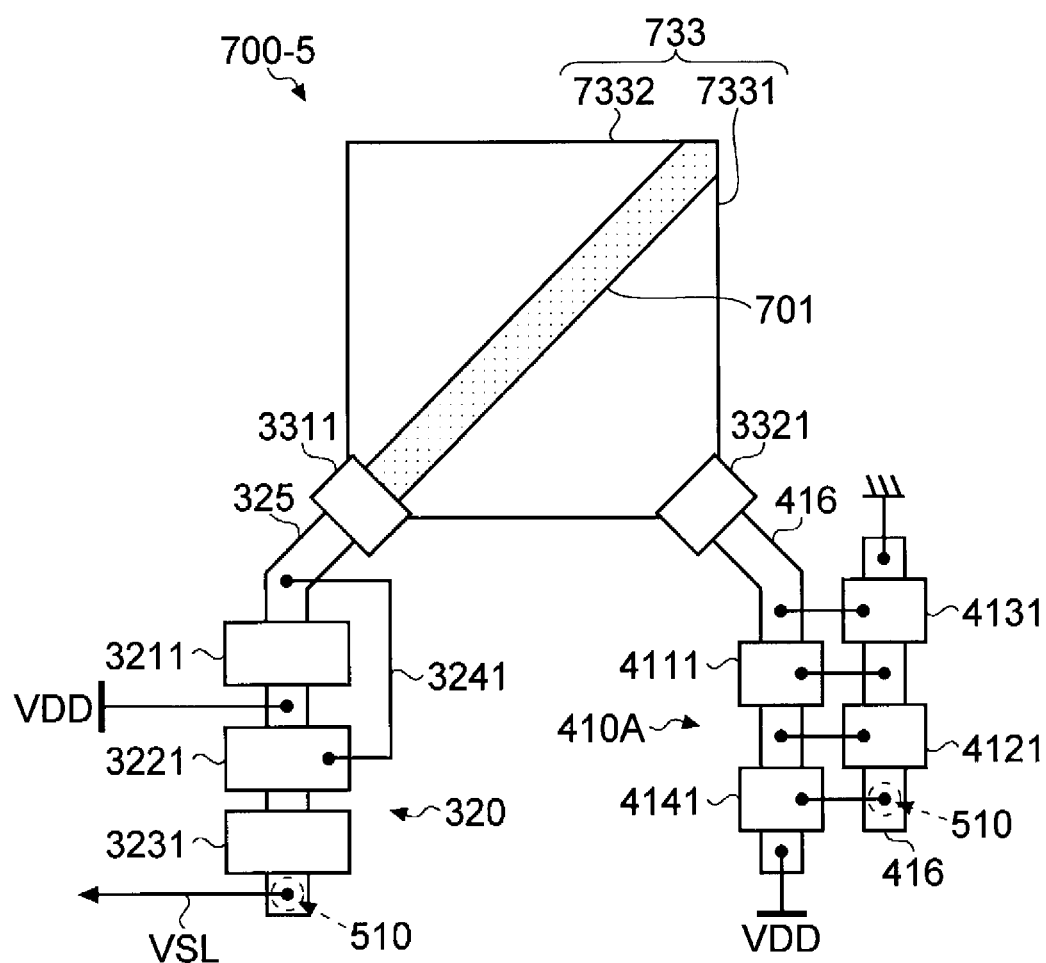
FIG. 48 is a top view illustrating a schematic configuration example of an upper layer circuit according to a fifth layout example of the third embodiment.

FIG. 48 is a top view illustrating a schematic configuration example of the upper layer circuit according to a fifth layout example. As in an upper layer circuit 700-5 illustrated in FIG. 48, for example, the photoelectric conversion element 733 according to this embodiment is also applicable to the upper layer circuit 600-6 according to the sixth layout example described by using FIG. 38 in the second embodiment. However, the separation portion 701 is provided along a diagonal line from the corner portion at which the transmission gate 3311 in the photoelectric conversion element 733 is disposed.

4.3 Operation and Effect

As described above, according to this embodiment, the capacity of the photoelectric conversion element 733 can be switched as follows. Specifically, in the case of monitoring the address event ignition, the capacity of the photoelectric conversion element 733 is set to a first capacity according to the photoelectric conversion element 7331, and in the case of reading out a pixel signal, the capacity of the photoelectric conversion element 733 is set to a second capacity in combination of the two photoelectric conversion elements 7331 and 7332.

With this arrangement, in monitoring of the address event ignition, it is possible to detect the address event ignition with sensitivity with respect to incident light. In addition, in reading-out of the pixel signal, it is possible to widen the dynamic range of an image that is acquired.

The other configurations, operations, and effects are similar to those in the first or second embodiment, and thus detailed description thereof will be omitted here.

5. Application Example to Moving Body

The technology (the present technology) according to the present disclosure is applicable to various products. For example, the technology according to the present disclosure can be realized as a device that is mounted on a moving body of any one kind among an automobile, an electric vehicle, a hybrid electric vehicle, a motorcycle, a bicycle, a personal mobility, an airplane, a drone, a ship, a robot, and the like.

Figure 49:
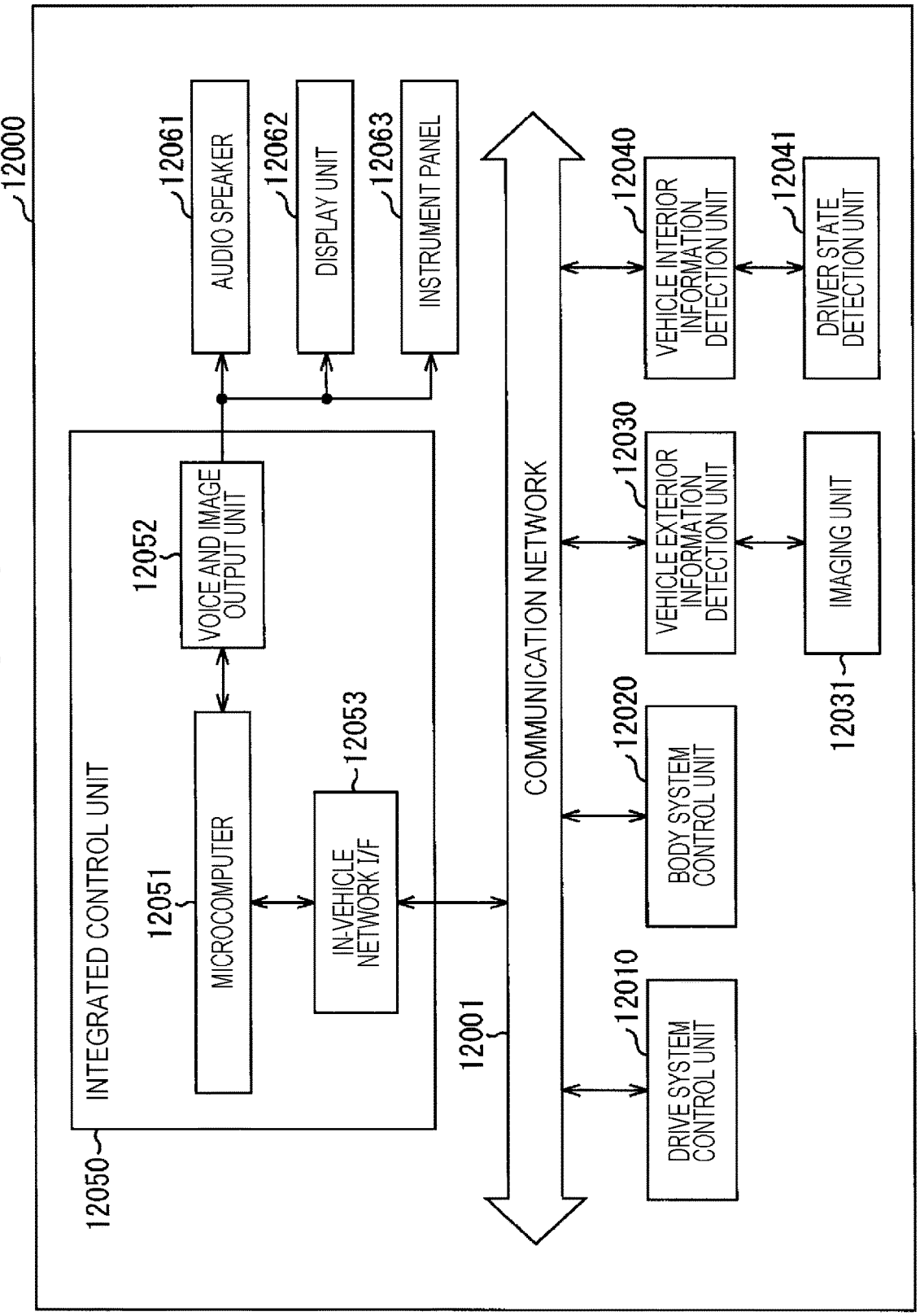
FIG. 49 is a block diagram illustrating an example of a schematic configuration of a vehicle control system.

FIG. 49 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 49, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 49, as the output device, an audio speaker 12061, a display unit 12062, and an instrument panel 12063 are exemplified. For example, the display unit 12062 may include at least one of an on-board display or a head-up display.

Figure 50:
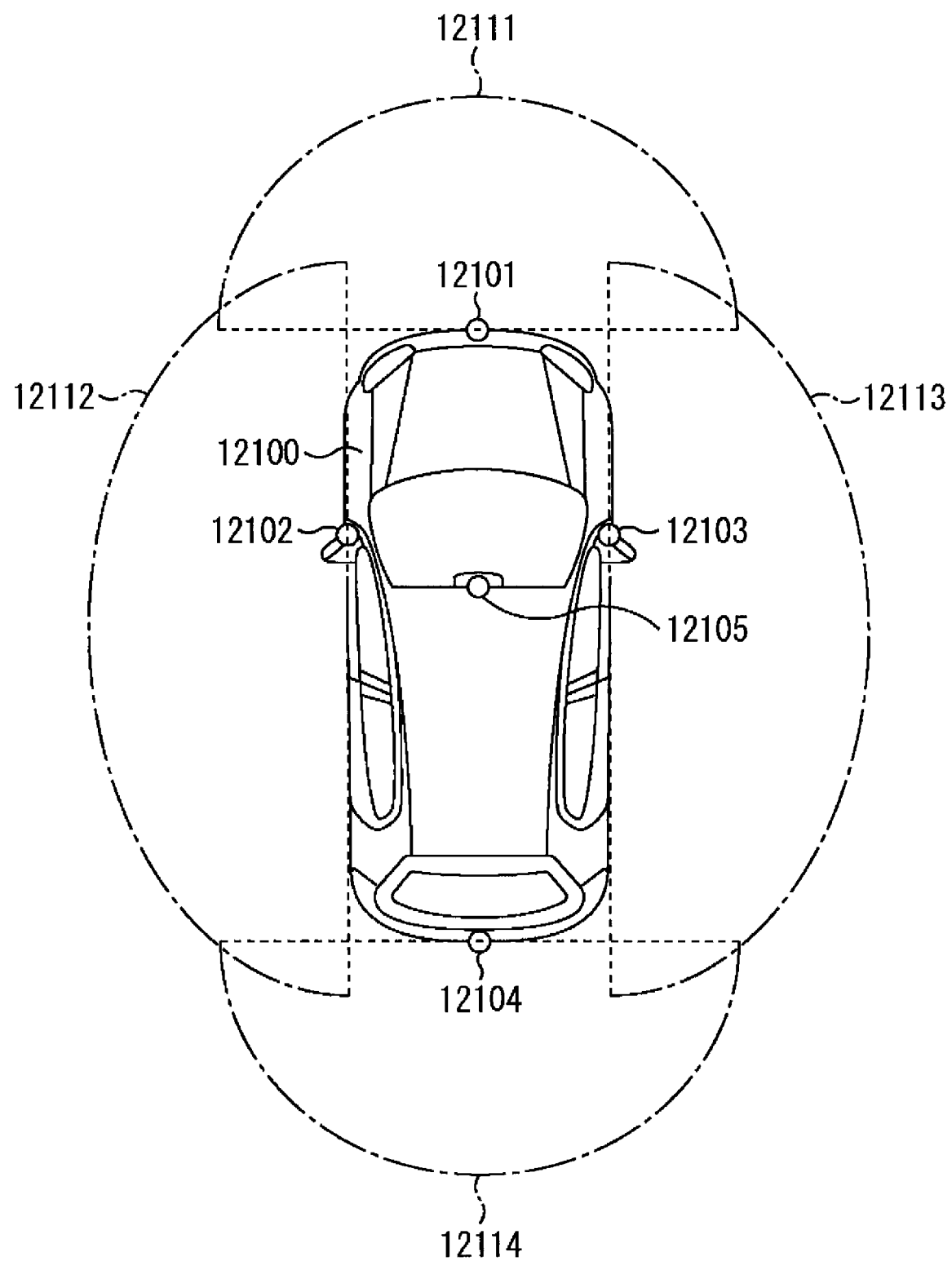
FIG. 50 is a view illustrating an example of an installation position of an out-of-vehicle information detection unit and an imaging unit.

FIG. 50 is a view illustrating an example of an installation position of the imaging unit 12031.

In FIG. 50, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 50 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view minors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effect may exist without a limitation.

Furthermore, the present technology can employ the following configurations.

(1) A solid-state imaging device including:
  a photoelectric conversion element that generates a charge corresponding to a light-reception amount;
  a first transistor that is connected to the photoelectric conversion element; second to fourth transistors which are connected to the first transistor and are arranged in a line;
  a fifth transistor that is connected to the photoelectric conversion element at a position different from a position of the first transistor;
  sixth and seventh transistors which are connected to the fifth transistor and are arranged in a line; and
  eighth and ninth transistors which are arranged in parallel to an array of the sixth and seventh transistors.

(2) The solid-state imaging device according to (1),
  in which the second and third transistors share a diffusion region that functions as a source and a drain,
  the third and fourth transistors share a diffusion region that functions as a source and a drain,
  the sixth and seventh transistors share a diffusion region that functions as a source and a drain, and
  the eighth and ninth transistors share a diffusion region that functions as a source and a drain.

(3) The solid-state imaging device according to one or more of (1) to (2)
  in which a size of a first array that is formed by the second to fourth transistors along a direction of the first array is equal to or less than a size of the photoelectric conversion element along the direction of the first array, and
  a size of a second array that is formed by the sixth and seventh transistors along a direction of the second array is equal to or less than a size of the photoelectric conversion element along the direction of the second array.

(4) The solid-state imaging device according to one or more of (1) to (3),
  in which a total area of the second to fourth transistors and the sixth to ninth transistors is equal to or less than an area of the photoelectric conversion element.

(5) The solid-state imaging device according to one or more of (1) to (4),
  in which a light incident surface of the photoelectric conversion element has a rectangular shape,
  the first transistor is provided in a first corner portion among four corner portions of the rectangle or a first side among four sides of the rectangle, and
  the fifth transistor is provided at a second corner portion that is diagonally located with respect to the first corner portion, or a second side that is opposite to the first side.

(6) The solid-state imaging device according to one or more of (1) to (5),
  in which the second to fourth transistors are arranged in a line from the first transistor along a first direction, and
  the sixth and seventh transistors are arranged in a line from the fifth transistor along the first direction on a side opposite to the second to fourth transistors.

(7) The solid-state imaging device according to one or more of (1) to (6),
  in which the second to fourth transistors are arranged in a line from the first transistor along a side of the photoelectric conversion element, and
  the sixth and seventh transistors are arranged in a line from the fifth transistor along a side of the photoelectric conversion element.

(8) The solid-state imaging device according to one or more of (1) to (7),
  in which the second to fourth transistors are arranged in a line along a first direction within a first region that is adjacent to the photoelectric conversion element in a first inclination direction and has the same area as an area of the photoelectric conversion element,
  the sixth and seventh transistors are arranged in a line along the first direction on a side opposite to the second to fourth transistors from the fifth transistor within a second region that is adjacent to the photoelectric conversion element in a second inclination direction opposite to the first inclination direction and has the same area as the area of the photoelectric conversion element, and
  the eighth and ninth transistors are arranged in parallel to an array of the sixth and seventh transistors within the second region.

(9) The solid-state imaging device according to one or more of (1) to (8),
  in which a light-incident surface of the photoelectric conversion element has a rectangular shape,
  the first transistor is provided in a first corner portion among four corner portions of the rectangle or a first side among four sides of the rectangle, and
  the fifth transistor is provided at a second corner portion that is adjacent to the first corner portion.

(10) The solid-state imaging device according to one or more of (1) to (9),
  in which the second to fourth transistors are arranged in a line from the first transistor along a first direction, and
  the sixth and seventh transistors are arranged in a line from the fifth transistor along the first direction, and the eighth and ninth transistors are arranged in a line between the second to fourth transistors, and the sixth and seventh transistor along the first direction.

(11) The solid-state imaging device according to one or more of (1) to (10), in which the second to fourth transistors are arranged in a line along a first direction within a first region that is adjacent to the photoelectric conversion element in a first inclination direction and has the same area as an area of the photoelectric conversion element, the sixth and seventh transistors are arranged in a line from the fifth transistor along the first direction on a side opposite to the second to fourth transistors within a second region that is adjacent to the photoelectric conversion element in a second inclination direction that intersects the first inclination direction and has the same area as an area of the photoelectric conversion element, and the eighth and ninth transistors are arranged in parallel to an array of the sixth and seventh transistors within the second region.

(12) The solid-state imaging device according to one or more of (1) to (11), in which the second to fourth transistors are arranged in a line in a first direction within a first region that is adjacent to the photoelectric conversion element along a first inclination direction and has the same area as an area of the photoelectric conversion element, the sixth and seventh transistors are arranged in a line along the first direction from the fifth transistor in parallel to the second to fourth transistors within a second region that is adjacent to the photoelectric conversion element in a second inclination direction that intersects the first inclination direction and has the same area as an area of the photoelectric conversion element, and the eighth and ninth transistors are arranged in parallel to an array of the sixth and seventh transistors within the second region.

(13) The solid-state imaging device according to one or more of (1) to (12), in which a light-incident surface of the photoelectric conversion element has a rectangular shape, the first transistor is provided in a first side among four sides of the rectangle, the fifth transistor is provided at a second side that intersects the first side, the second to fourth transistors are arranged in a line from the first transistor along a first direction, and the sixth and seventh transistors are arranged in a line from the fifth transistor along a second direction that is orthogonal to the first direction.

(14) The solid-state imaging device according to one or more of (1) to (13), further including:

a photogate that divides the photoelectric conversion element into two regions.

(15) The solid-state imaging device according to one or more of (1) to (14), in which the photogate divides the photoelectric conversion element into a first region to which the first transistor is connected, and a second region to which the fifth transistor is connected.

(16) The solid-state imaging device according to one or more of (1) to (15), in which the photoelectric conversion element includes a first photoelectric conversion element, and a second photoelectric conversion element, the first transistor is connected to both of the first photoelectric conversion element and the second photoelectric conversion element, and the fifth transistor is connected to one of the first and second photoelectric conversion elements.

(17) The solid-state imaging device according to one or more of (1) to (16), in which the second to fourth transistors, and the sixth to ninth transistors are metal-oxide-semiconductor (MOS) transistors.

(18) The solid-state imaging device according to one or more of (1) to (17), in which the second to fourth transistors constitute a first circuit that generates a pixel signal of a voltage value corresponding to the amount of charges generated in the photoelectric conversion element, and the sixth to ninth transistors constitute a second circuit that detects a photocurrent based on the charges generated in the photoelectric conversion element.

(19) The solid-state imaging device according to one or more of (1) to (18), further including:

a first semiconductor chip that includes the photoelectric conversion element and the first to ninth transistors; and a second semiconductor chip that is joined to the first semiconductor chip, in which the first semiconductor chip and the second semiconductor chip are electrically and mechanically joined to each other by joining a copper pad provided in the first semiconductor chip and a copper pad provided in the second semiconductor chip to each other.

(20) An imaging device including:

a solid-state imaging device;

an optical system that images incident light to a light-receiving surface of the solid-state imaging device; and a control unit that controls the solid-state imaging device, in which the solid-state imaging device includes, a photoelectric conversion element that generates a charge corresponding to a light-reception amount, a first transistor that is connected to the photoelectric conversion element, second to fourth transistors which are connected to the first transistor and are arranged in a line, a fifth transistor that is connected to the photoelectric conversion element at a position different from a position of the first transistor, sixth and seventh transistors which are connected to the fifth transistor and are arranged in a line, and eighth and ninth transistors which are arranged in parallel to an array of the sixth and seventh transistors.

(21) An imaging device, comprising:

a photoelectric conversion region that converts incident light into electric charges;

a first readout circuit coupled to the photoelectric conversion region at a first location; and a second readout circuit including a portion coupled to the photoelectric conversion region at a second location, the second readout circuit being configured to control the first readout circuit, wherein the first location and the second location are on a same side of the photoelectric conversion region.
(22) The imaging device according to (21), wherein the first location and the second location are a same distance from a center of an edge of the photoelectric conversion region that defines the side.
(23) The imaging device according to one or more of (21) to (22), wherein the first location is at a first corner of the photoelectric conversion region, and wherein the second location is at a second corner of the photoelectric conversion region.
(24) The imaging device according to one or more of (21) to (23), wherein the first readout circuit includes a first transistor having a first gate at the first location, and wherein the second readout circuit includes a second transistor having a second gate at the second location.
(25) The imaging device according to one or more of (21) to (24), wherein the first readout circuit includes a plurality of third transistors coupled to the first transistor.
(26) The imaging device according to one or more of (21) to (25), wherein the second readout circuit includes a plurality of fourth transistors coupled to the second transistor.
(27) The imaging device according to one or more of (21) to (26), wherein a number of the plurality of fourth transistors is more than a number of the plurality of third transistors.
(28) The imaging device according to one or more of (21) to (27), wherein the plurality of fourth transistors includes first and second sets of transistors arranged in a first direction, and wherein the first set of transistors is arranged adjacent to the second set of transistors in a second direction that is perpendicular to the first direction.
(29) The imaging device according to one or more of (21) to (28), wherein the second set of transistors are further away from the side of the photoelectric conversion region than the first set of transistors.
(30) The imaging device according to one or more of (21) to (29), wherein the plurality of third transistors are arranged in the first direction.
(31) An imaging device, comprising:
a first pixel including:
a first photoelectric conversion region that converts first incident light into first electric charges;
a first readout circuit coupled to the first photoelectric conversion region at a first location; and
a second readout circuit including a portion coupled to the first photoelectric conversion region at a second location, the second readout circuit being configured to control the first readout circuit, wherein the first location and the second location are on a same first side of the first photoelectric conversion region; and
a second pixel adjacent to the first pixel in a first direction and including:
a second photoelectric conversion region that converts second incident light into second electric charges;
a third readout circuit coupled to the second photoelectric conversion region at a third location; and
a fourth readout circuit including a portion coupled to the second photoelectric conversion region at a fourth location, the fourth readout circuit being configured to control the third readout circuit, wherein the third location and the fourth location are on a same second side of the second photoelectric conversion region.
(32) The imaging device according to (31), wherein the first readout circuit and the third readout circuit are located at opposite sides of the second photoelectric conversion region.
(33) The imaging device according to one or more of (31) to (32), wherein the first pixel and the second pixel are arranged such that the second photoelectric conversion region is between the first readout circuit and the second readout circuit.
(34) The imaging device according to one or more of (31) to (33), further comprising:
a third pixel adjacent to the first pixel in a second direction that is perpendicular to the first direction, the third pixel including:
a third photoelectric conversion region that converts third incident light into third electric charges;
a fifth readout circuit coupled to the third photoelectric conversion region at a fifth location; and
a sixth readout circuit including a portion coupled to the third photoelectric conversion region at a sixth location, the sixth readout circuit being configured to control the fifth readout circuit, wherein the fifth location and the sixth location are on a same third side of the third photoelectric conversion region.
(35) The imaging device according to one or more of (31) to (34), further comprising:
a fourth pixel adjacent to the second pixel in the second direction, the fourth pixel including:
a fourth photoelectric conversion region that converts fourth incident light into fourth electric charges;
a seventh readout circuit coupled to the fourth photoelectric conversion region at a seventh location; and
an eighth readout circuit including a portion coupled to the fourth photoelectric conversion region at an eighth location, the eighth readout circuit being configured to control the seventh readout circuit, wherein the seventh location and the eighth location are on a same fourth side of the fourth photoelectric conversion region.
(36) The imaging device according to one or more of (31) to (35), wherein the third pixel and the fourth pixel are arranged such that the third photoelectric conversion region is between the seventh readout circuit and the eighth readout circuit.
(37) The imaging device according to one or more of (31) to (36), wherein the first, second, third, and fourth pixels are arranged such that the second readout circuit and the fifth readout circuit are between the second photoelectric conversion region and the fourth photoelectric conversion region.
(38) The imaging device according to one or more of (31) to (37), wherein at least one of the first photoelectric conversion region, the second photoelectric conversion region, the third photoelectric conversion region, and the fourth photoelectric conversion region includes a photogate that divides a respective photoelectric conversion region into a first portion and a second portion.
(39) The imaging device according to one or more of (31) to (38), wherein the photogate is located in a central region of the photoelectric conversion region.
(40) An imaging device, comprising:
a photoelectric conversion region that converts incident light into electric charges;

a first readout circuit including a first gate of a first transistor coupled to the photoelectric conversion region at a first location; and
a second readout circuit including a second gate of a second transistor coupled to the photoelectric conversion region at a second location, the second readout circuit being configured to control the first readout circuit, wherein the first location and the second location are located at a same half of the photoelectric conversion region.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Imaging device
110 Imaging lens
120 Recording unit
130 Control unit
200 Solid-state imaging device
201 Light-receiving chip
202 Logic chip
210 Logic circuit
211 Drive circuit
212 Signal processing unit
213 Arbiter
220 Column ADC
230 ADC
300 Pixel array unit
310, 310-1, 310R, 310Gr, 310Gb, 310B, 610, 710 Unit pixel
310A Basic pattern
320 Pixel signal generation unit
321 Reset transistor
322 Amplification transistor
323 Selection transistor
325, 416 Diffusion region
330, 630, 730 Light-receiving unit
331 Transmission transistor
332 OFG transistor
333, 3331, 3332, 733, 7331, 7332 Photoelectric conversion element
400 Address event detection unit
410 Current-voltage conversion unit
410A Upper layer detection circuit
411, 414 LG transistor
412, 413 Amplification transistor
415 Constant current circuit
420 Buffer
430 Subtractor
431, 433 Capacitor
432 Inverter
434 Switch
441 Comparator
440 Quantizer
450 Transmission unit
500, 500-1, 500-2, 500-3, 500-4, 500-5, 500-6, 600, 600-1, 600-2, 600-3, 600-3A,
600-4, 600-5, 600-6, 700, 700-1, 700-2, 700-3, 700-4, 700-5 Upper layer circuit
501, 511 Semiconductor substrate
502 Microlens
503, 513 Interlayer insulating film
504, 514 Interconnection
505, 515 Pad
506, 512 Cu pad
510 Cu—Cu joint
601 Photogate
3211 Reset gate
3221 Amplification gate
3231 Selection gate
3311 Transmission gate
3321 OFG gate
4111, 4141 LG gate
4121, 4131 Amplification gate

What is claimed is:

1. An imaging device, comprising:
a photoelectric conversion region that converts incident light into electric charges;
a first readout circuit coupled to the photoelectric conversion region at a first location; and
a second readout circuit including a portion coupled to the photoelectric conversion region at a second location, the second readout circuit being configured to control the first readout circuit,
wherein the first location and the second location are on a same side of the photoelectric conversion region,
wherein the first readout circuit includes a first transistor having a first gate at the first location and a plurality of third transistors coupled to the first transistor,
wherein gates of the plurality of third transistors are linearly arranged in a line disposed in parallel to a row direction extending away from a first corner portion of the photoelectric conversion region,
wherein the second readout circuit includes a second transistor having a second gate at the second location and a plurality of fourth transistors coupled to the second transistor, and
wherein gates of the plurality of fourth transistors are linearly arranged in a line disposed in parallel to a row direction extending away from a second corner portion of the photoelectric conversion region.

2. The imaging device of claim 1, wherein the plurality of third transistors includes a reset transistor, an amplification transistor, and a selection transistor.

3. The imaging device of claim 2, wherein a diffusion region is provided between the gates of each of the reset transistor, the amplification transistor, and the selection transistor.

4. The imaging device of claim 2, wherein a gate insulating film is provided between the gates of each of the reset transistor, the amplification transistor, and the selection transistor.

5. The imaging device of claim 1, wherein the first transistor includes a transmission transistor.

6. The imaging device of claim 1 wherein the second transistor includes an overflow gate transistor.

7. The imaging device of claim 1, wherein the plurality of fourth transistors includes a plurality of log transistors.

8. The imaging device of claim 7, wherein a diffusion region is provided between the gates of each of the plurality of log transistors.

9. The imaging device of claim 8, further comprising plurality of fifth transistors including gates that are arranged in parallel to the gates of the plurality of the log transistors.

10. The imaging device of claim 9, further comprising a diffusion region provided between gates of each of the plurality of fifth transistors.

11. An imaging device, comprising:
a photoelectric conversion region that converts incident light into electric charges;

a first readout circuit coupled to the photoelectric conversion region at a first location; and a second readout circuit including a portion coupled to the photoelectric conversion region at a second location, the second readout circuit being configured to control the first readout circuit, wherein the first location and the second location are on a same side of the photoelectric conversion region, wherein the first readout circuit includes a first transistor having a first gate at the first location and a plurality of third transistors coupled to the first transistor, wherein gates of the plurality of third transistors are linearly arranged in a line disposed in parallel to a row direction extending towards a first corner portion of the photoelectric conversion region and provided under the photoelectric conversion region in a cross-sectional view, wherein the second readout circuit includes a second transistor having a second gate at the second location and a plurality of fourth transistors coupled to the second transistor, and wherein gates of the plurality of fourth transistors are linearly arranged in a line disposed in parallel to a row direction extending towards a second corner portion of the photoelectric conversion region, and provided under the photoelectric conversion region in the cross-sectional view.

12. The imaging device of claim 11, wherein the plurality of third transistors includes a reset transistor, an amplification transistor, and a selection transistor.

13. The imaging device of claim 12, wherein a diffusion region is provided between the gates of each of the reset transistor, the amplification transistor, and the selection transistor.

14. The imaging device of claim 12, wherein a gate insulating film is provided between the gates of each of the reset transistor, the amplification transistor, and the selection transistor.

15. The imaging device of claim 11, wherein the first transistor includes a transmission transistor.

16. The imaging device of claim 11 wherein the second transistor includes an overflow gate transistor.

17. The imaging device of claim 11, wherein the plurality of fourth transistors includes a plurality of log transistors.

18. The imaging device of claim 17, wherein a diffusion region is provided between the gates of each of the plurality of log transistors.

19. The imaging device of claim 18, further comprising plurality of fifth transistors including gates that are arranged in parallel to the gates of the plurality of the log transistors.

20. The imaging device of claim 19, further comprising a diffusion region provided between gates of each of the plurality of fifth transistors.

* * * * *